US012598762B2

(12) United States Patent
Lee et al.

(10) Patent No.: US 12,598,762 B2
(45) Date of Patent: Apr. 7, 2026

(54) METHODS OF MANUFACTURING A SEMICONDUCTOR DEVICE WITH LOCAL ISOLATION AND A SEMICONDUCTOR DEVICE WITH LOCAL ISOLATION

(71) Applicant: TAIWAN SEMICONDUCTOR MANUFACTURING COMPANY, LTD., Hsinchu (TW)

(72) Inventors: Tsung-Lin Lee, Hsinchu (TW); Da-Wen Lin, Hsinchu (TW); Chih Chieh Yeh, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 429 days.

(21) Appl. No.: 17/710,592

(22) Filed: Mar. 31, 2022

(65) Prior Publication Data

US 2023/0317830 A1     Oct. 5, 2023

(51) Int. Cl.
H10D 30/01          (2025.01)
H01L 21/762          (2006.01)
          (Continued)
(52) U.S. Cl.
CPC ....... H10D 30/0243 (2025.01); H01L 21/762 (2013.01); H10D 30/6217 (2025.01);
          (Continued)
(58) Field of Classification Search
CPC . H01L 29/6681; H01L 21/762; H01L 29/401; H01L 29/41791; H01L 29/66545;
          (Continued)

(56) References Cited

U.S. PATENT DOCUMENTS 8,962,400 B2    2/2015  Tsai et al.
9,093,514 B2    7/2015  Tsai et al.
          (Continued)

FOREIGN PATENT DOCUMENTS

TW          201729418 A        8/2017

OTHER PUBLICATIONS

Prosecution file history of U.S. Appl. No. 17/150,337, filed Jan. 15, 2021.

(Continued)

*Primary Examiner* — Shahed Ahmed
(74) *Attorney, Agent, or Firm* — STUDEBAKER BRACKETT PLLC

(57)          ABSTRACT

In a method of manufacturing a semiconductor device a fin structure is formed in which first semiconductor layers and second semiconductor layers are alternately stacked over a substrate. A sacrificial gate structure is formed over the fin structure. A source/drain region of the fin structure that is not covered by the sacrificial gate structure is etched to form a source/drain space. An isolation region is formed at a bottom portion of the source/drain space. A source/drain epitaxial layer is formed over the isolation region in the source/drain space, and a void region in the isolation region is produced between the source/drain epitaxial layer and the substrate to cause electrical isolation between the source/drain region and the substrate.

20 Claims, 52 Drawing Sheets

(51) Int. Cl.
  *H10D 30/62* (2025.01)
  *H10D 64/01* (2025.01)
(52) U.S. Cl.
  CPC ......... *H10D 30/6219* (2025.01); *H10D 64/01*
    (2025.01); *H10D 64/017* (2025.01)
(58) Field of Classification Search
  CPC ............. H01L 29/7856; H01L 29/0653; H01L
    29/0673; H01L 29/0847; H01L 29/42392;
    H01L 29/66439; H01L 29/7848; H01L
    29/78696; H01L 29/0669–068; H01L
    29/66469; H01L 29/0665; H01L
    2924/13061; H01L 29/0649–0653; H01L
    29/515; B82Y 10/00; H10D 30/0243;
    H10D 30/6217; H10D 30/6219; H10D
    64/017; H10D 30/014; H10D 30/6735;
    H10D 30/62; H10D 84/0158; H10D
    30/501–509; H10D 30/43–435; H10D
    62/119–123; H10D 62/115–116
  See application file for complete search history.

(56) References Cited

U.S. PATENT DOCUMENTS

| | | | |
|---|---|---|---|
| 9,236,267 | B2 | 1/2016 | De et al. |
| 9,245,805 | B2 | 1/2016 | Yeh et al. |
| 9,418,897 | B1 | 8/2016 | Ching et al. |
| 9,502,265 | B1 | 11/2016 | Jiang et al. |
| 9,520,466 | B2 | 12/2016 | Holland et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,786,774 | B2 | 10/2017 | Colinge et al. |
| 9,812,363 | B1 | 11/2017 | Liao et al. |
| 9,853,101 | B2 | 12/2017 | Peng et al. |
| 9,859,380 | B2 | 1/2018 | Lee et al. |
| 9,881,993 | B2 | 1/2018 | Ching et al. |
| 2012/0138886 | A1 | 6/2012 | Kuhn et al. |
| 2015/0069328 | A1 | 3/2015 | Leobandung |
| 2015/0137237 | A1 | 5/2015 | Jacob et al. |
| 2015/0380313 | A1 | 12/2015 | Ching et al. |
| 2018/0151378 | A1 | 5/2018 | Huang et al. |
| 2018/0301564 | A1* | 10/2018 | Kwon ................. H01L 29/0653 |
| 2023/0133545 | A1* | 5/2023 | Frougier ............... H01L 29/775 |
| | | | 257/329 |
| 2023/0207653 | A1* | 6/2023 | Tseng ................... H01L 29/785 |
| 2023/0260908 | A1* | 8/2023 | Yeoh ................. H01L 29/42392 |
| | | | 257/347 |

OTHER PUBLICATIONS

Prosecution file history of U.S. Appl. No. 17/367,869, filed Jul. 6, 2021.

* cited by examiner

METHODS OF MANUFACTURING A SEMICONDUCTOR DEVICE WITH LOCAL ISOLATION AND A SEMICONDUCTOR DEVICE WITH LOCAL ISOLATION

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (Fin FET) and a gate-all-around (GAA) FET. Electric current may leak from source or drain of the FinFET or GAA FET to the substrate below the FinFET or GAA FET and may cause loss of electric power and also may warm up the substrate and the electrical devices manufactured in the substrate. Silicon on insulator (SOI) substrates are used to create a barrier for the electric current, in the entire substrate area, to move from the top portion of the substrate to the bottom portion of the substrate and to prevent/reduce current leakage from source and drain of the FinFET or GAA FET. SOI substrates are expensive and implementing local isolations, e.g., under source or drain, is highly recommended.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A

DETAILED DESCRIPTION

Figure 1A:
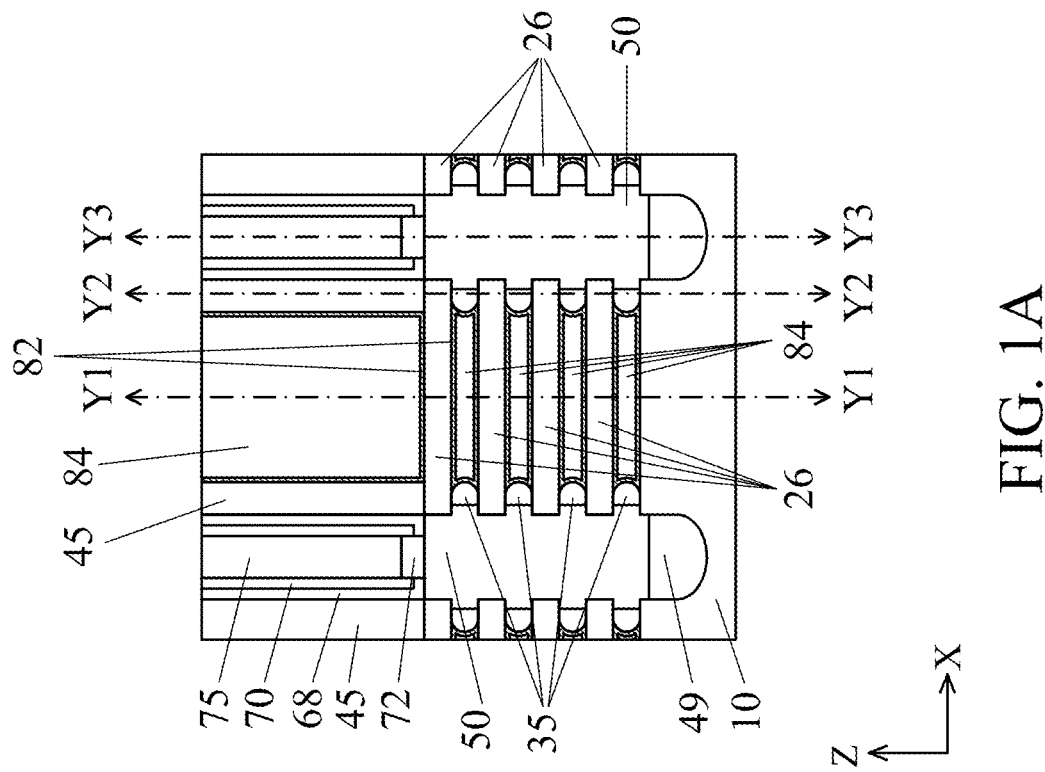
FIGS. 1A, 1B, 1C, and 1D show various views of a semiconductor FET device.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

Leaking electrical current from electronic devices on a semiconductor substrate causes power loss. In some embodiments, SOI substrates that include a barrier layer in the depth of the semiconductor substrate is used to prevent the power loss. The barrier layer that is parallel to a top surface of the substrate and extends the whole extent of the substrate prevents electrical current from finding a path to the bottom of the substrate and to the ground. The SOI substrate may be expensive and the barrier layer may not be needed in the whole extent of the substrate. For example, for FET devices, e.g., FinFET devices or GAA FET devices, the current leakage may occur from the source and drain and it may be enough to create the barrier layer only below the source and drain (a local barrier). In the following embodiments, a physical barrier layer may be created by providing a void below the source and drain regions that acts as current barrier.

Also, the physical barrier may be created by producing a dopant concentration difference between the source and drain and the region of the substrate below the source and drain and creating a voltage barrier to prevent the scape of the current. In some embodiments, the physical barrier does not exist below the gate region of the FET devices that include nanostructures such as nanowires and nanosheets. Further, in the FinFET device or the GAA FET devices, an epitaxial layer is disposed in the source and drain regions. When the barrier layer does not exit and leakage current occurs, the source and drain epitaxial layer is required to be highly doped to provide more current to compensate the leakage current. The highly doped epitaxial layer of source and drain produces more defects in the source drain region. Using the local barrier described above, may reduce the requirement that the source and drain epitaxial layer are heavily doped and, thus, reduces the number of defects in the source drain regions. In some embodiments, the local barrier is used for passive input/output devices.

Figure 1D:
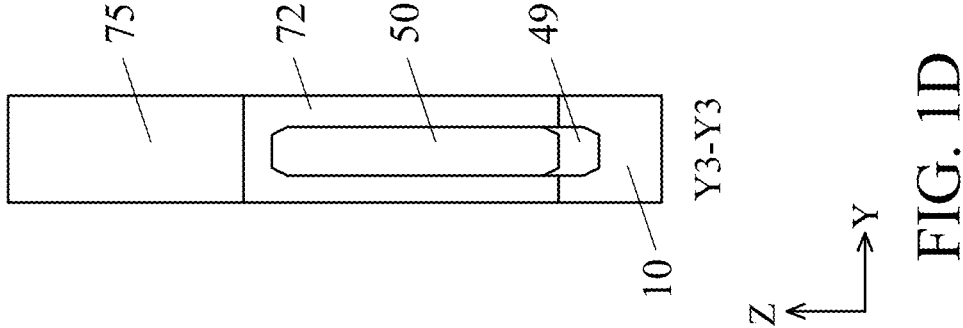
Figure 1C:
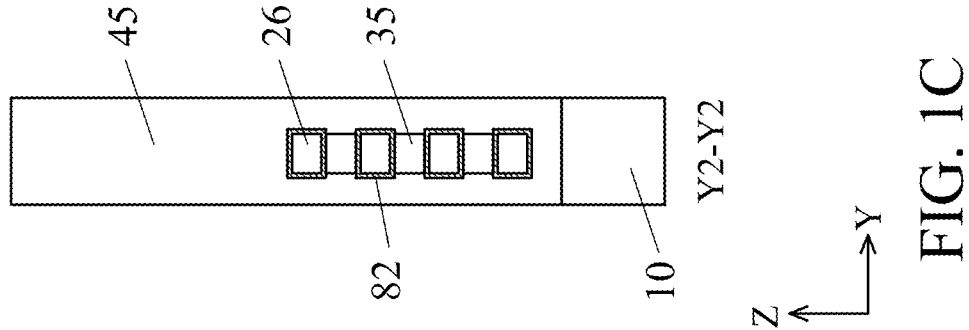
Figure 1B:
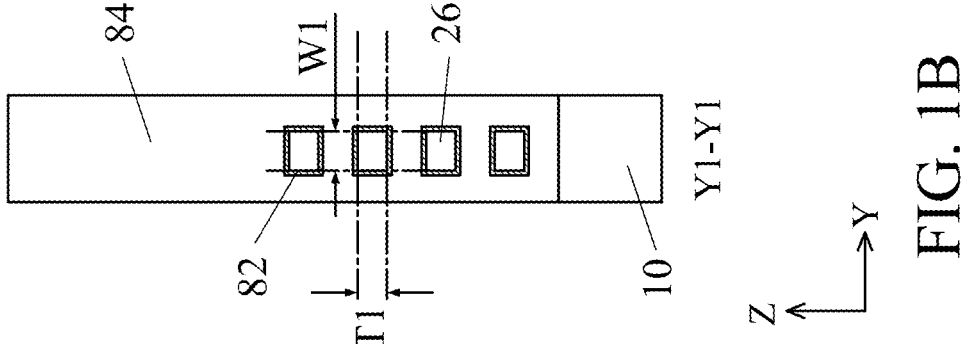

FIGS. 1A, 1B, 1C, and 1D show various views of a semiconductor GAA FET device according to an embodiment of the present disclosure. FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A. In some embodiments, the semiconductor GAA FET device of FIGS. 1A, 1B, 1C, and 1D is a p-type FET.

As shown in FIGS. 1A, 1B, and 1C, channel region 26 are provided over a semiconductor substrate 10, and vertically arranged along the Z direction (the normal direction to the principal surface of the substrate 10). In some embodiments, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain region. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

As shown in FIGS. 1A, 1B, and 1C, the semiconductor wires or sheets (collectively nano-structures), which constitute channel regions 26, are disposed over the substrate 10. In some embodiments, the channel regions 26 are disposed over a base portion 11 of a fin structure (see, FIG. 3) protruding from the substrate 10. Each of the channel regions 26 is wrapped around by a gate dielectric layer 82 and a gate electrode layer 84. The thickness T1 of the channel regions 26 is in a range from about 5 nm to about 60 nm and the width W1 of the channel regions 26 is in a range from about 5 nm to about 120 nm in some embodiments. In some embodiments, the width W1 of the channel regions 26 is greater than 120 nm. In certain embodiments, the width W1 is up to twice or five times the thickness T1 of the channel regions 26. In some embodiments, the channel regions 26 are made of Si, SiGe or Ge.

In some embodiments, an interfacial dielectric layer is formed between the channel region 26 and the gate dielectric layer 82. In some embodiments, the gate dielectric layer 82 includes a high-k dielectric layer. The gate structure includes the gate dielectric layer 82, the gate electrode layer 84 and sidewall spacers 45. Although FIGS. 1A, 1B, and 1C show four channel regions 26, the number of the channel regions 26 is not limited to four, and may be as small as one or more than four, and may be up to 15. By adjusting the number of the semiconductor wires or sheets, a driving current of the GAA FET device can be adjusted.

Further, a source/drain epitaxial layer 50 is disposed in or on the substrate 10. The source/drain epitaxial layer 50 is in direct contact with end faces of the channel regions 26, and is separated by insulating inner spacers 35 and the gate dielectric layer 82 from the gate electrode layer 84. In some embodiments, a base epitaxial layer 49 is formed below the source/drain epitaxial layer 50. In some embodiments, the channel region 26 and the base epitaxial layer 49 are made of the same material (e.g., Si, SiGe or Ge), except for a dopant condition (doping type/element and/or doping concentration). In some embodiments, the base epitaxial layer 49 is made of non-doped semiconductor material and the channel region 26 are made of the non-doped or doped semiconductor material. In some embodiments, when the base epitaxial layer 49 and the channel region 26 (wires or sheets) are made of SiGe, the Ge amount of the base epitaxial layer 49 and the channel region 26 is the same or different from each other. In other embodiments, the channel region 26 and the base epitaxial layer 49 are made of different semiconductor material.

In some embodiments, an additional insulating layer (not shown) is conformally formed on a surface of the insulating inner spacers 35 between the insulating inner spacers 35 and the gate electrode layer 84. As shown FIG. 1A, the cross section, perpendicular to the Y direction, of the insulating inner spacer 35 has a rounded convex shape (e.g., semi-circular or U-shape) toward the gate electrode layer 84.

An interlayer dielectric (ILD) layer 70 is disposed over the source/drain epitaxial layer 50 and a conductive contact layer 72 is disposed on the source/drain epitaxial layer 50, and a conductive contact plug 75 passing though the ILD layer 70 is disposed over the conductive contact layer 72. The conductive contact layer 72 includes one or more layers of conductive material. In some embodiments, the conductive contact layer 72 includes a silicide layer, such as WSi, NiSi, TiSi or CoSi or other suitable silicide material or an alloy of a metal element and silicon and/or germanium. In some embodiments, an etch stop layer 68 is disposed between the sidewall spacers 45 and the ILD layer 70 and on a part of the upper surface of the source/drain epitaxial layer 50.

In some embodiments, the FET shown in FIGS. 1A, 1B, 1C, and 1D is a p-type FET. The source/drain epitaxial layer includes one or more layers of Si, SiGe, Ge, SiGeSn, SiSn and GeSnP. In some embodiments, the source/drain epitaxial layer further includes boron (B). In some embodiments, the FET shown in FIGS. 1A, 1B, 1C, and 1D is an n-type FET and the epitaxial layer includes one or more layers of Si, SiC, SiGe, Ge, SiGeSn, SiSn and GeSnP. In some embodiments, the source/drain epitaxial layer further includes phosphor (P).

FIGS. 2 to 7 show various stages of manufacturing of semiconductor FET devices. It is understood that additional operations can be provided before, during, and after processes shown by FIGS. 2 to 7, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A, 1B, 1C, and 1D may be employed in the embodiment of FIGS. 2 to 7, and detailed explanation thereof may be omitted. A gate structure of FIGS. 2 to 7 has nanostructures such as nanowires and nanosheets.

Figure 2:
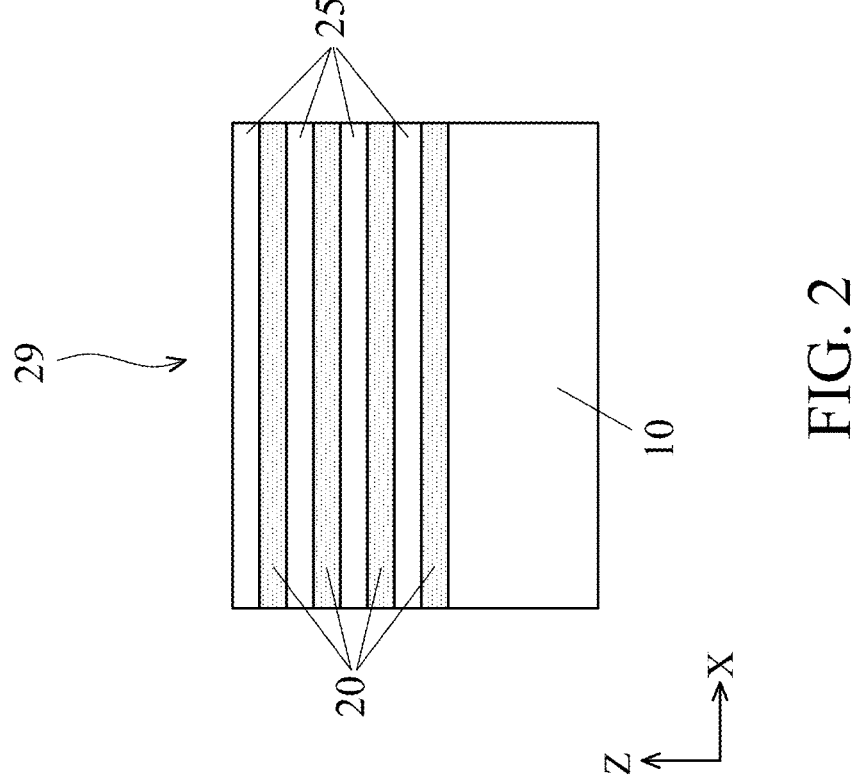
FIG. 2 shows one or more of the various stages of manufacturing a semiconductor GAA FET device.

As shown in FIG. 2, first semiconductor layers 20 and second semiconductor layers 25 are alternately formed over the substrate 10. The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP. The second semiconductor layers 25 are consistent with the channel regions 26 of FIGS. 1A, 1B, and 1C.

In some embodiments, the first semiconductor layers 20 and the second semiconductor layers 25 are made of Si, a Si compound, SiGe, Ge or a Ge compound. In some embodiments, the first semiconductor layers 20 are $Si_{1-x}Ge_x$, where x is equal to or more than about 0.1 and equal to or less than about 0.6, and the second semiconductor layers 25 are Si or $Si_{1-y}Ge_y$, where y is smaller than x and equal to or less than about 0.2. In this disclosure, an "M" compound" or an "M based compound" means the majority of the compound is M.

In other embodiments, the second semiconductor layers 25 are $Si_{1-x}Ge_x$, where x is equal to or more than about 0.1 and equal to or less than about 0.6, and the first semiconductor layers 20 are Si or $Si_{1-y}Ge_y$, where y is smaller than x and equal to or less than about 0.2.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 60 nm in some embodiments, and is in a range from about 10 nm to about 30 nm in other embodiments. The thickness of the second semiconductor layers 25 is in a range from about 5 nm to about 60 nm in some embodiments, and is in a range from about 10 nm to about 30 nm in other embodiments. The thickness of the first semiconductor layers 20 may be the same as, or different from the thickness of the second semiconductor layers 25. Although four first semiconductor layers 20 and four second semiconductor layers 25 are shown in FIG. 2, the numbers are not limited to four, and can be 1, 2, 3 or more than 4, and is less than 20. In some embodiments, the number of the first semiconductor layers 20 is greater, by one, from the number of the second semiconductor layers 25 (i.e.—the top layer is the first semiconductor layer 20).

Figure 3:
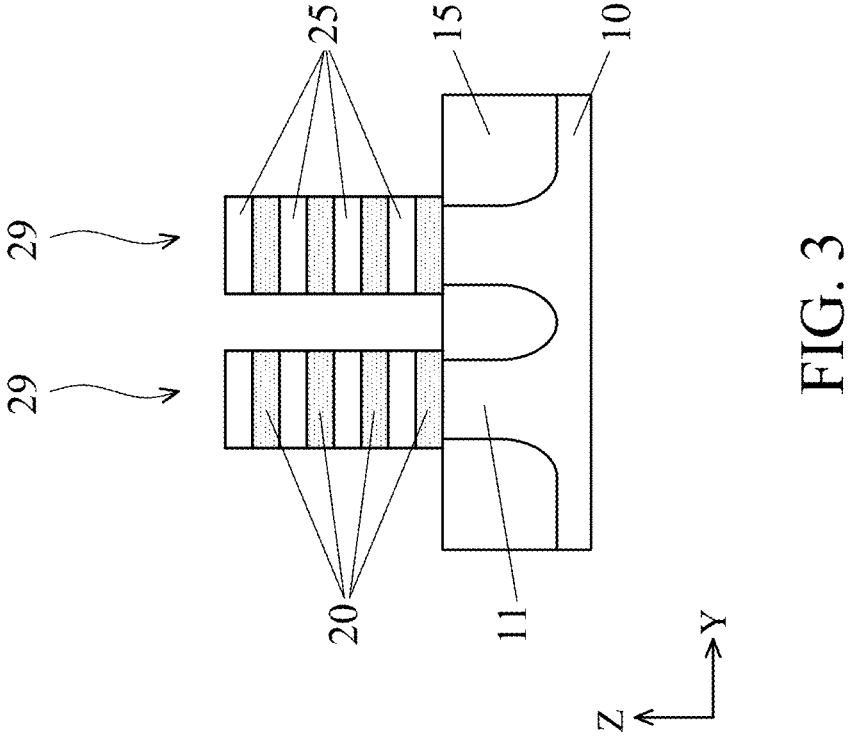
FIG. 3 shows one or more of the various stages of manufacturing a semiconductor GAA FET device.

After the stacked semiconductor layers are formed, fin structures are formed by using one or more lithography and etching operations, as shown in FIG. 3. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

As shown in FIG. 3, the fin structures 29 extend in the X direction and are arranged in the Y direction. The number of the fin structures is not limited to two as shown in FIG. 3, and may be as small as one and three or more. In some embodiments, one or more dummy fin structures are formed on both sides of the fin structures 29 to improve pattern fidelity in the patterning operations. As shown in FIG. 3, the fin structures 29 have upper portions constituted by the stacked first and second semiconductor layers 20, 25 and over the base portion 11 of the fin structures 29.

The width of the upper portion of the fin structure 29 along the Y direction is in a range from about 10 nm to about 150 nm in some embodiments, and is in a range from about 20 nm to about 30 nm in other embodiments.

After the fin structures 29 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-enhanced CVD (PECVD) or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, one or more fin liner layers are formed over the fin structures before forming the insulating material layer. In some embodiments, the fin liner layers include a first fin liner layer formed over the substrate 10 and sidewalls of the base portion 11 of the fin structures 29, and a second fin liner layer formed on the first fin liner layer. The fin liner layers are made of silicon nitride or a silicon nitride-based material (e.g., SiON, SiCN or SiOCN). The fin liner layers may be deposited through one or more processes such as physical vapor deposition (PVD), chemical vapor deposition (CVD), or atomic layer deposition (ALD), although any acceptable process may be utilized.

Then, as shown in FIG. 3, the insulating material layer is recessed to form an isolation insulating layer 15 so that the upper portions of the fin structures 29 are exposed. With this operation, the fin structures 29 are separated from each other by the isolation insulating layer 15, which is also called a shallow trench isolation (STI). The isolation insulating layer 15 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 15 is formed through a process such as CVD, flowable CVD (FCVD), or a spin-on-glass process, although any acceptable process may be utilized.

In some embodiments, the isolation insulating layer 15 is recessed until the upper portion of the fin structure 29 over the base portion 11 is exposed. In other embodiments, the upper portion of the fin structure 29 is not exposed. The first semiconductor layers 20 are sacrificial layers which are subsequently partially removed, and the second semiconductor layers 25 are subsequently formed into semiconductor wires as channel regions 26 of the GAA FET. In other embodiments, the second semiconductor layers 25 are sacrificial layers which are subsequently partially removed, and the first semiconductor layers 20 are subsequently formed into semiconductor wires as channel regions 26.

Figures 4A, 4B:
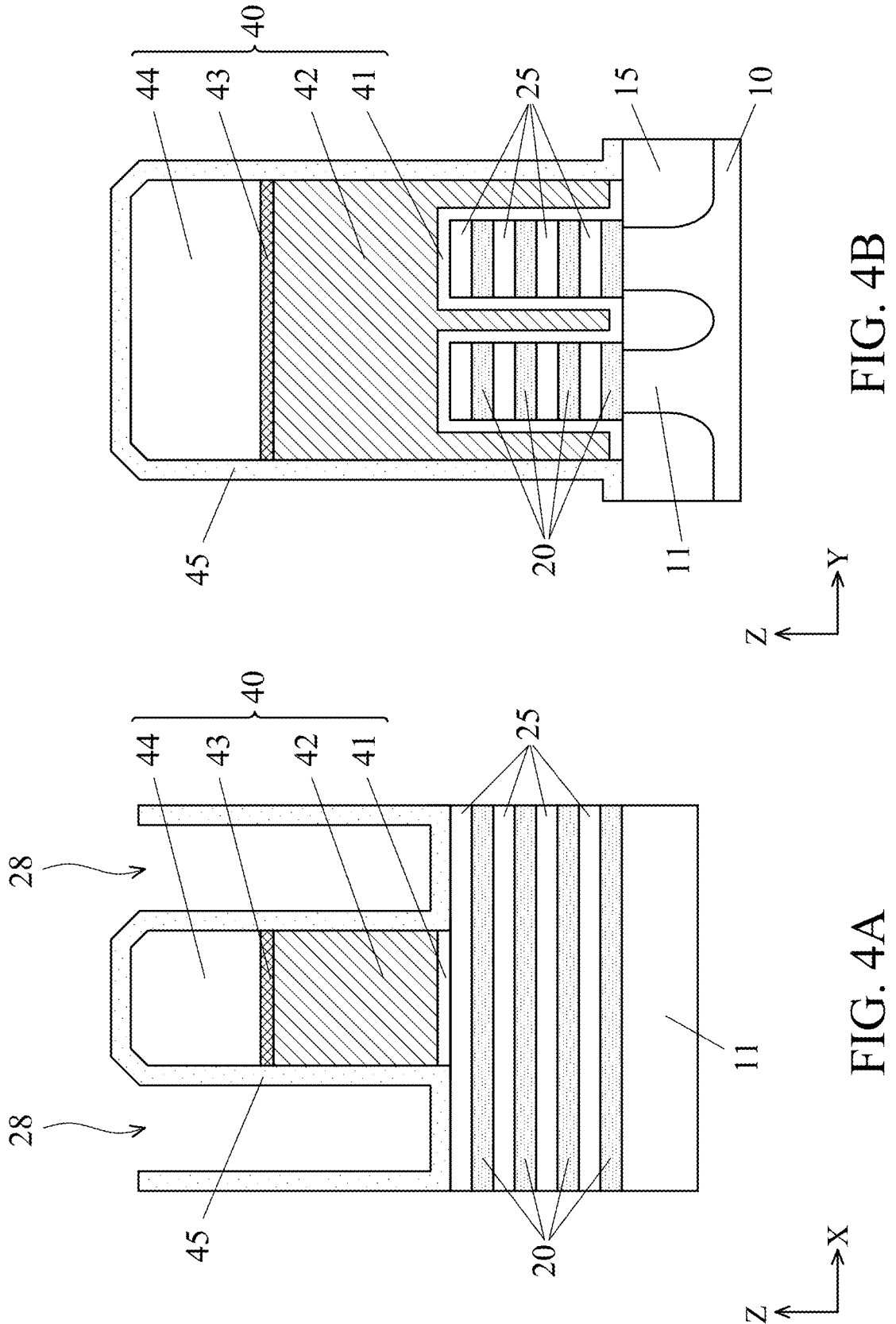
FIGS. 4A and 4B show one or more of the various stages of manufacturing a semiconductor GAA FET device.

After the isolation insulating layer 15 is formed, a sacrificial (dummy) gate structure 40 is formed, as shown in FIGS. 4A and 4B. FIGS. 4A and 4B illustrate a structure after a sacrificial gate structure 40 is formed over the exposed fin structures 29. The sacrificial gate structure 40 is formed over a portion of the fin structures which is to be a channel region. The sacrificial gate structure 40 defines the channel region of the GAA FET. The sacrificial gate structure 40 includes a sacrificial gate dielectric layer 41 and a sacrificial gate electrode layer 42. The sacrificial gate dielectric layer 41 includes one or more layers of insulating material, such as a silicon oxide-based material. In one embodiment, silicon oxide formed by CVD is used. The thickness of the sacrificial gate dielectric layer 41 is in a range from about 1 nm to about 5 nm in some embodiments.

The sacrificial gate structure 40 is formed by first blanket depositing the sacrificial gate dielectric layer 41 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad silicon nitride layer 43 and a silicon oxide mask layer 44.

Next, a patterning operation is performed on the mask layer and sacrificial gate electrode layer is patterned into the sacrificial gate structure 40, as shown in FIGS. 4A and 4B. The sacrificial gate structure includes the sacrificial gate dielectric layer 41, the sacrificial gate electrode layer 42 (e.g., poly silicon), the pad silicon nitride layer 43 and the silicon oxide mask layer 44. By patterning the sacrificial gate structure, the stacked layers of the first and second semiconductor layers 20 and 25 are partially exposed on opposite sides of the sacrificial gate structure, thereby defining source/drain region (28), as shown in FIGS. 4A and 4B. In this disclosure, a source and a drain are interchangeably used and the structures thereof are substantially the same. In FIGS. 4A and 4B, one sacrificial gate structure is formed over two fin structures, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Further, a first cover layer as sidewall spacers 45 is formed over the sacrificial gate structure 40, as shown in FIGS. 4A and 4B. The sidewall spacers 45 is deposited in a conformal manner so that it is formed to have substantially equal thicknesses on vertical surfaces, such as the sidewalls, horizontal surfaces, and the top of the sacrificial gate structure, respectively. In some embodiments, the first cover layer 45 has a thickness in a range from about 5 nm to about 20 nm. The first cover layer includes one or more of silicon nitride, SiON, SiCN, SiCO, SiOCN or any other suitable dielectric material. The cover layer (sidewall spacers 45) can be formed by ALD or CVD, or any other suitable method.

Figures 5, 6:
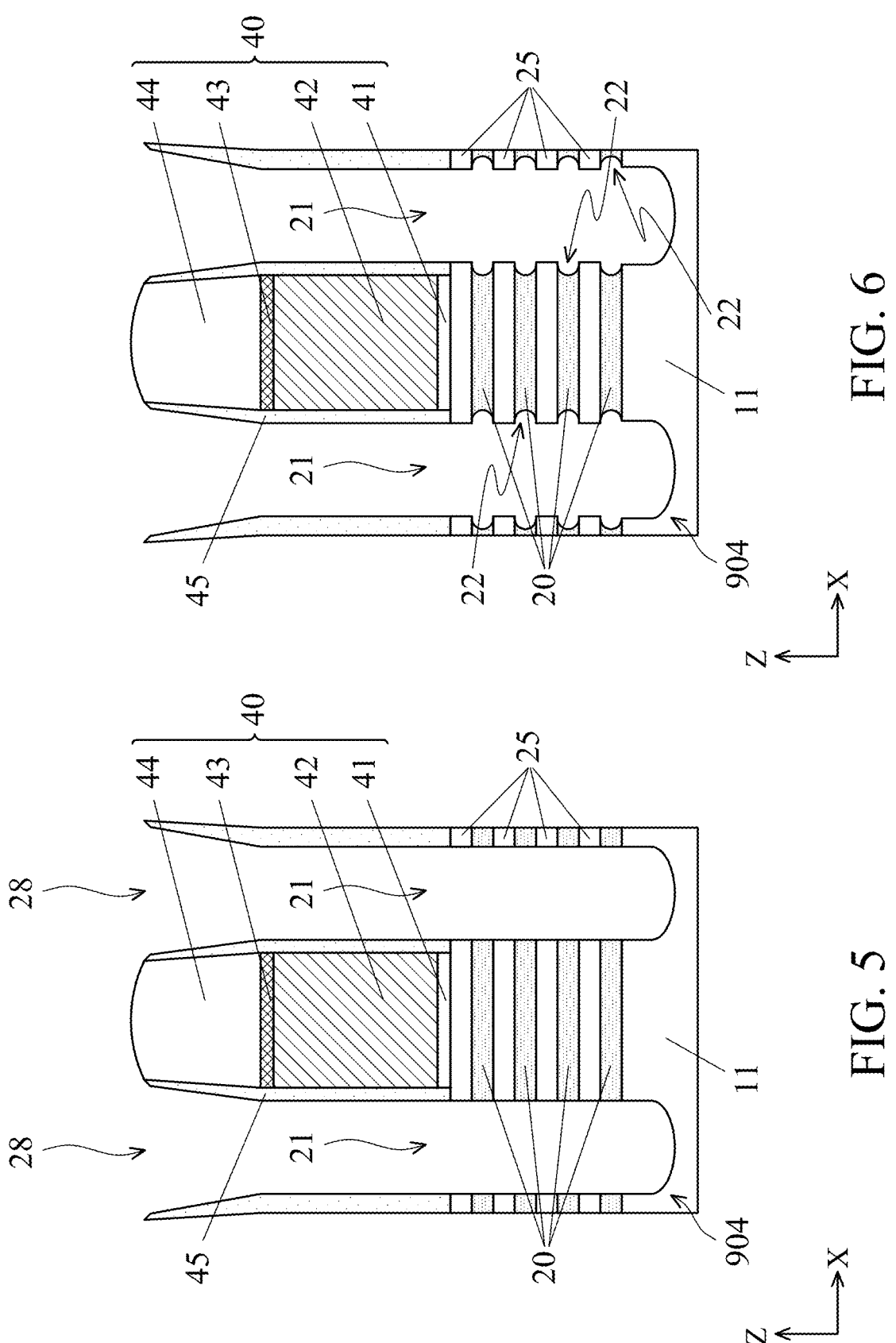
FIG. 5 shows one or more of the various stages of manufacturing a semiconductor GAA FET device.
FIG. 6 shows one or more of the various stages of manufacturing a semiconductor GAA FET device.

FIG. 5 shows a cross sectional view along the X direction. Next, as shown in FIG. 5, the first cover layer is anisotropically etched to remove the sidewall spacers 45 disposed on the source/drain region (28), while leaving the first cover layer as sidewall spacers 45 on side faces of the sacrificial gate structure 40. Then the stacked structure of the first semiconductor layers 20 and the second semiconductor layer 25 is etched down at the source/drain region, by using one or more lithography and etching operations, thereby forming a recessed source/drain space 21. In some embodiments, the substrate 10 (or the base portion 11 of the fin structure) is also partially etched. In some embodiments, an n-type FET and a p-type FET are manufactured separately, and in such a case, a region for one type of FET is processed, and a region for the other type of FET is covered by a protective layer, such as a silicon nitride. In some embodiments, as shown in FIG. 5, the recessed space 21 has a U-shape. In other embodiments, the recessed space 21 has a V-shape showing (111) facets of silicon crystal. In other embodiments, the recessed spaced 21 has a reverse trapezoid shape, or a rectangular shape.

In some embodiments, the recessed source/drain space 21 is formed by a dry etching process, which may be anisotropic. The anisotropic etching process may be performed using a process gas mixture including $BF_2$, $Cl_2$, $CH_3F$, $CH_4$, HBr, $O_2$, Ar, other etchant gases. The plasma is a remote plasma that is generated in a separate plasma generation chamber connected to the processing chamber. Process gases may be activated into plasma by any suitable method of generating the plasma, such as transformer coupled plasma (TCP) systems, inductively coupled plasma (ICP) systems, magnetically enhanced reactive ion techniques. The process gases used in the plasma etching process includes etchant gases such as $H_2$, Ar, other gases, or a combination of gases. In some embodiments, carrier gases, such as $N_2$, Ar, He, Xe, plasma etching process using hydrogen (H) radicals. The H radicals may be formed by flowing $H_2$ gas into a plasma generation chamber and igniting a plasma within the plasma generation chamber. In some embodiments, an additional gas may be ignited into a plasma within the plasma generation chamber, such as Ar. The H radicals may selectively etch (100) planes over (111) planes or (110) planes. In some cases, the etch rate of (100) planes may be about three times greater than the etch rate of (111) planes. Due to this selectivity, the etching by the H radicals may tend to slow or stop along (111) planes or (110) planes of silicon during the second patterning process.

Further, FIG. 6 shows the semiconductor device such that the first semiconductor layers 20 are laterally etched in the X direction within the source/drain space 21, thereby forming cavities 22. When the first semiconductor layers 20 are SiGe and the second semiconductor layers 25 are Si, the first semiconductor layers 20 can be selectively etched by using a wet etchant such as, but not limited to, a mixed solution of $H_2O_2$, $CH_3COOH$ and HF, followed by $H_2O$ cleaning. In some embodiments, the etching by the mixed solution and cleaning by water is repeated 10 to 20 times. The etching time by the mixed solution is in a range from about 1 min to about 2 min in some embodiments. The mixed solution is used at a temperature in a range from about 60° C. to about 90° C. in some embodiments. In some embodiments, other etchants are used.

Figure 7:
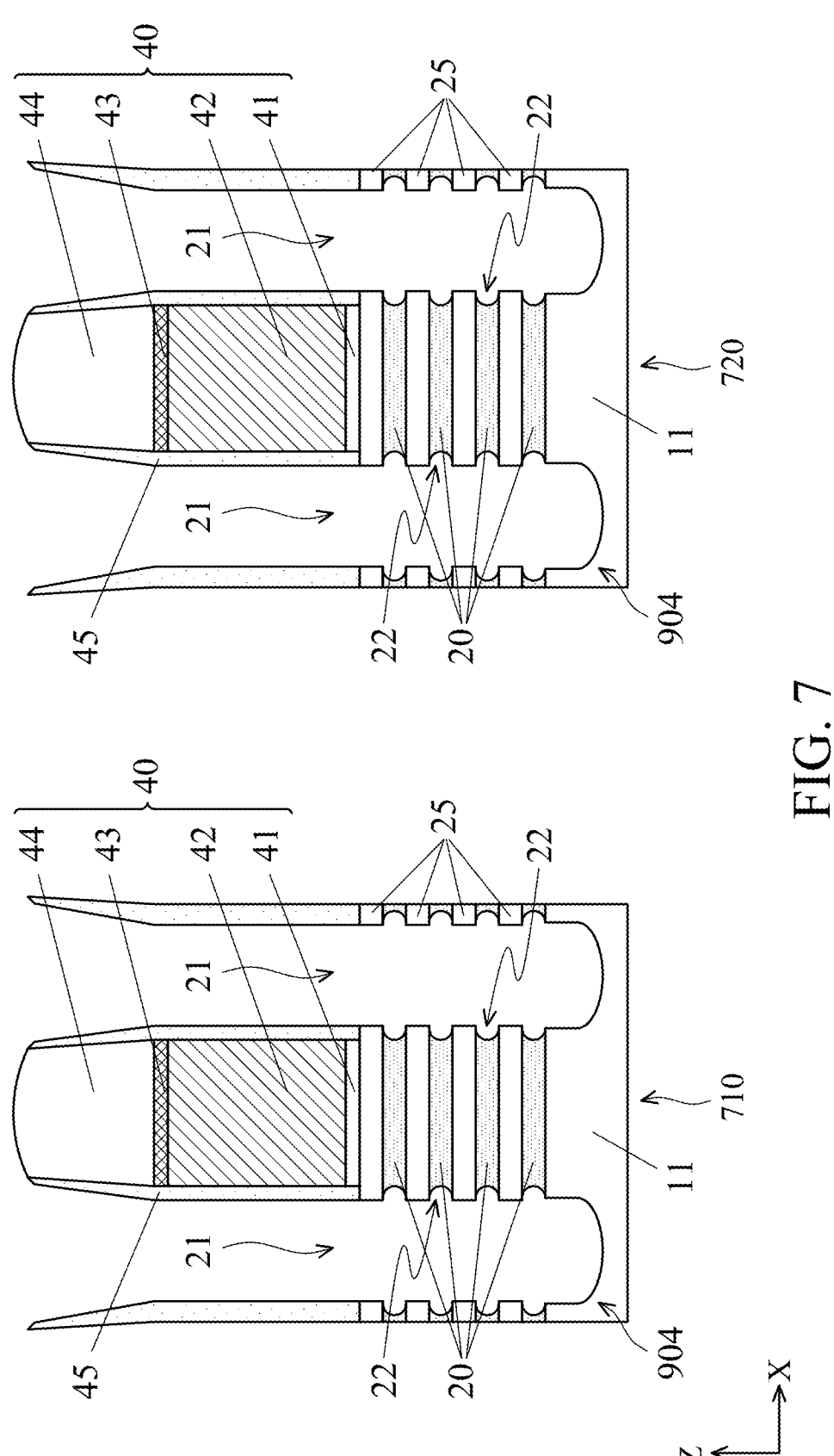
FIG. 7 shows one or more of the various stages of manufacturing two semiconductor GAA FET devices.

Next, FIG. 7 shows semiconductor device structures 710 and 720, e.g., GAA FETs, that are consistent with the semiconductor device of FIG. 6. In some embodiments, the semiconductor device structures 710 and 720 are both n-type GAA FETs or are both p-type GAA FETs that are adjacent to each other that are processed according to the semiconductor type. In some embodiments, the semiconductor device 710 is an n-type GAA FETs and the semiconductor device 720 is a p-type GAA FETs that are adjacent to each other that are processed according to the semiconductor type. In some embodiments, the semiconductor device structures 710 and 720 are not adjacent to each other.

FIGS. 8A, 8B, 8C, 8D, 8E, 8F, 8G, and 8H show various stages of manufacturing semiconductor GAA FET devices according to an embodiment of the present disclosure. It is understood that additional operations can be provided before, during, and after processes shown by FIGS. 8A to 8H, and some of the operations described below can be replaced or eliminated, for additional embodiments of the method. The order of the operations/processes may be interchangeable. Material, configuration, dimensions and/or processes the same as or similar to the foregoing embodiments may be employed in the embodiment of FIGS. 8A-8H, and detailed explanation thereof may be omitted.

Figure 8A:
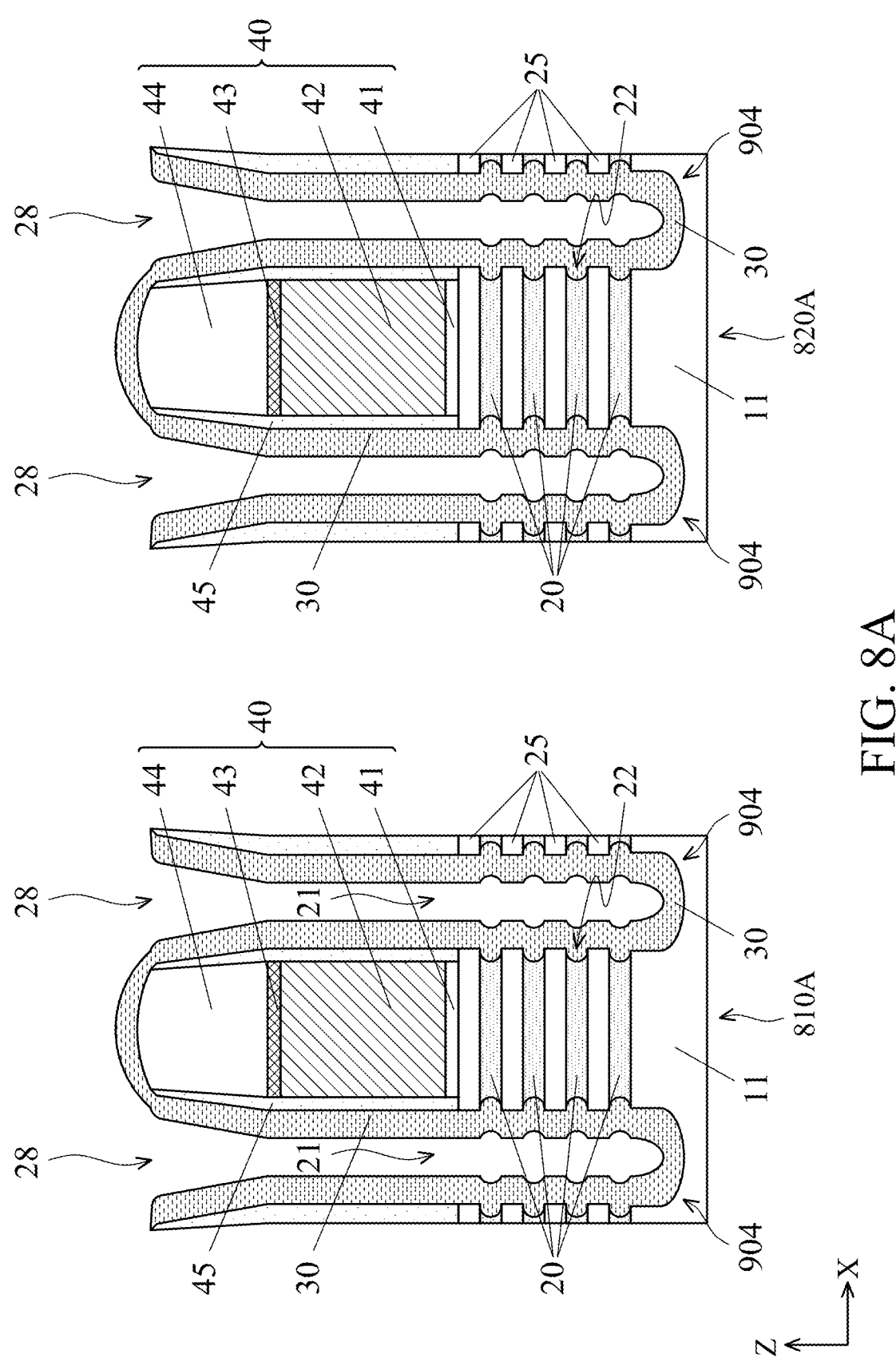
FIGS. 8A, 8B, 8C, 8D, 8E, 8F, 8G, and 8H show various stages of manufacturing semiconductor GAA FET devices according to an embodiment of the present disclosure.

In FIG. 8A, semiconductor device structures 810A and 820A that are consistent with the semiconductor device structures 710 and 720 of FIG. 6, additionally have a first insulating layer 30 conformally formed in the source/drain space 21. The first insulating layer 30 is formed on the etched lateral ends of the first semiconductor layers 20, e.g., the cavities 22, and on end faces of the second semiconductor layers 25 in the source/drain space 21 and is formed over the sacrificial gate structure 40 of the two semiconductor GAA FET devices. The first insulating layer 30 includes one of silicon nitride and silicon oxide, SiON, SiOC, SiCN and SiOCN, or any other suitable dielectric material. The first insulating layer 30 is made of a different material than the sidewall spacers 45 (first cover layer). The first insulating layer 30 has a thickness in a range from about 1.0 nm to about 10.0 nm in some embodiments. In other embodiments, the first insulating layer 30 has a thickness in a range from about 2.0 nm to about 5.0 nm. The first insulating layer 30 can be formed by ALD or any other suitable methods. By conformally forming the first insulating layer 30, the cavities 22 of the first semiconductor layers 20 in the source/drain space 21 are fully filled with the first insulating layer 30. As shown, a bottom 904 of the source/drain space 21 and the walls surrounding the source/drain space 21 is covered with the first insulating layer 30. In some embodiments, a second insulating layer (not shown) is disposed over the first insulating layer 30. In some embodiments, the second semiconductor layers 25 are nanowires or nanosheets of a gate structure of the semiconductor device structures 810A and 820A and the first semiconductor layers 20 are dummy layers that are replaced, as described with respect to FIG. 8H, with gate electrode layers consistent with gate electrode layers 84 of FIG. 1A.

Figure 8B:
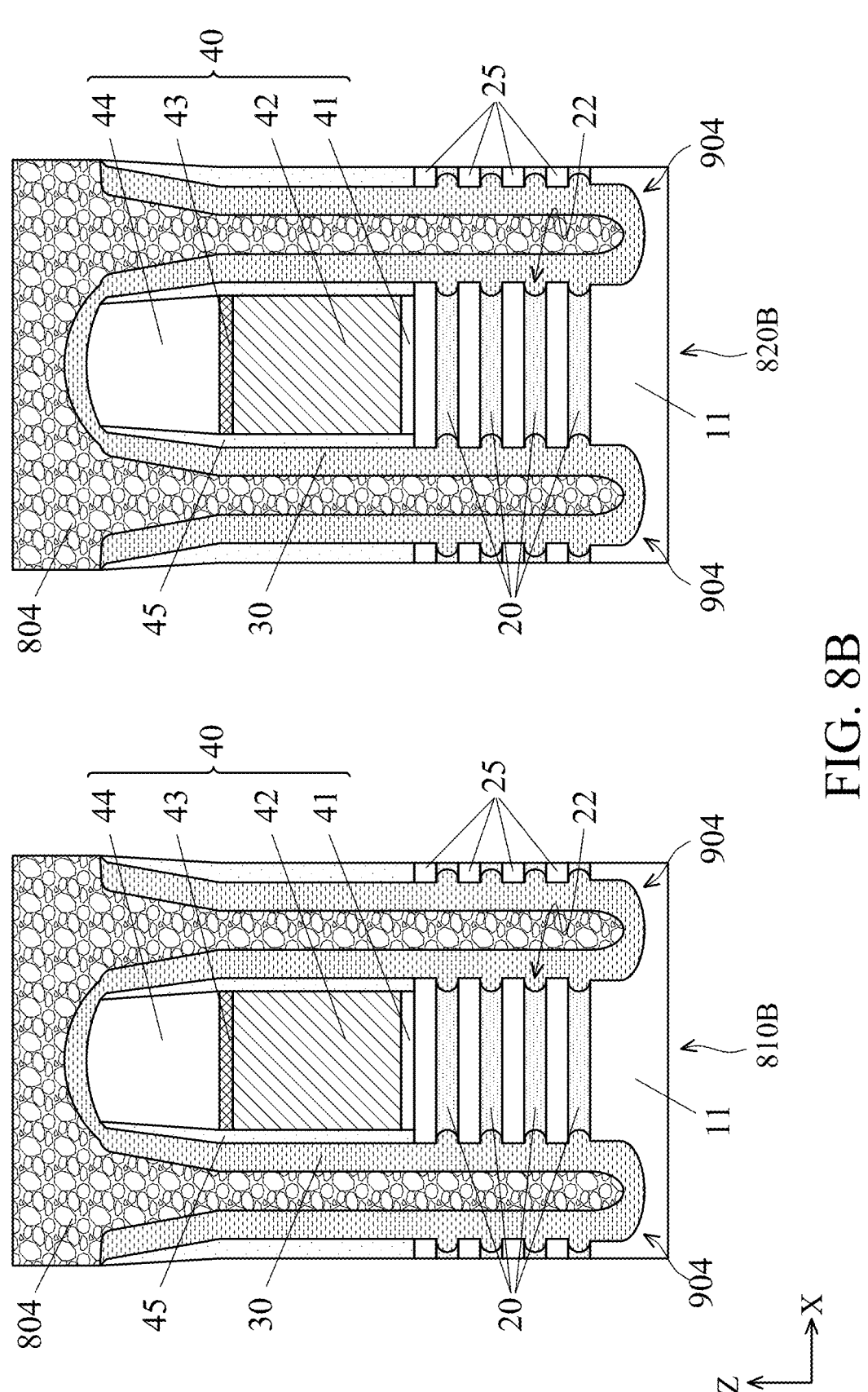
Figure 8C:
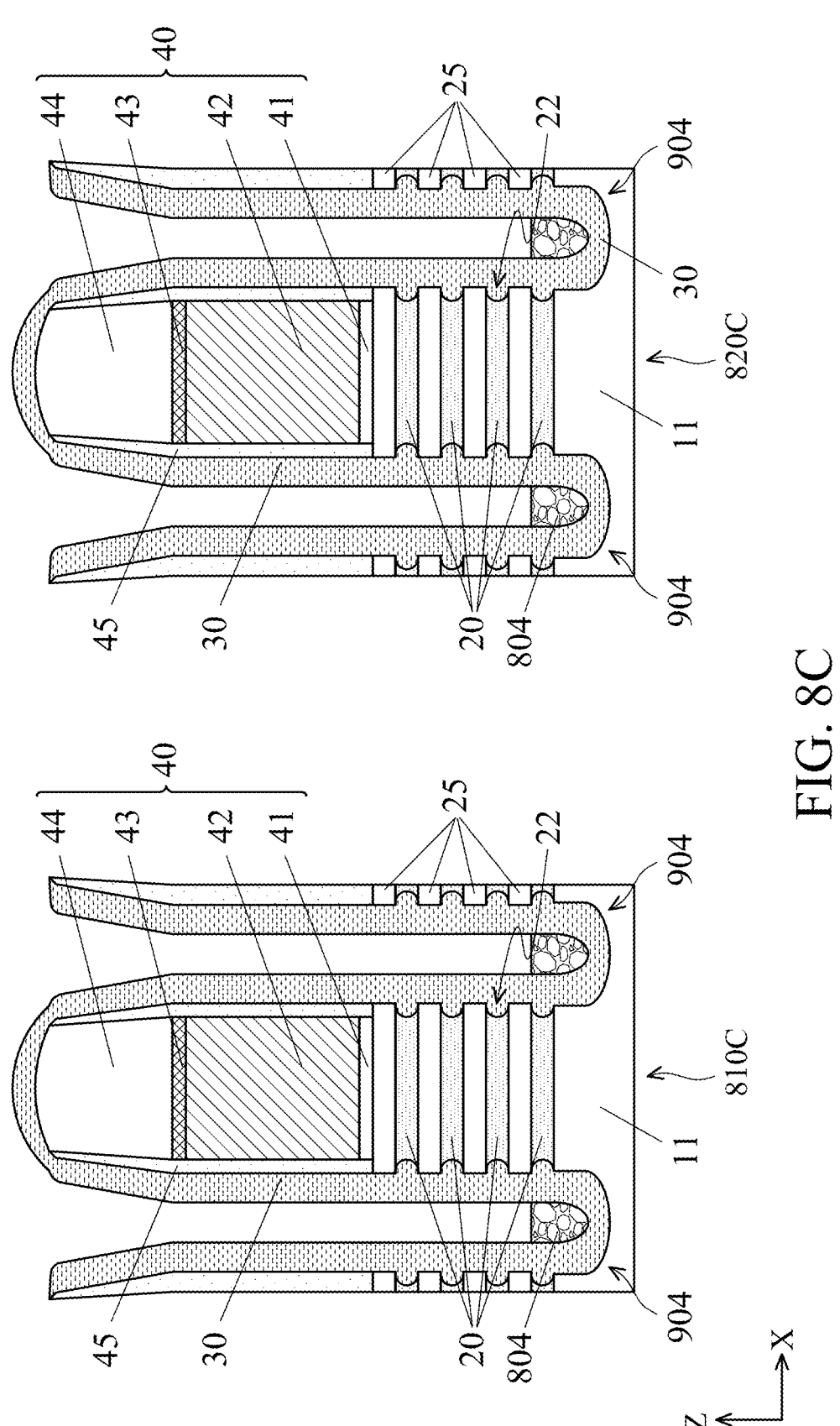
Figure 8D:
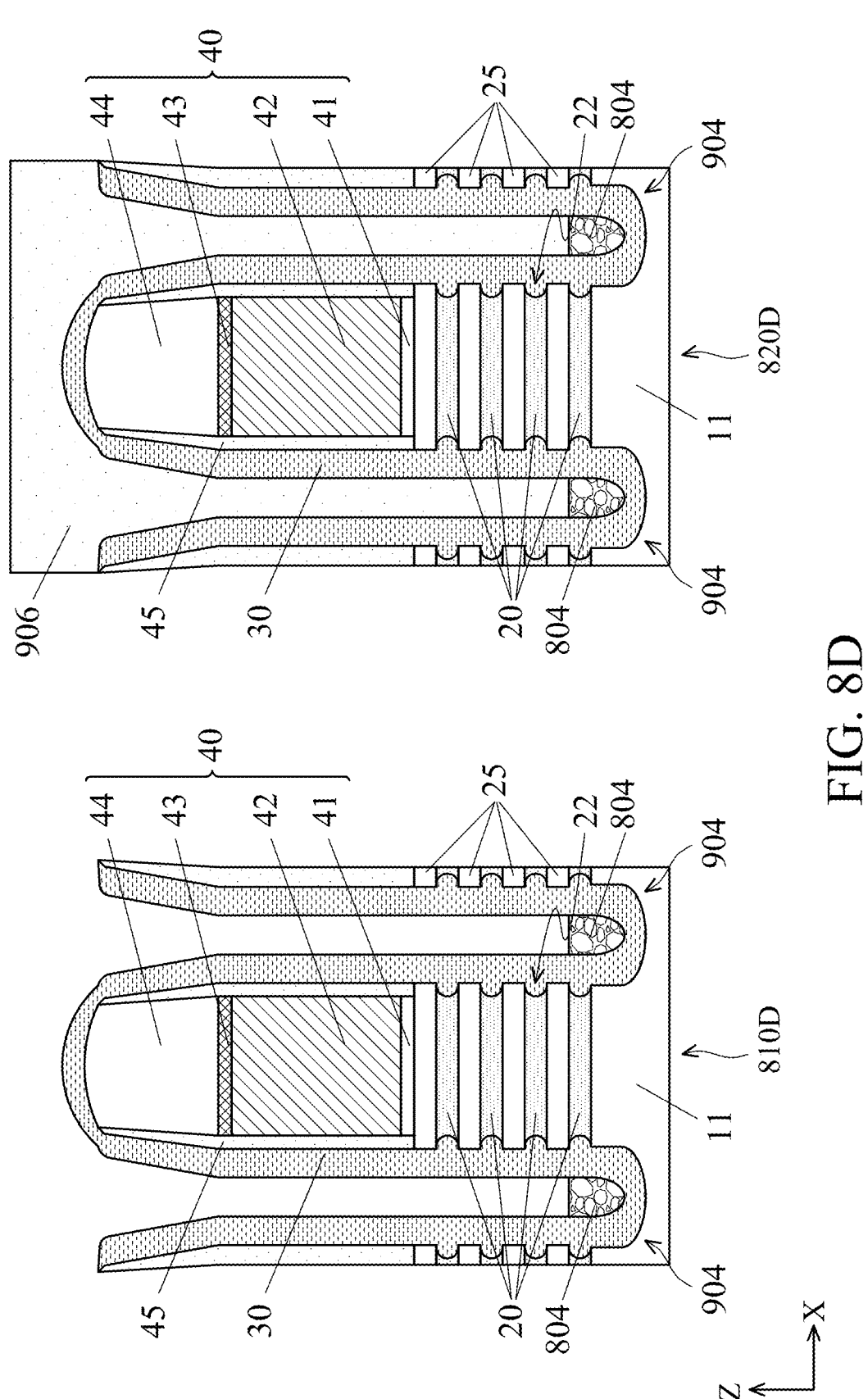
Figure 8E:
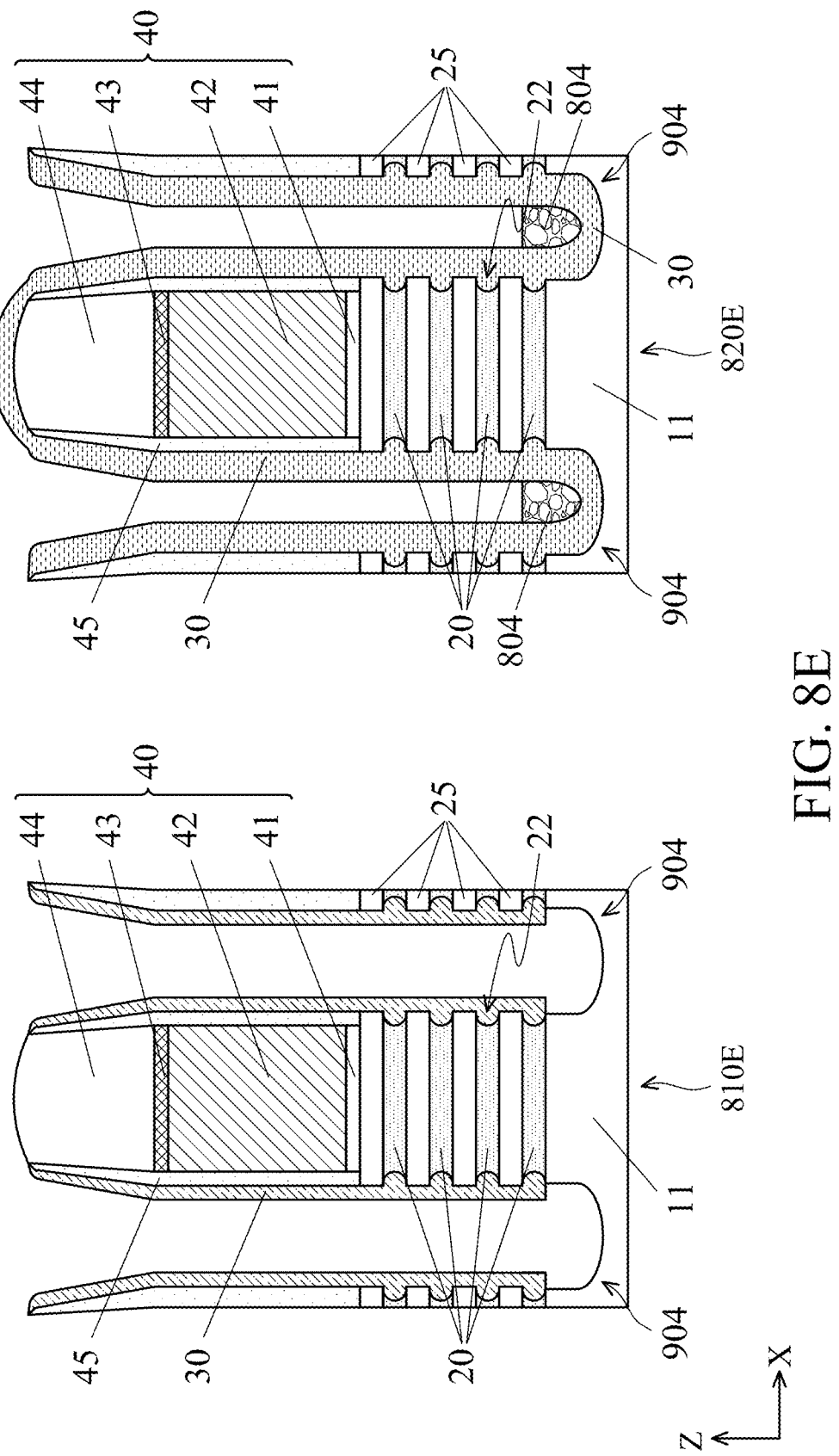

FIG. 8B shows semiconductor device structures 810B and 820B after disposing a dielectric layer 804 over the source/drain region 28 of the semiconductor device structures 810A and 820A and fully fill the source/drain space 21, cover over the source/drain space 21, and cover over the sacrificial gate structure 40. In some embodiments, the dielectric layer 804 includes silicon oxide or silicon nitride. In some embodiments, the dielectric layer 804 is made of a different material than the first insulating layer 30. FIG. 8C shows semiconductor device structures 810C and 820C after etching, e.g., isotropic etching and/or anisotropic etching, the semiconductor device structures 810B and 820B to remove the dielectric layer 804 from over source/drain space 21, over the sacrificial gate structure 40, and partially remove the dielectric layer 804 from source/drain space 21 such that a portion of the dielectric layer 804 remains in the bottom 904 of the source/drain space 21 of the semiconductor device structures 810C and 820C up to a level of about the lowest first semiconductor layer 20. FIG. 8D shows semiconductor device structures 810D and 820D after a photo resist layer 906 is disposed over the semiconductor device structure 820C and shows that the semiconductor device structure 810D is consistent with the semiconductor device structure 810C. FIG. 8E shows the semiconductor device structures 810E and 820E when anisotropic dry etching is applied to the semiconductor device structures 810D and 820D and the portion of the dielectric layer 804 and the first insulating layer 30 at the bottom 904 of the source/drain space 21 of the semiconductor device structure 810D is removed. Also, the first insulating layer 30 over the sacrificial gate structure 40 is removed. Because of the photo resist layer 906, the etching does not affect the semiconductor device structure 820D and the semiconductor device structure 820E is consistent with the semiconductor device structure 820C. After the etching, the photo resist layer 906 is removed.

Figure 8F:
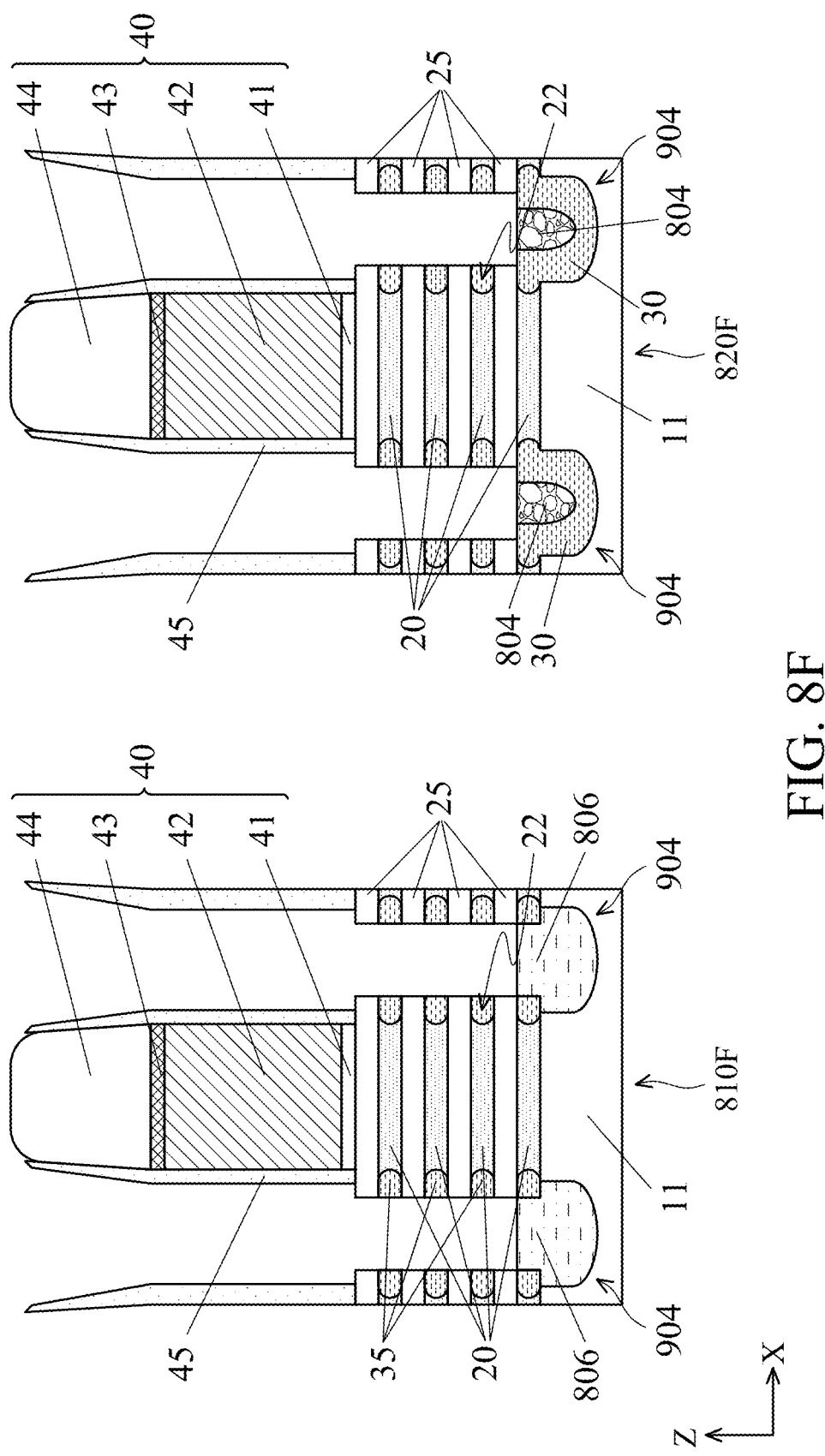

FIG. 8F shows semiconductor device structures 810F and 820F. One or more etching operations, e.g., directional etching and/or isotropic operations, are performed to remove the first insulating layer 30 from walls of the source/drain space 21 of the semiconductor device structures 810E and 820E, thereby forming inner spacers 35, as shown in the semiconductor device structures 810F and 820F. In some embodiments, the end face of the inner spacers 35 is recessed more than the end face of the second semiconductor layers 25. The recessed amount is in a range from about 0.2 nm to about 3 nm and is in a range from about 0.5 nm to about 2 nm in other embodiments. In other embodiments, the recessed amount is less than 0.5 nm and may be equal to zero (i.e.—the end face of the inner spacer 35 and the end face of the second semiconductor layers 25 are flush with each other). The directional etching also removes the first insulating layer 30 from over the sacrificial gate structure 40 of the semiconductor device structure 820E. Also, an undoped epitaxial layer 806, e.g., undoped Si or undoped SiGe, is grown at the bottom 904 of the source/drain space 21 of the semiconductor device structures 810F. In some embodiments, the undoped epitaxial layer has a low dopant concentration of up to $10^{13}$ $cm^{-3}$.

Figure 8G:
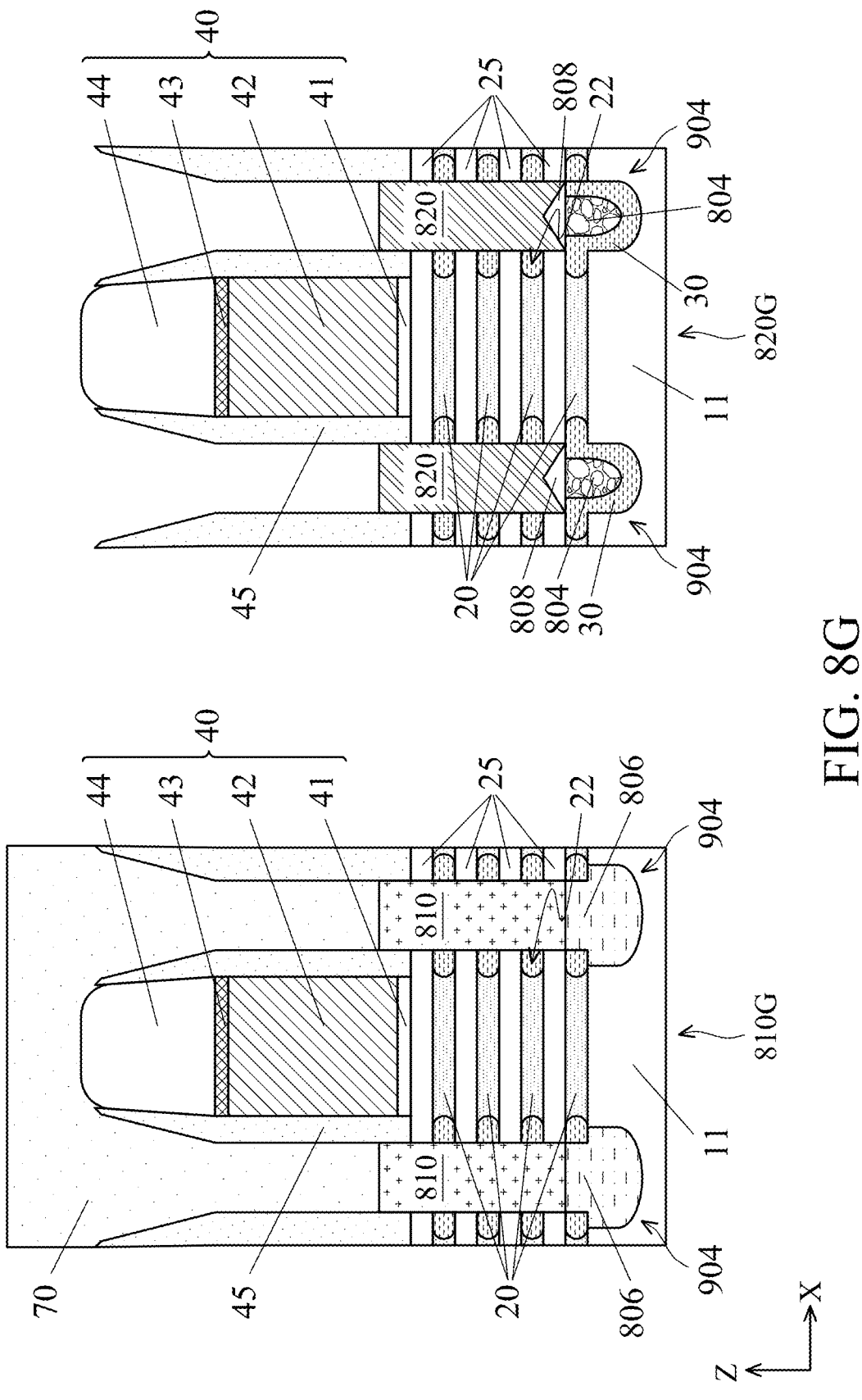

FIG. 8G shows a semiconductor device structure 810G after a doped epitaxial layer 810 is grown over the undoped epitaxial layer 806 at the bottom 904 of the source/drain space 21 of the semiconductor device structure 810G. Next, an interlayer dielectric (ILD) layer 70 is formed over the source/drain epitaxial layer 810, the sacrificial gate structure 40, and the sidewall spacers 45. The materials for the ILD layer 70 include compounds comprising Si, 0, C and/or H, such as silicon oxide, SiCOH and SiOC. Organic materials, such as polymers, may be used for the ILD layer 70. FIG. 8G also shows a semiconductor device structure 820G after doped epitaxial layers 820 is grown above the dielectric layer 804 at the bottom of the source/drain space 21 of the semiconductor device structure 820G. Next, the ILD layer 70 (not shown) is formed over the source/drain epitaxial layer 820, the sacrificial gate structure 40, and the sidewall spacers 45. In the semiconductor device structure 810G, the doped epitaxial layer 810 grows over the undoped epitaxial layer 806 and no distance or void is produced between the doped epitaxial layer 810 and the undoped epitaxial layer 806.

As shown, the doped epitaxial layers 820 of the semiconductor device structure 820G does not grow over the dielectric layer 804 or the first insulating layer 30 and, thus, does not touch the dielectric layer 804 and the first insulating layer 30. Therefore, a void 808 is produced between the doped epitaxial layers 820 and the dielectric layer 804 and first insulating layer 30. The void 808 which has a width as large as the width of the source/drain space 21, e.g., between about 5 nm and 50 nm, a height between about 1 nm and 5 nm, and may have cross sectional shape of a rectangle or triangle, may act as a physical barrier, e.g., an electrical isolation/barrier, to prevent a current from source/drain region 28 to get to the base portion 11 of the fin structures or to the substrate 10. The type of the dopant of the doped epitaxial layers 810 and 820 are consistent with the type of the semiconductor device structures 810G and 820G. In some embodiments, when the semiconductor device structures 810G or 820G are p-type, the dopant is boron (B) and when the semiconductor device structures 810G or 820G are n-type, the dopant is phosphors (P).

Figure 8H:
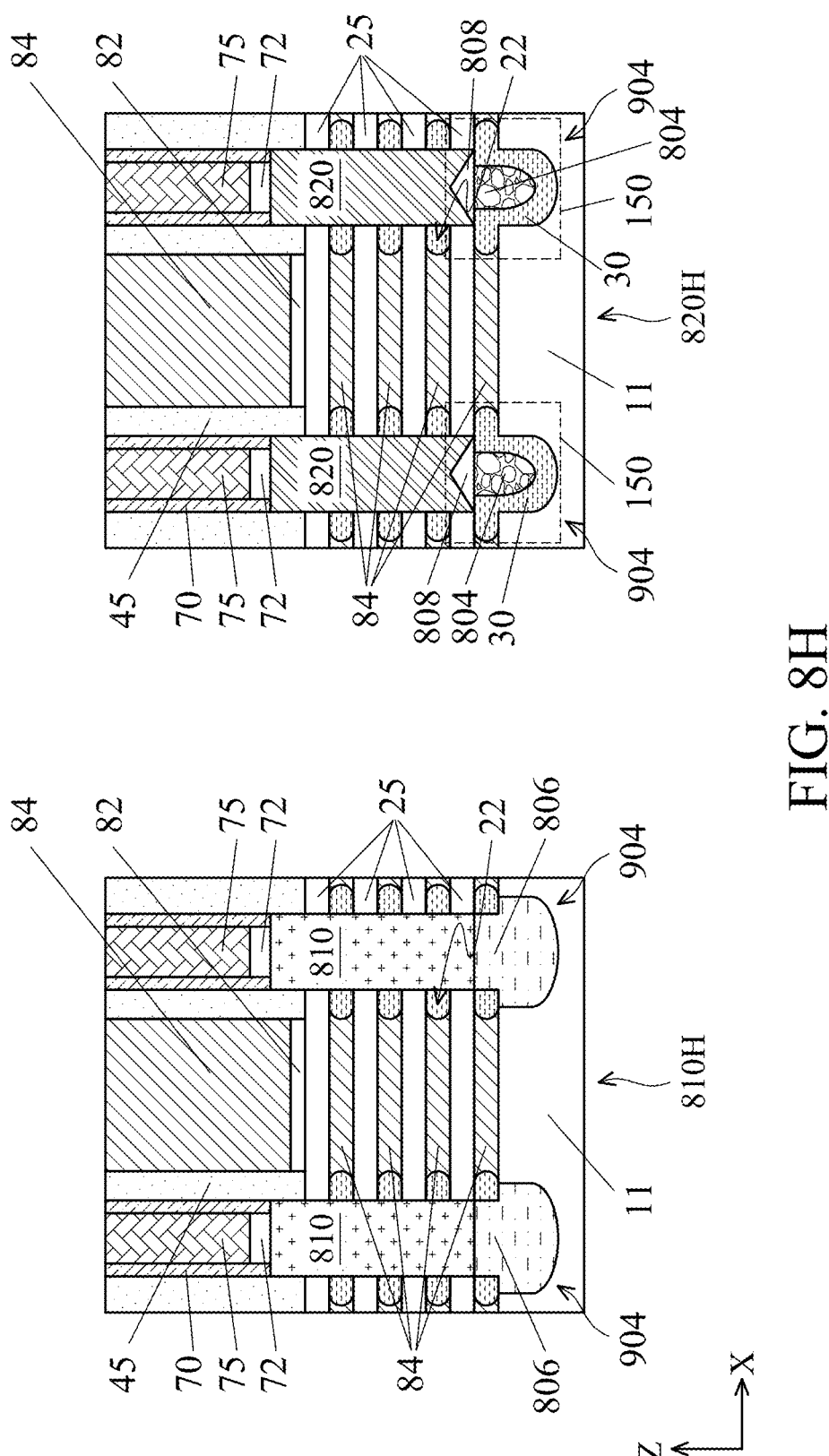

FIG. 8H shows the semiconductor device structures 810H and 820H. After the ILD layer 70 is formed over the semiconductor device structures 810G and 820G, a planarization operation, such as CMP, is performed, so that the top portion of the sacrificial gate electrode layer 42 is exposed. Then the sacrificial gate electrode layer 42 and sacrificial gate dielectric layer 41 are removed. The ILD layer 70 protects the doped source/drain epitaxial layer 810 and 820 during the removal of the sacrificial gate structures 40. The sacrificial gate structures 40 can be removed using plasma dry etching and/or wet etching. When the sacrificial gate electrode layer 42 is polysilicon and the ILD layer 70 is silicon oxide, a wet etchant such as a TMAH solution can be used to selectively remove the sacrificial gate electrode layer 42. The sacrificial gate dielectric layer 41 is thereafter removed using plasma dry etching and/or wet etching.

After the sacrificial gate structures are removed, the first semiconductor layers 20 are removed, thereby forming wires or sheets (channel regions) of the second semiconductor layers 25, as shown in FIG. 8H. The first semiconductor layers 20 can be removed/etched using an etchant that can selectively etch the first semiconductor layers 20 against the second semiconductor layers 25 and against the inner spacers 35 that act as etch stops. In some embodiments, the etched sacrificial gate dielectric layer 41 and the etched sacrificial gate electrode layer 42 are replaced with a metal gate structure that includes the gate dielectric layer 82 and the gate electrode layer 84 are respectively disposed. In addition, the gate electrode layer 84 is disposed in the location of the first semiconductor layers 20 that is sandwiched between two layer of the gate dielectric layer 82 (shown in FIG. 1A).

After the metal gate structure is formed, the ILD layer 70 is patterned and a conductive contact layer 72 is formed over the doped epitaxial layers 810 and 820 and a conductive contact plug 75 is formed on the conductive contact layer 72. In some embodiments, the conductive contact layer 72 includes one or more of Co, Ni, W, Ti, Ta, Cu, Al, silicide thereof, TiN and TaN. The conductive contact plug 75 includes one or more layers of Co, Ni, W, Ti, Ta, Cu, Al, TiN and TaN.

In some embodiments, a region at the bottom 904 of the source/drain space 21 that includes a portion of the first insulating layer 30, a portion of the dielectric layer 804, and the void 808 is an isolation region, e.g., an electrical isolation region 150, that prevents current leakage between the source/drain epitaxial layer 820 and the base portion 11 of the fin structures and between the source/drain epitaxial layer 820 and the substrate 10. In some embodiments, the electrical isolation region 150 provides a current barrier. In some embodiments, the electrical isolation region 150 provides a voltage barrier.

Figure 9A:
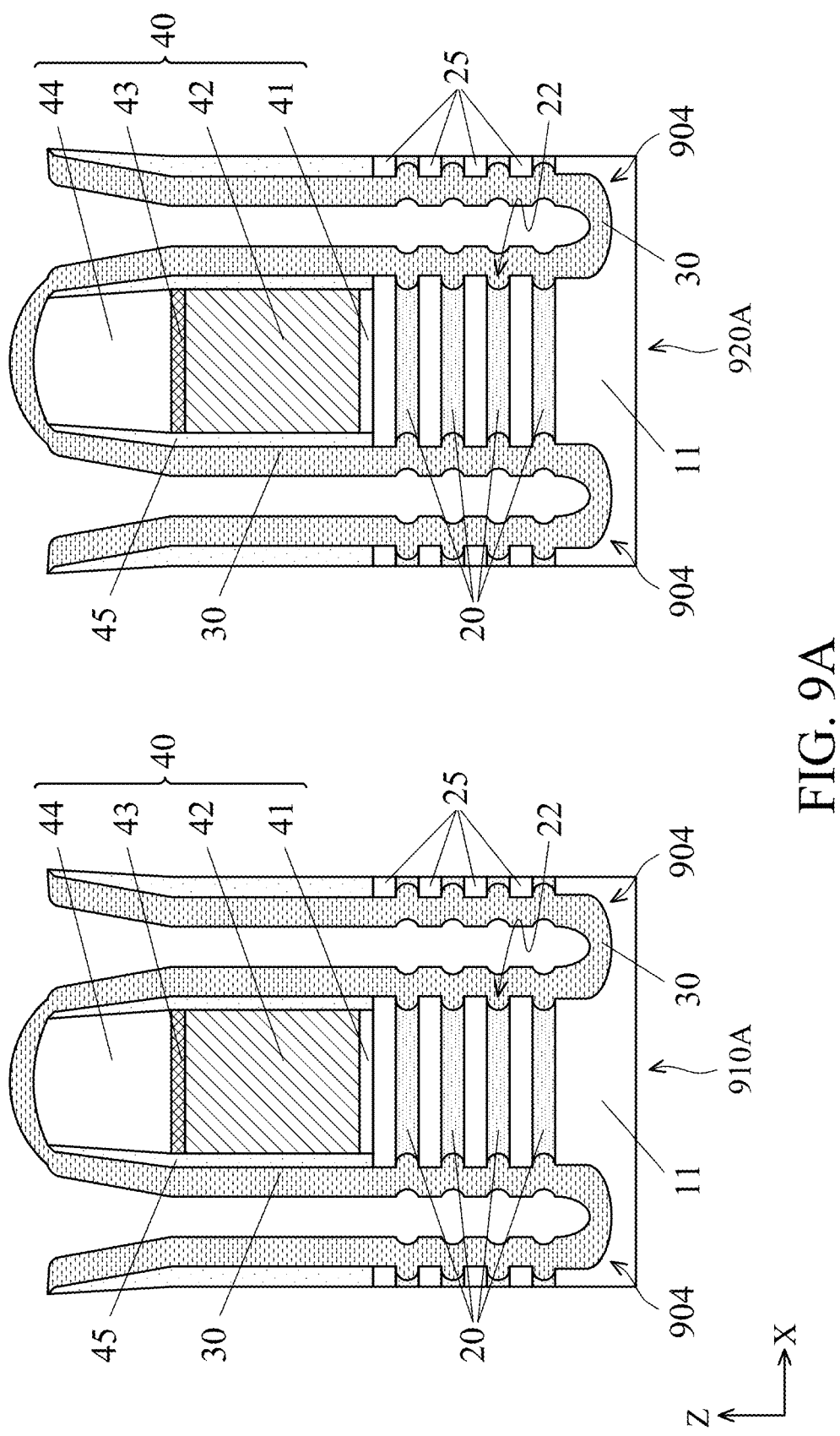
FIGS. 9A, 9B, 9C, 9D, 9E, 9F, 9G, and 9H show various stages of manufacturing semiconductor GAA FET devices according to an embodiment of the present disclosure.

FIGS. 9A, 9B, 9C, 9D, 9E, 9F, 9G, and 9H show various stages of manufacturing semiconductor GAA FET devices according to an embodiment of the present disclosure. It is understood that additional operations can be provided before, during, and after processes shown by FIGS. 9A to 9H, and some of the operations described below can be replaced or eliminated, for additional embodiments of the method. The order of the operations/processes may be interchangeable. Material, configuration, dimensions and/or processes the same as or similar to the foregoing embodiments may be employed in the embodiment of FIGS. 9A-9H, and detailed explanation thereof may be omitted. In FIG. 9A, the semiconductor device structures 910A and 920A are the same semiconductor device structures 810A and 810B of FIG. 8A described above.

Figure 9B:
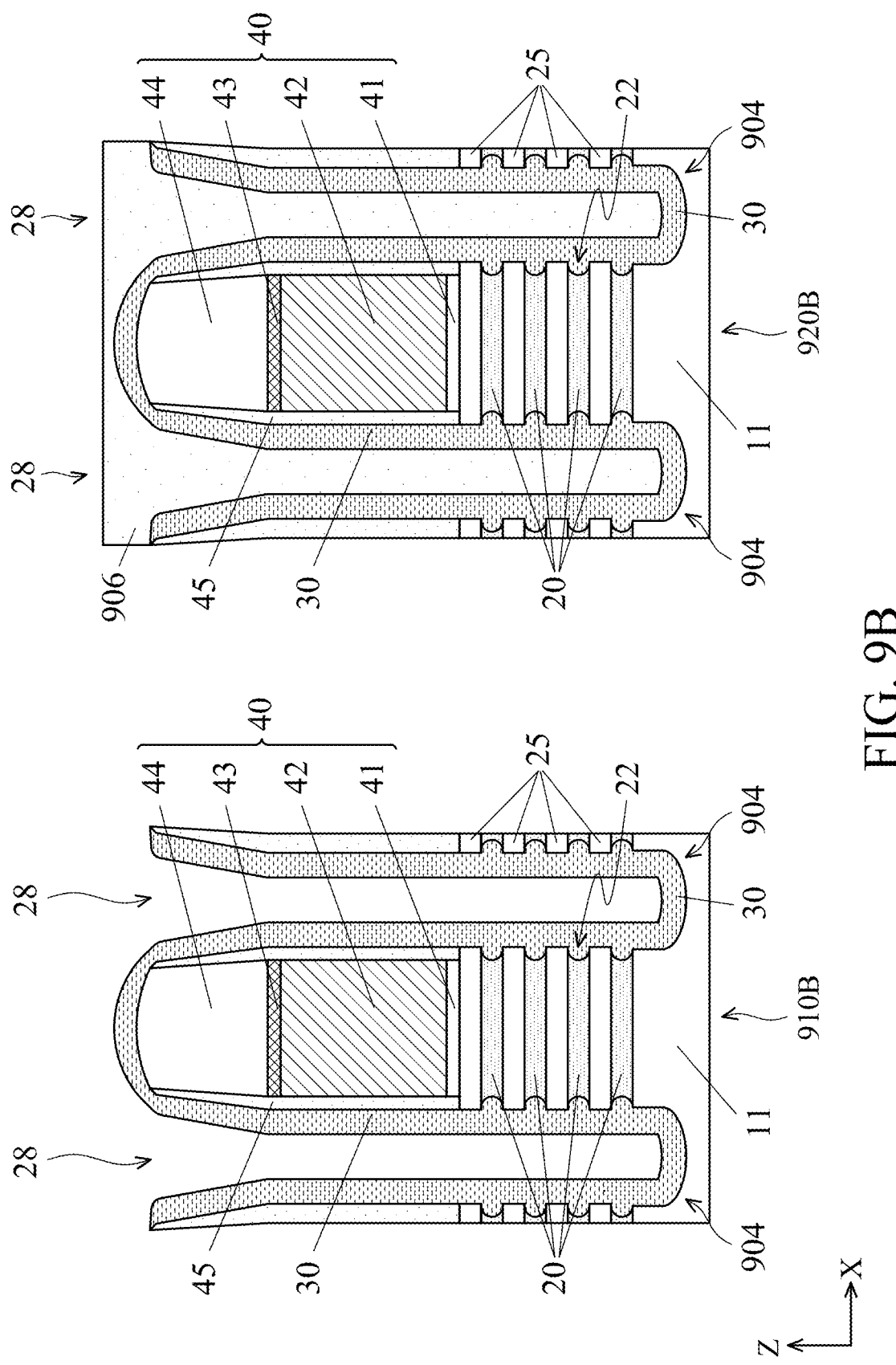
Figure 9C:
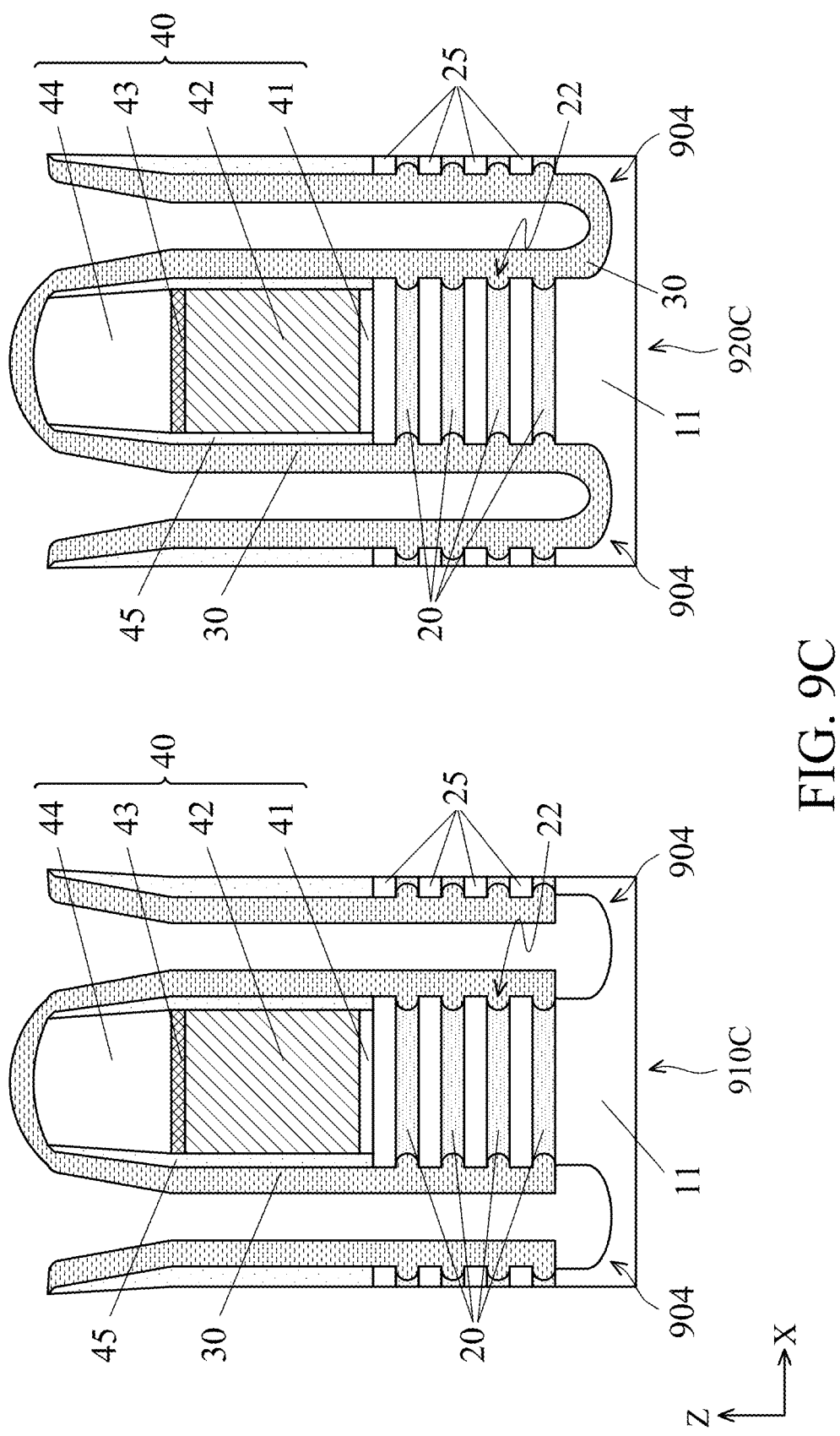

FIG. 9B shows semiconductor device structures 910B and 920B. The semiconductor device structure 910B is consistent with the semiconductor device structure 910A. However, the semiconductor device structure 920B is produced when a photo resist layer 906 is disposed and developed over the source/drain region 28 of the semiconductor device structure 920A and fully fill the source/drain space 21, cover over the source/drain space 21, and cover over the sacrificial gate structure 40. FIG. 9C shows semiconductor device structures 910C and 920C after dry etching the semiconductor device structures 910B and 920B. In the semiconductor device structure 910C the first insulating layer 30 on the bottom 904 of the source/drain space 21 is removed by the dry etching. The photo resist layer 906 prevents the etching of the semiconductor device structure 920B. In addition, after the etching the photo resist layer 906 is removed. Thus, the semiconductor device structure 920C remains consistent with the semiconductor device structure 920A. In some embodiments, the photo resist layer 906 is disposed by a photo lithography process that patterns the substrate.

Figure 9D:
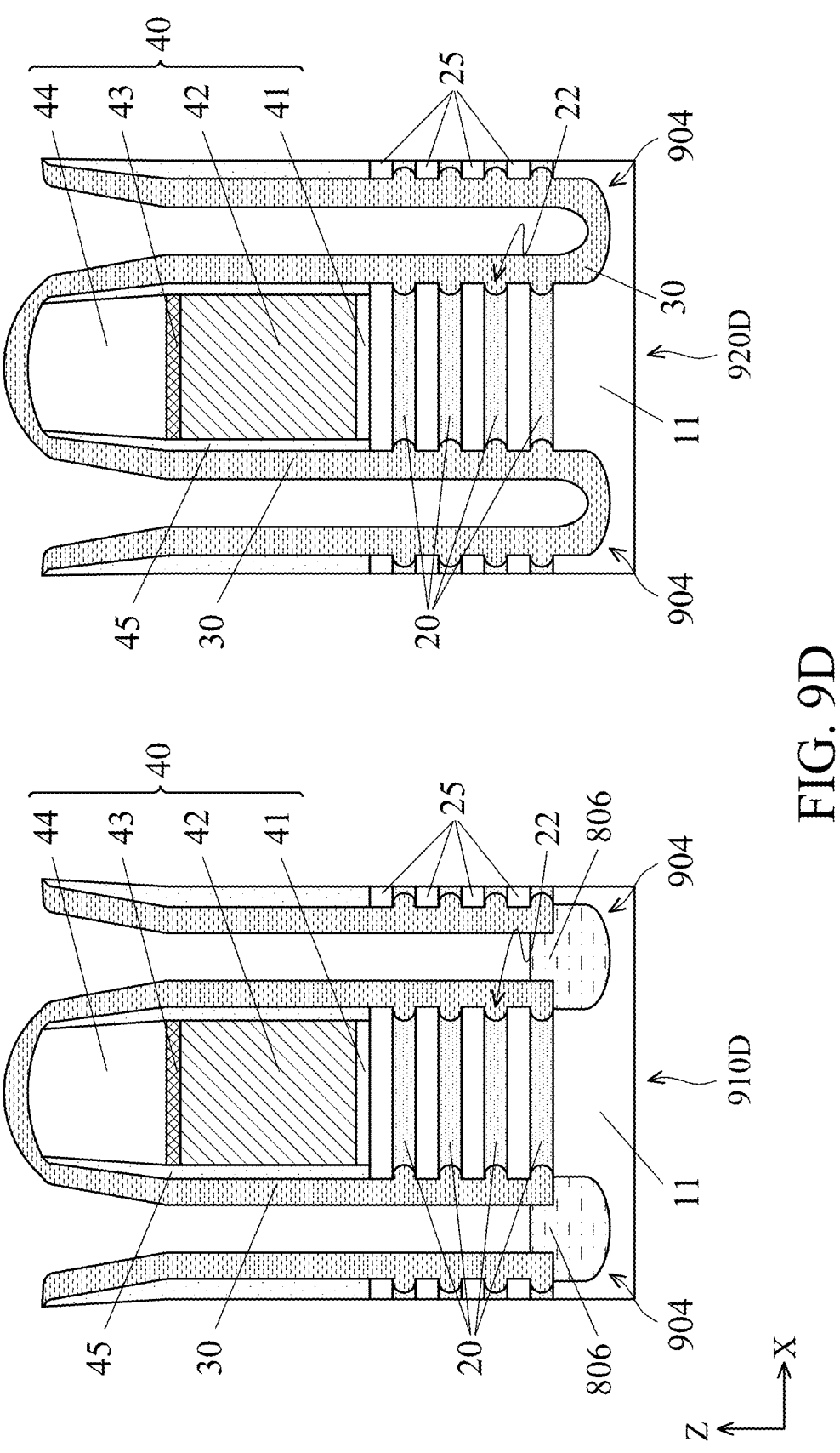

FIG. 9D shows semiconductor device structures 910D and 920D. An undoped epitaxial layer 806, e.g., undoped Si or undoped SiGe, is disposed at the bottom 904 of the source/drain space 21 of the semiconductor device structure 910C to produce the semiconductor device structure 910D. In some embodiments, a protective layer (e.g., SiN) covers the semiconductor device structure 920C during the undoped epitaxial deposition and then is removed. Thus, the semiconductor device structure 920D is consistent with the semiconductor device structure 920A.

Figure 9E:
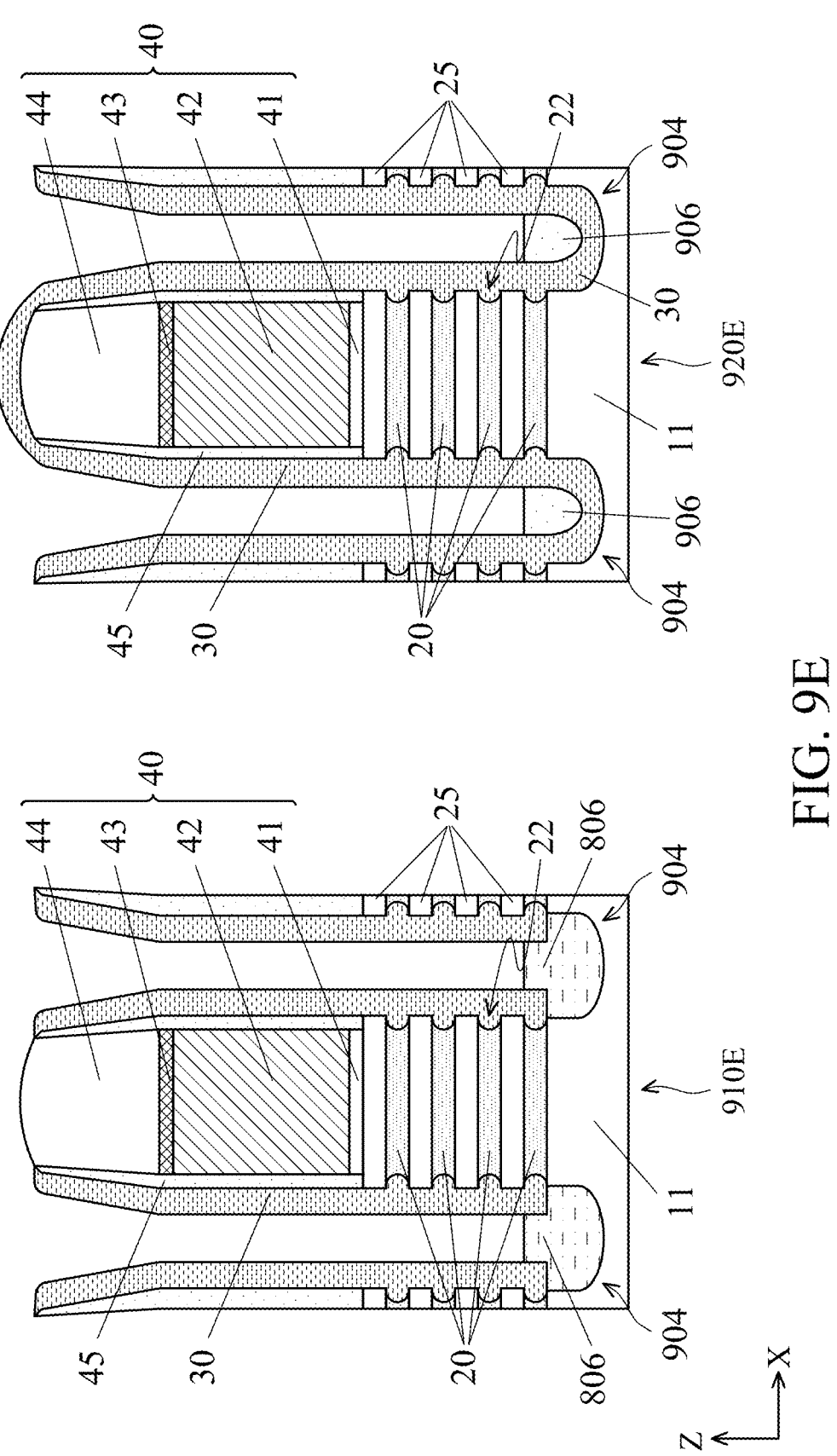

FIG. 9E shows semiconductor device structures 910E and 920E. The semiconductor device structure 910E is consistent with the semiconductor device structure 910D where the bottom 904 of the source/drain space 21 of the semiconductor device structure 910E includes the undoped epitaxial layer 806 up to a level of about the lowest first semiconductor layer 20. As shown, the semiconductor device structure 920E has the photo resist layer 906 up to a level of about the lowest first semiconductor layer 20 at the bottom 904 of the source/drain space 21. In some embodiments, the photo resist layer 906 of the semiconductor device structure 920E is disposed by patterning the substrate using the photo lithography process before the undoped epitaxial layer 806 is disposed in the source/drain space 21 of the semiconductor device structure 910E. In some embodiments, the photo resist layer 906 of the semiconductor device structure 920E is a remaining portion of the resist layer 906 on the semiconductor device structure 920B. In some embodiments, a dielectric material different from the first insulating layer 30 is used as the layer 906 instead of a photo resist.

Figure 9F:
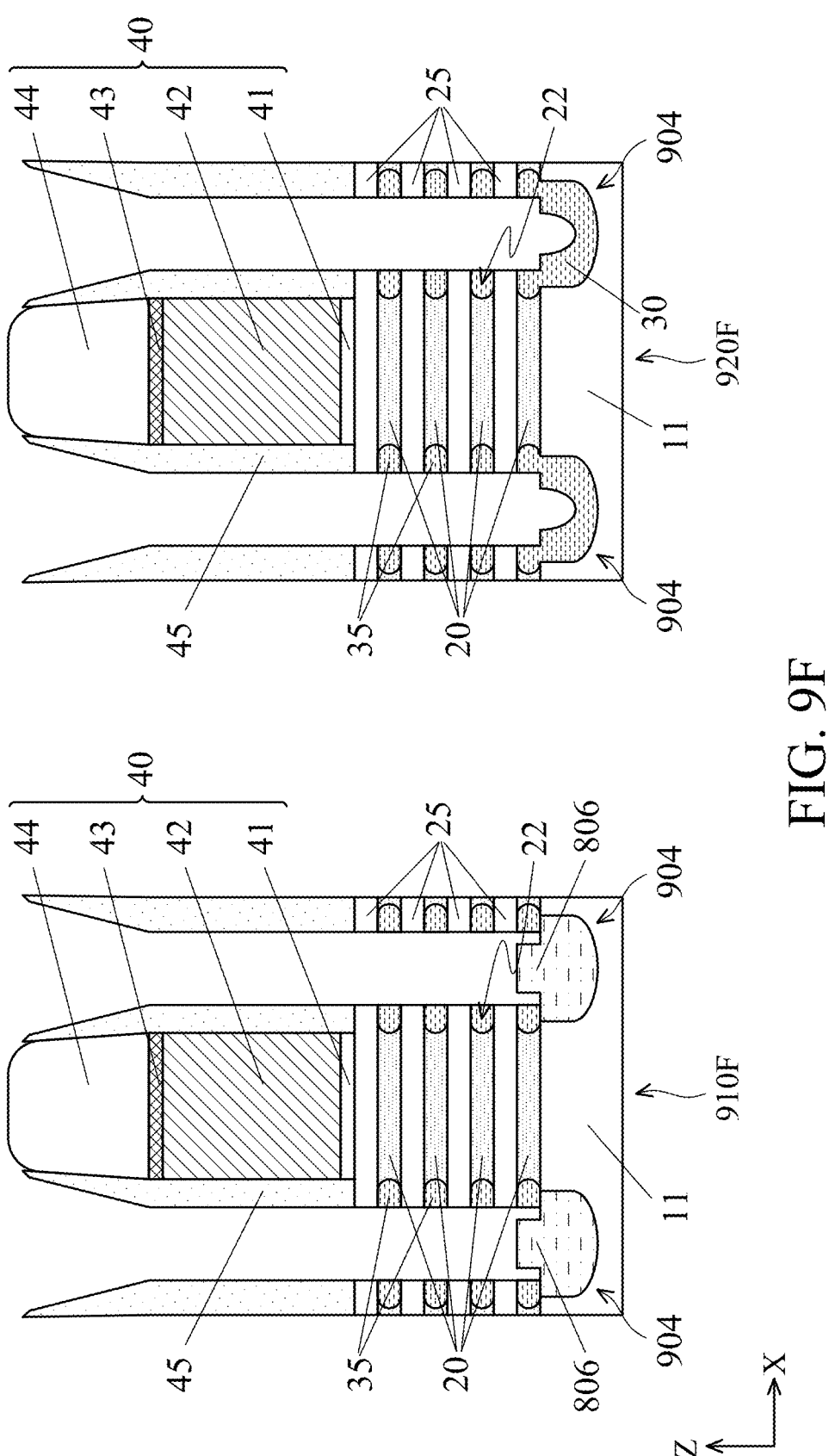

FIG. 9F shows semiconductor device structures 910F and 920F. One or more etching operations, e.g., directional etching operations, are performed to remove the first insulating layer 30 from walls of the source/drain space 21 of the semiconductor device structures 910E and 920E, thereby forming inner spacers 35, as shown in the semiconductor device structures 910F and 920F. The remaining portion of the resist layer 906 at the bottom 904 of the source/drain space 21 prevents the first insulating layer 30 at the bottom 904 of the source/drain space 21 of the semiconductor device structure 920F to be etched. The directional etching also removes the first insulating layer 30 from over the sacrificial gate structure 40 of the semiconductor device structures 920E and 920F. Next, the remaining portion of the resist layer 906 at the bottom 904 of the source/drain space 21 of the semiconductor device structure 920E is removed.

Figure 9G:
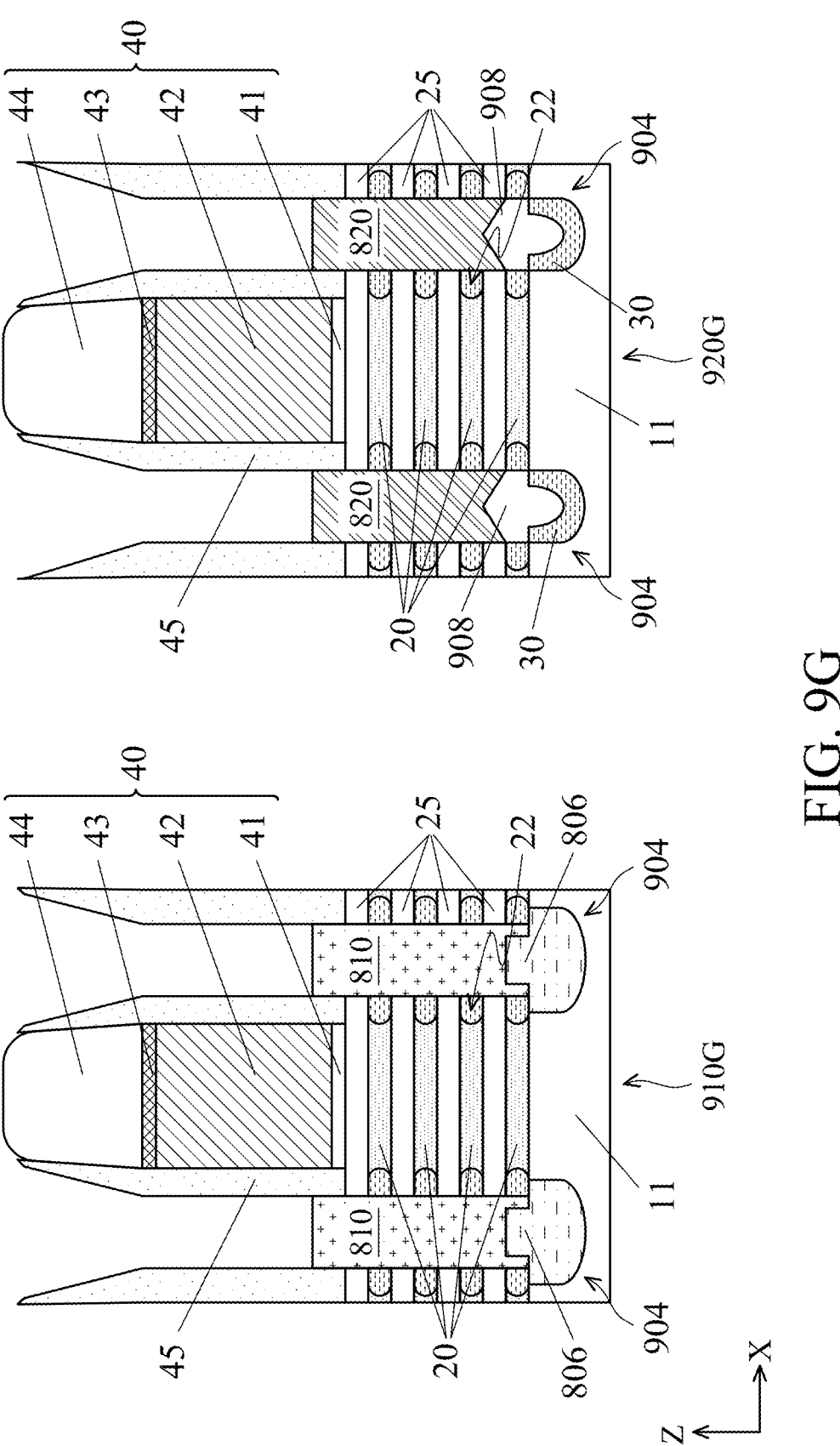

FIG. 9G shows a semiconductor device structure 910G after a doped epitaxial layer 810 is grown over the undoped epitaxial layer 806 at the bottom 904 of the source/drain space 21 of the semiconductor device structure 910G. Next, an interlayer dielectric (ILD) layer 70 is formed over the epitaxial layer 810, the sacrificial gate structure 40, and the sidewall spacers 45. FIG. 9G also shows a semiconductor device structure 920G after doped epitaxial layers 820 is grown above the first insulating layer 30 at the bottom 904 of the source/drain space 21 of the semiconductor device structure 920G. Next, the ILD layer 70 is formed over the epitaxial layer 820, the sacrificial gate structure 40, and the sidewall spacers 45. As shown, the doped epitaxial layer 810 grows over and attaches to the undoped epitaxial layer 806.

As shown, the doped epitaxial layers 820 of the semiconductor device structure 920G does not grow over and does not attach to the first insulating layer 30 and, thus, a void 908 is produced between the doped epitaxial layers 820 and the first insulating layer 30. The void 908 has a width as large as the width of the source/drain space 21, e.g., between 5 nm to 15 nm, a height between about 1 nm and 5 nm, and may have cross sectional shape of a rectangle, a trapezoid, or a triangle, and may act as a physical barrier, e.g., an electrical isolation/barrier, to prevent a current from source/drain region 28 to get to the base portion 11 of the fin structures or to the substrate 10. The type of the dopant of the doped epitaxial layers 810 and 820 are consistent with the type of the semiconductor device structures 910G and 920G.

Figure 9H:
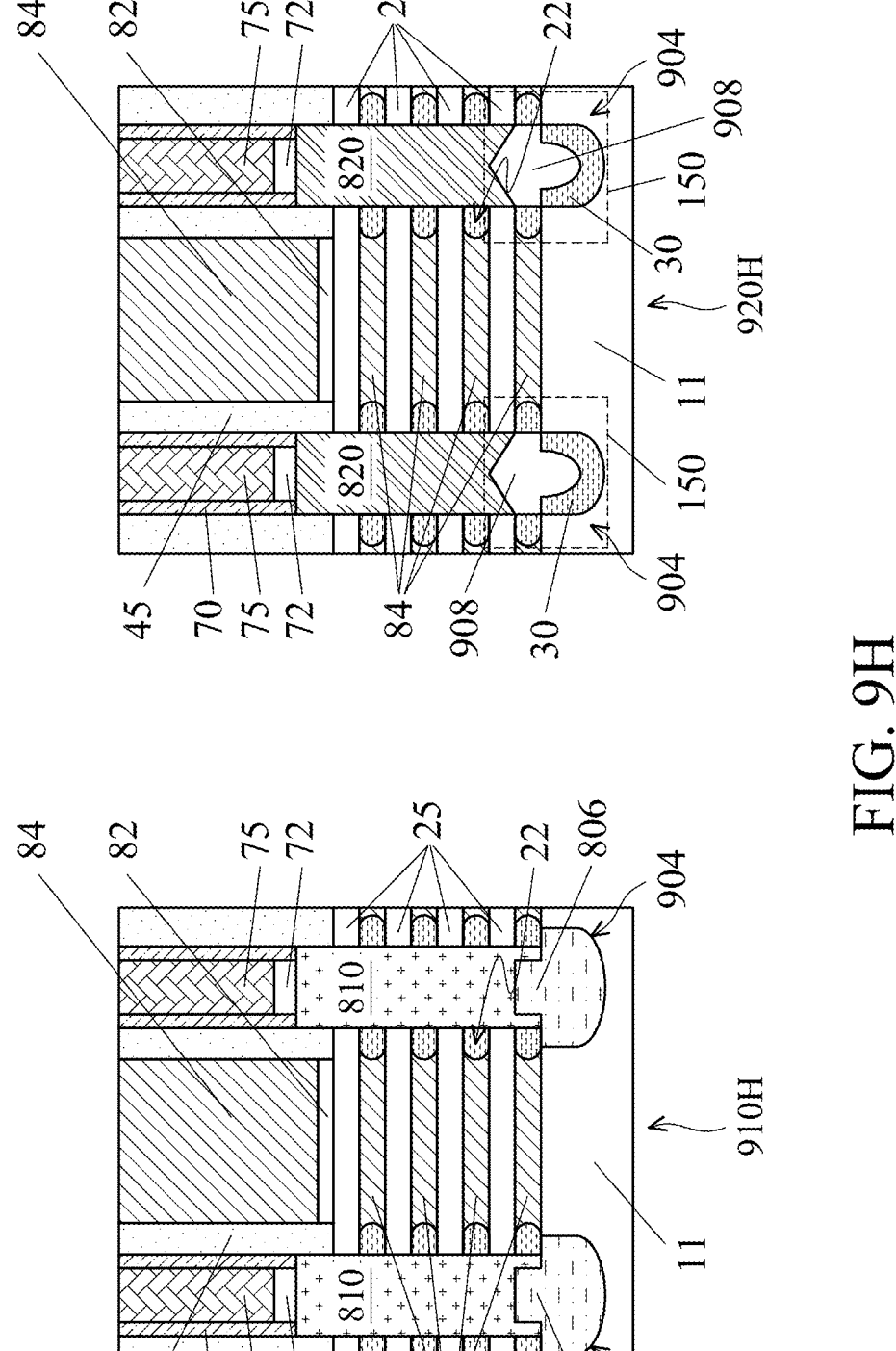

FIG. 9H shows the semiconductor device structures 910H and 920H. After the ILD layer 70 is formed over the semiconductor device structures 910G and 920G, a planarization operation, such as CMP, is performed, so that the top portion of the sacrificial gate electrode layer 42 is exposed. Then the sacrificial gate electrode layer 42 and sacrificial gate dielectric layer 41 are removed. The ILD layer 70 protects the doped source/drain epitaxial layer 810 and 820 during the removal of the sacrificial gate structures 40. The sacrificial gate structures 40 can be removed using plasma dry etching and/or wet etching. When the sacrificial gate electrode layer 42 is polysilicon and the ILD layer 70 is silicon oxide, a wet etchant such as a TMAH solution can be used to selectively remove the sacrificial gate electrode layer 42. The sacrificial gate dielectric layer 41 is thereafter removed using plasma dry etching and/or wet etching.

After the sacrificial gate structures are removed, the first semiconductor layers 20 are removed, thereby forming wires or sheets (channel regions) of the second semiconductor layers 25, as shown in FIG. 9H. The first semiconductor layers 20 can be removed/etched using an etchant that can selectively etch the first semiconductor layers 20 against the second semiconductor layers 25. In some embodiments, the etched sacrificial gate dielectric layer 41 and the etched sacrificial gate electrode layer 42 are replaced with the gate dielectric layer 82 and the gate electrode layer 84 that are respectively disposed. In some embodiments, the gate electrode layer 84 is disposed in the location of the first semiconductor layers 20 that is sandwiched between two layer of the gate dielectric layer 82 (shown in FIG. 1A).

After the metal gate structure is formed, the ILD layer 70 is patterned and a conductive contact layer 72 is formed over the doped epitaxial layers 810 and 820 and a conductive contact plug 75 is formed on the conductive contact layer 72. In some embodiments, the conductive contact layer 72 includes one or more of Co, Ni, W, Ti, Ta, Cu, Al, silicide thereof, TiN and TaN. The conductive contact plug 75 includes one or more layers of Co, Ni, W, Ti, Ta, Cu, Al, TiN and TaN.

In some embodiments, a region at the bottom 904 of the source/drain space 21 that includes a portion of the first insulating layer 30 and the void 908 is the isolation region, e.g., the electrical isolation region 150, that prevents current leakage between the source/drain epitaxial layer 820 and the base portion 11 of the fin structures and between the source/drain epitaxial layer 820 and the substrate 10. In some embodiments, the electrical isolation region 150 causes voltage and/or current isolation. As shown in FIG. 9H, the void 908 extends over the first insulating layer 30 and extends up to the source/drain epitaxial layer 820 and for the same source/drain space 21 may have a larger volume compared to the void 808 of FIG. 8H.

Figure 10A:
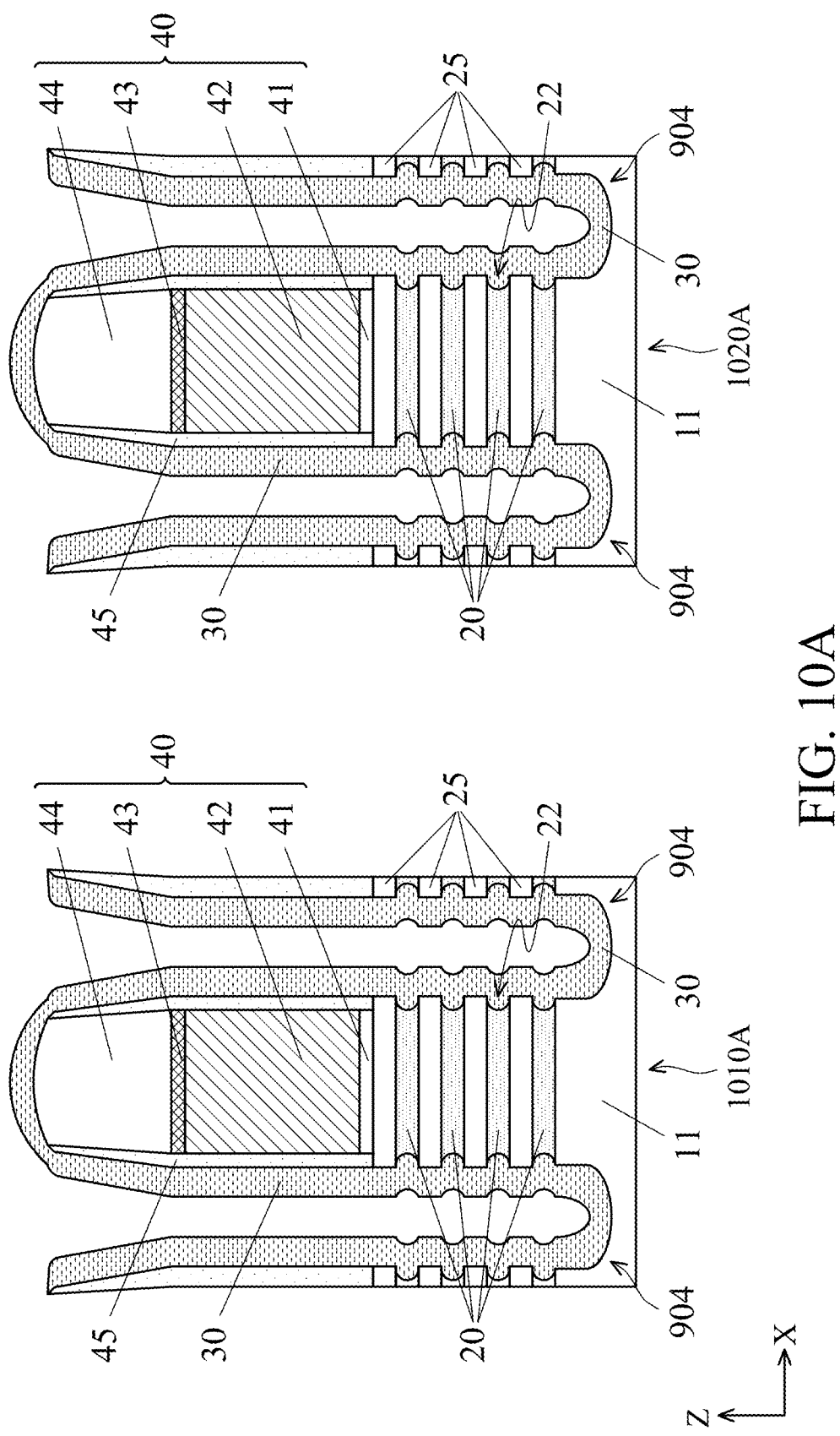
FIGS. 10A, 10B, 10C, 10D, 10E, and 10F show various stages of manufacturing semiconductor GAA FET devices according to an embodiment of the present disclosure.

FIGS. 10A, 10B, 10C, 10D, 10E, and 10F show various stages of manufacturing semiconductor GAA FET devices according to an embodiment of the present disclosure. It is understood that additional operations can be provided before, during, and after processes shown by FIGS. 10A to 10F, and some of the operations described below can be replaced or eliminated, for additional embodiments of the method. The order of the operations/processes may be interchangeable. Material, configuration, dimensions and/or processes the same as or similar to the foregoing embodiments may be employed in the embodiment of FIGS. 10A-10F, and detailed explanation thereof may be omitted. In FIG. 10A, the semiconductor device structures 1010A and 1020A are the same semiconductor device structures 810A and 820A of FIG. 8A described above.

Figure 10B:
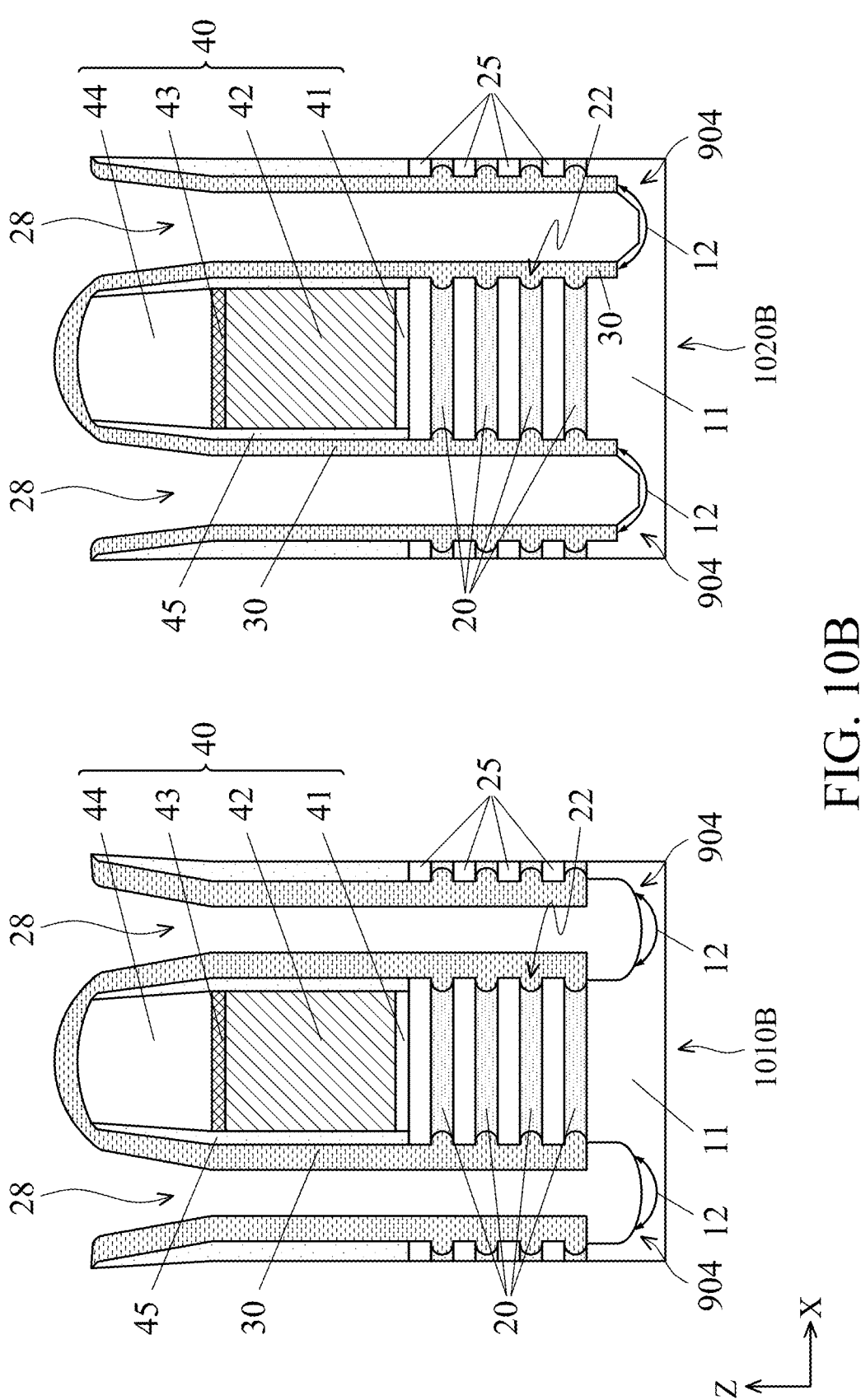

FIG. 10B shows semiconductor device structures 1010B and 1020B after dry etching the semiconductor device structures 1010A and 1020A. In the semiconductor device structure 1020B, only a region 12 at the lowest portion of the bottom 904 of the source/drain space 21 is etched, e.g., using directional and/or anisotropic etching, to remove the first insulating layer 30 at the region 12, however, the walls of the bottom 904 of the source/drain space 21 are not etched. In the semiconductor device structure 1010B, in addition to the region 12 at the lowest portion of the bottom 904 of the source/drain space 21, the walls around the region 12 at the bottom 904 of the source/drain space 21 up to about the level the lowest first semiconductor layer 20 is also etched, e.g., using multiple directional etching, to remove the first insulating layer 30. Thus, the semiconductor device structure 1010B is similar to the semiconductor device structure 910C.

Figure 10C:
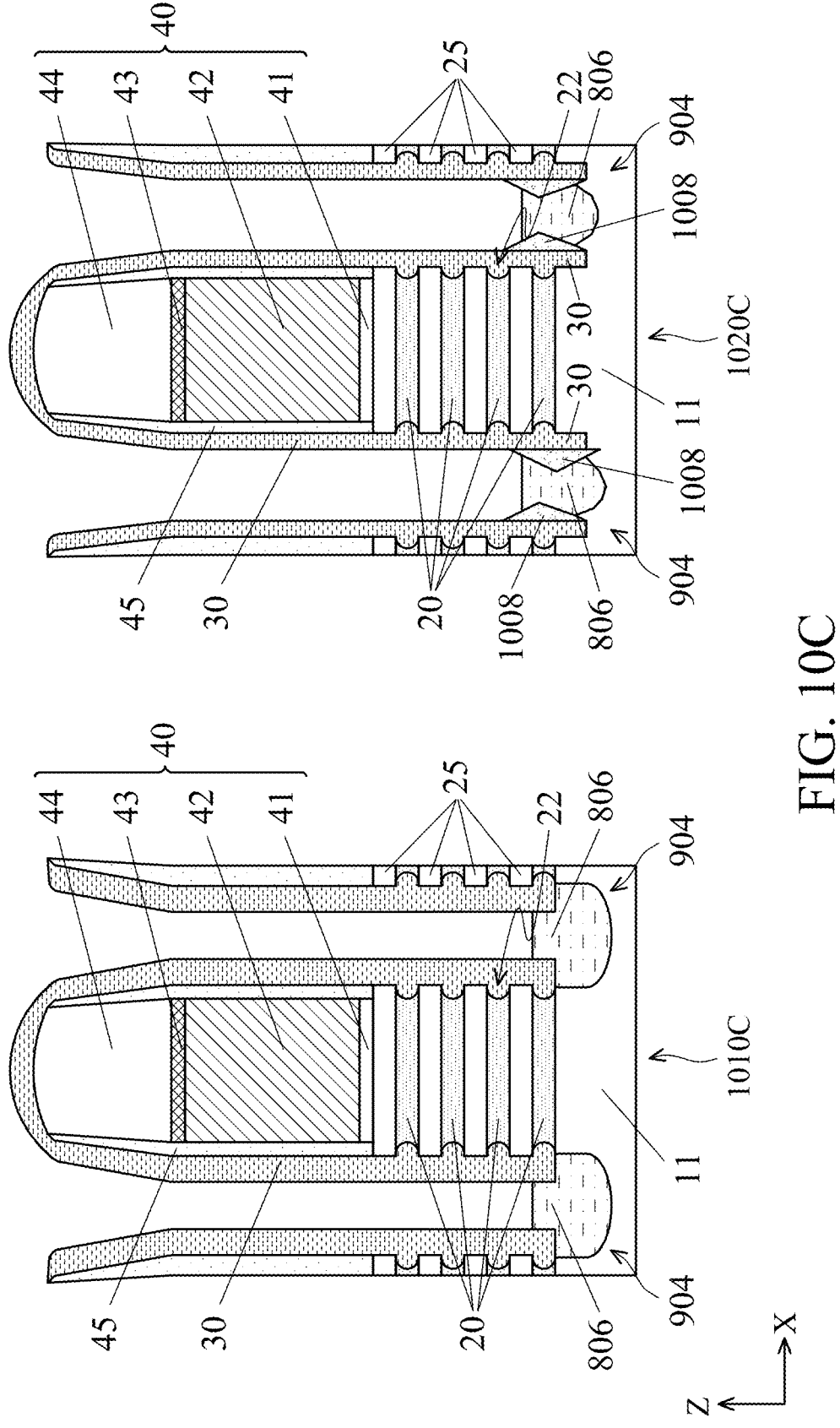

FIG. 10C shows semiconductor device structures 1010C and 1020C after disposing undoped epitaxial layer 806, e.g., undoped Si or undoped SiGe, at the bottom 904 of the source/drain space 21 of the semiconductor device structures 1010B and 1020B. In the semiconductor device structure 1010C, the undoped epitaxial layer 806 attaches to the bottom 904 of the source/drain space 21 and no void is created with the base portion 11 of the fin structures. However, in the semiconductor device structure 1020C, the first insulating layer 30 on the walls prevents the undoped epitaxial layer 806 to attach to the walls and voids 1008 are produced at the bottom 904 of the source/drain space 21 at both sides of the undoped epitaxial layer 806. In some embodiments, the void 1008 has a height of between about 2 nm to 10 nm, has rectangular, triangular, or trapezoidal shape and a maximum width of about 1 nm to 5 nm.

Figure 10D:
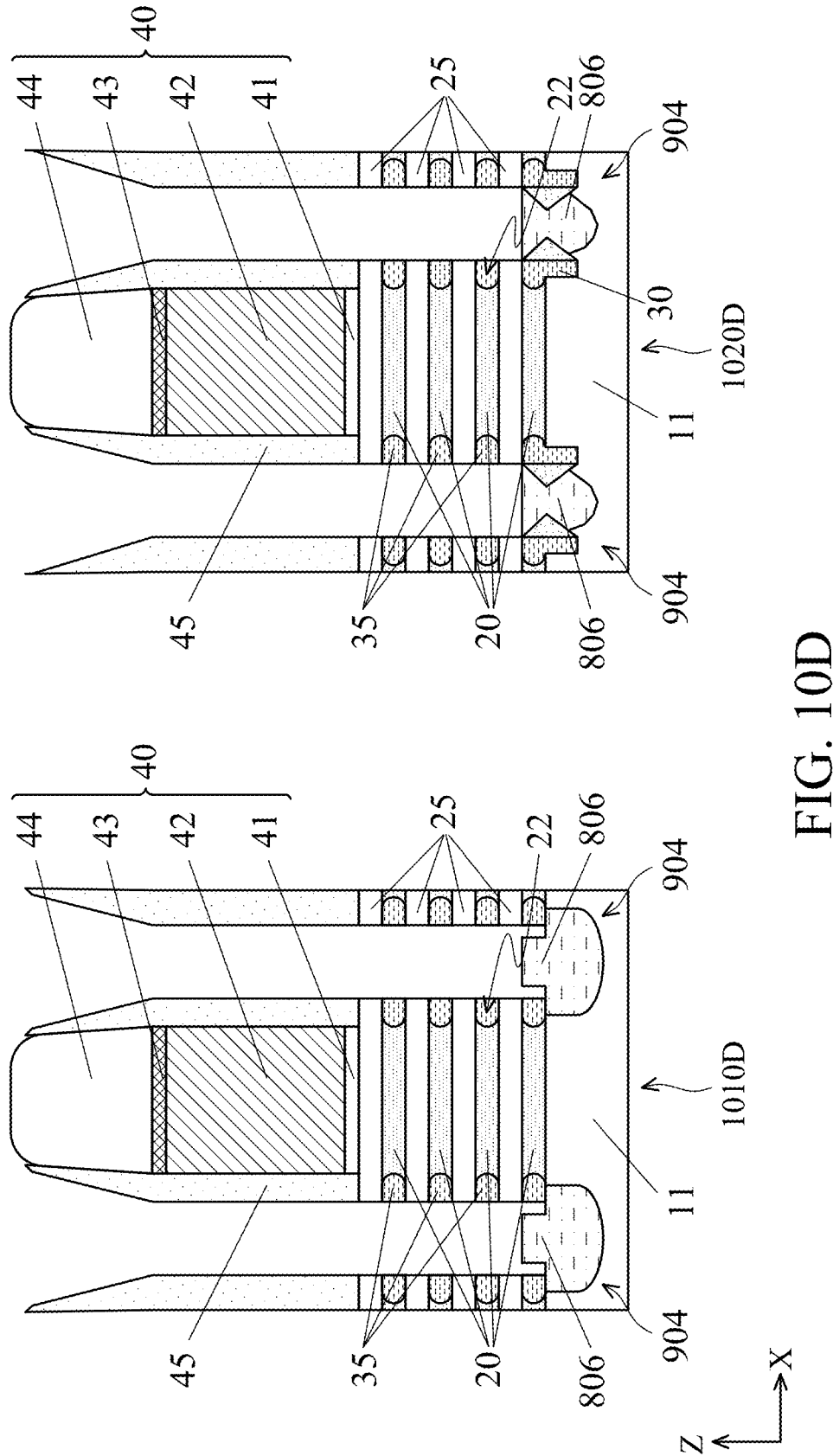

FIG. 10D shows semiconductor device structures 1010D and 1020D that are produced by etching, e.g., one or more directional etching, of the first insulating layer 30 from the walls of the source/drain space 21 above the bottom 904 of the source/drain space 21 of the semiconductor device structures 1010C and 1020C, thereby forming/exposing the inner spacers 35.

Figure 10E:
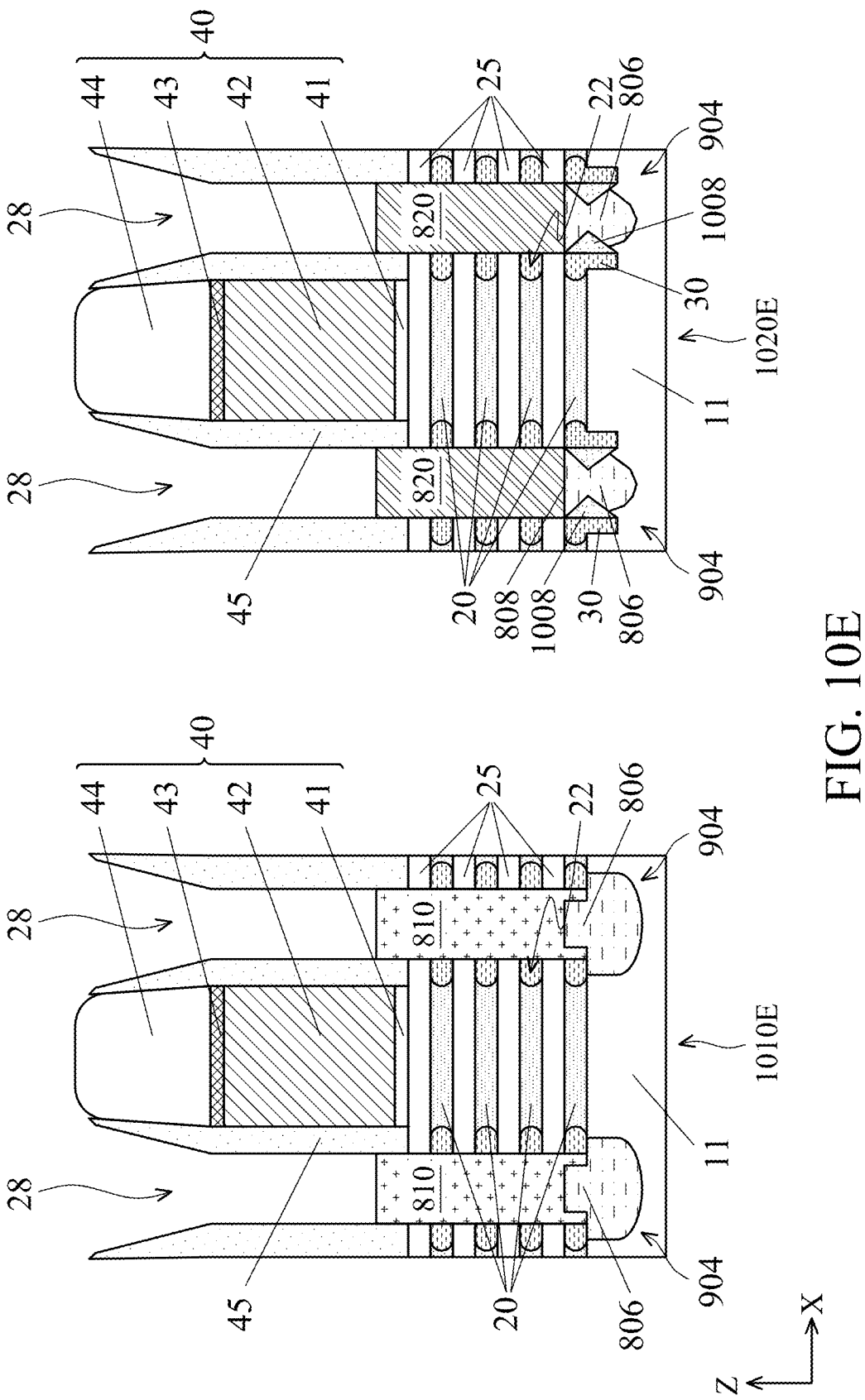

FIG. 10E shows semiconductor device structures 1010E and 1020E. The semiconductor device structure 1010E shows a doped epitaxial layer 810 is grown above the undoped epitaxial layer 806 at the bottom 904 of the source/drain space 21 of the semiconductor device structure 1010D. Next, an interlayer dielectric (ILD) layer 70 is formed over the epitaxial layer 810, the sacrificial gate structure 40, and the sidewall spacers 45. As shown, the doped epitaxial layer 810 grows over and attaches to the undoped epitaxial layer 806.

FIG. 10E also shows a semiconductor device structure 1020E after doped epitaxial layers 820 are grown above the first insulating layer 30 at the bottom 904 of the source/drain space 21 of the semiconductor device structure 1020D. Next, the ILD layer 70 is formed over the epitaxial layer 820, the sacrificial gate structure 40, and the sidewall spacers 45. As shown, the doped epitaxial layers 820 of the semiconductor device structure 1020E does not attach to the first insulating layer 30 and, thus, the void 1008 extends to the top of the first insulating layer 30. The voids 1008 may act as a physical barrier, e.g., an electrical isolation/barrier, to prevent a current from source/drain region 28 to get to the base portion 11 of the fin structures or to the substrate 10. The type of the dopant of the doped epitaxial layers 810 and 820 are consistent with the type of the semiconductor device structures 1010E and 1020E.

Figure 10F:
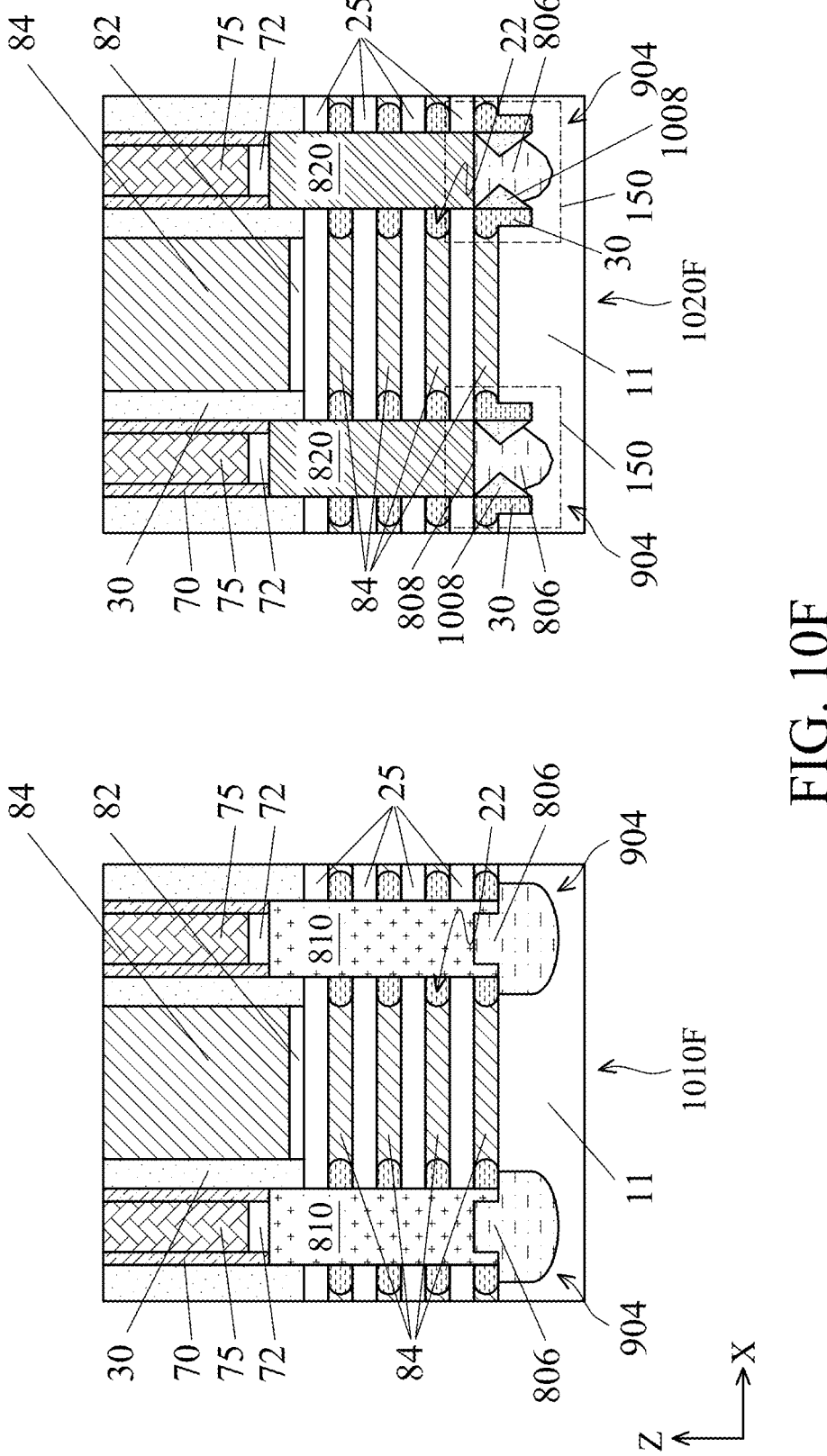

FIG. 10F shows the semiconductor device structures 1010F and 1020F. After the ILD layer 70 is formed over the semiconductor device structures 1010E and 1020E and a planarization operation is performed and the sacrificial gate structures 40 is removed as described above.

After the sacrificial gate structures are removed, the first semiconductor layers 20 are removed, thereby forming wires or sheets (channel regions) of the second semiconductor layers 25, as shown in FIG. 10F. The first semiconductor layers 20 can be removed/etched as described above and the etched sacrificial gate dielectric layer 41 and the etched sacrificial gate electrode layer 42 are replaced with the gate dielectric layer 82 and the gate electrode layer 84 that are respectively disposed. In some embodiments, the gate electrode layer 84 is disposed in the location of the first semiconductor layers 20 that is sandwiched between two layer of the gate dielectric layer 82 (shown in FIG. 1A).

After the metal gate structure is formed, the ILD layer 70 is patterned and a conductive contact layer 72 is formed over the doped epitaxial layers 810 and 820 and a conductive contact plug 75 is formed on the conductive contact layer 72. In some embodiments, the conductive contact layer 72 includes one or more of Co, Ni, W, Ti, Ta, Cu, Al, silicide thereof, TiN and TaN. The conductive contact plug 75 includes one or more layers of Co, Ni, W, Ti, Ta, Cu, Al, TiN and TaN.

In some embodiments, a region at the bottom 904 of the source/drain space 21 that includes a portion of the first insulating layer 30, the undoped epitaxial layer 806, and the voids 1008 at both sides of the undoped epitaxial layer 806, is the isolation region, e.g., the electrical isolation region 150, that prevents current leakage between the source/drain epitaxial layer 820 and the base portion 11 of the fin structures and between the source/drain epitaxial layer 820 and the substrate 10. In some embodiments, the electrical isolation region 150 causes voltage and/or current isolation.

Figure 11A:
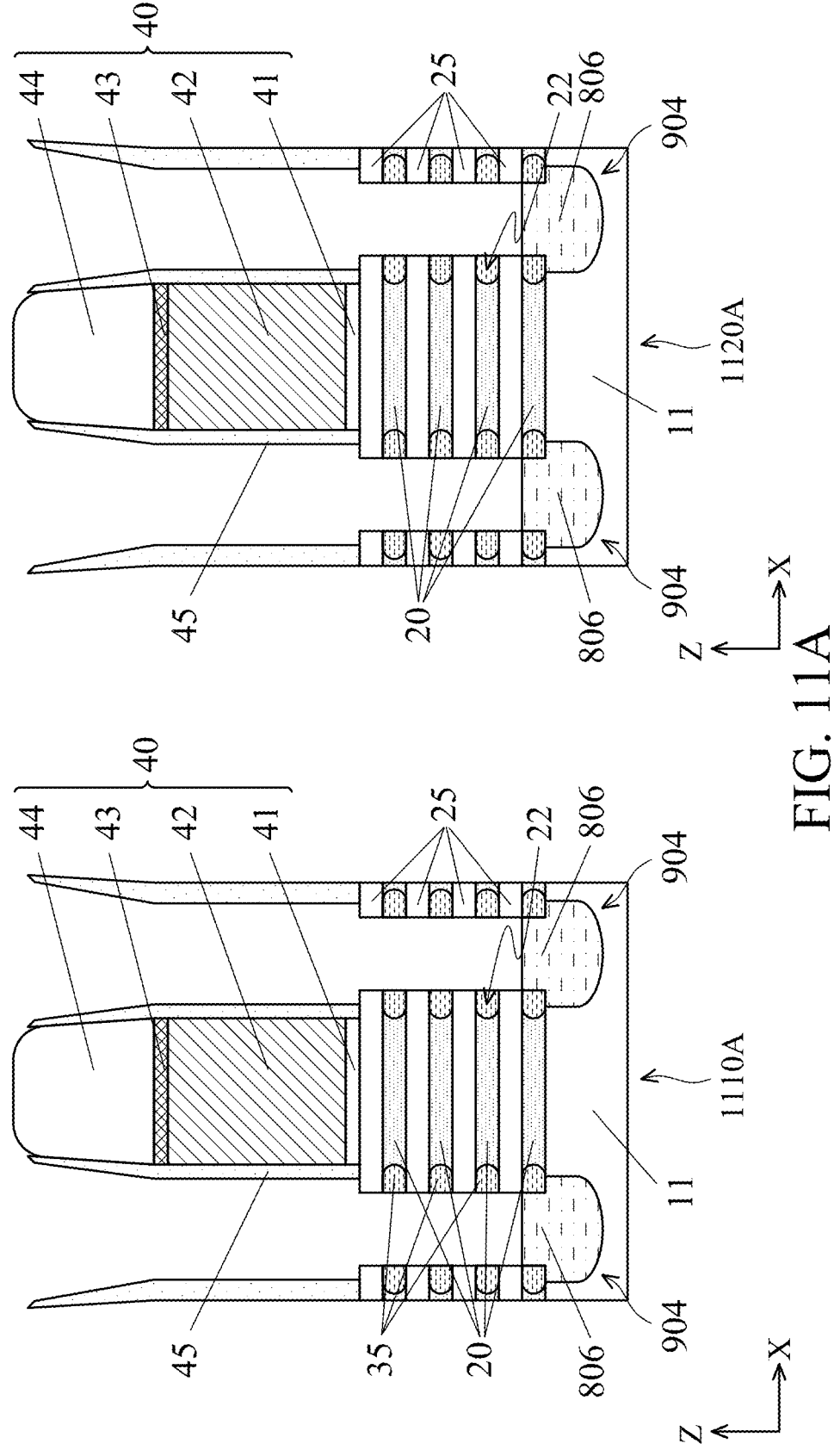
FIGS. 11A, 11B, 11C, 11D, 11E, 11F, 11G, 11H, and 11I show various stages of manufacturing semiconductor GAA FET devices according to an embodiment of the present disclosure.
Figure 11B:
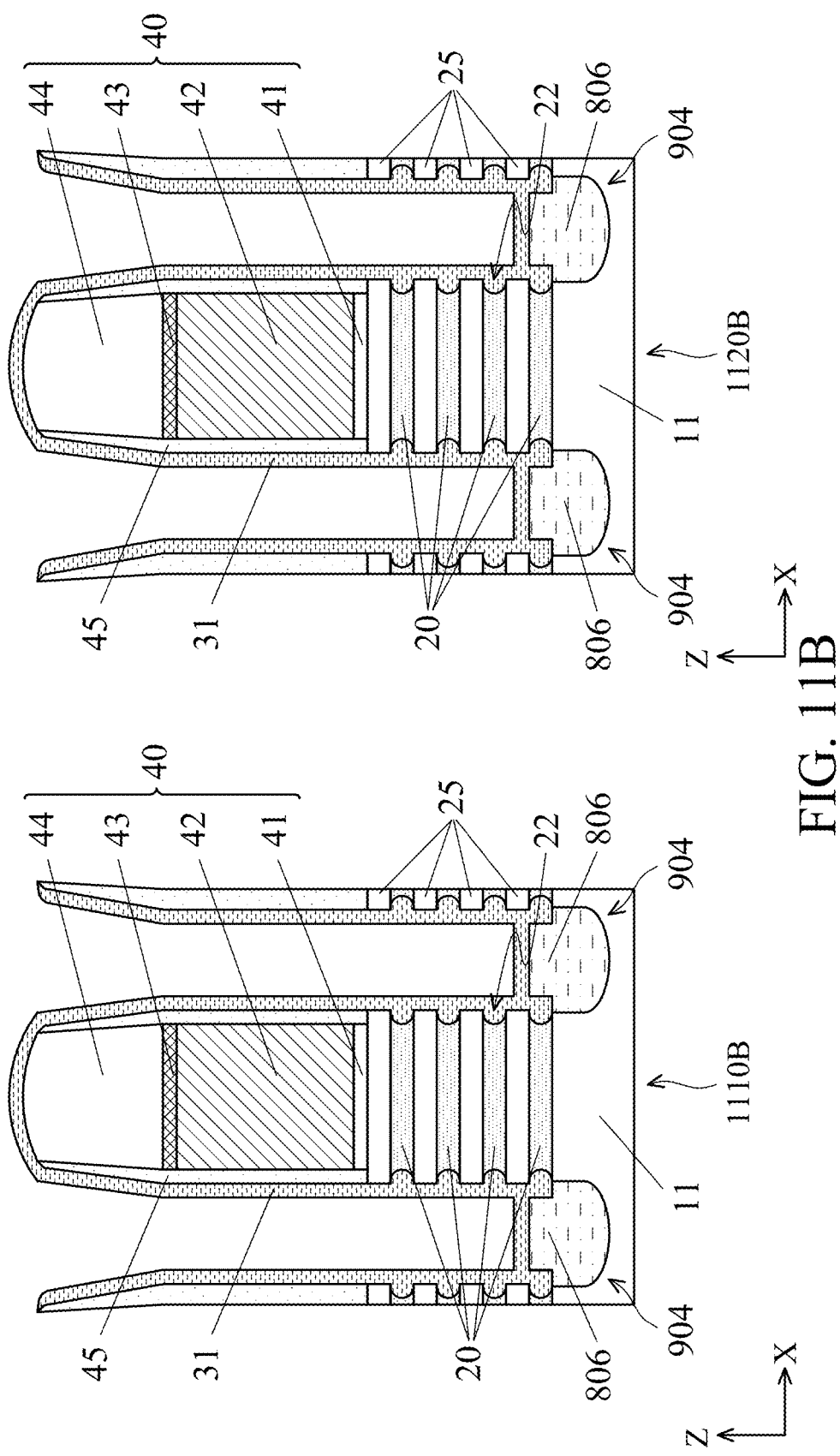

FIGS. 11A, 11B, 11C, 11D, 11E, 11F, 11G, 11H, and 11I show various stages of manufacturing semiconductor GAA FET devices according to an embodiment of the present disclosure. It is understood that additional operations can be provided before, during, and after processes shown by FIGS. 11A to 11I, and some of the operations described below can be replaced or eliminated, for additional embodiments of the method. The order of the operations/processes may be interchangeable. Material, configuration, dimensions and/or processes the same as or similar to the foregoing embodiments may be employed in the embodiment of FIGS. 11A-11I, and detailed explanation thereof may be omitted. In FIG. 11A, semiconductor device structures 1110A and 1120A are both consistent with the semiconductor device structure 810F of FIG. 8F. As shown in FIG. 11B, a second insulating layer 31 is disposed above the undoped epitaxial layer 806 and on the walls of the source/drain space 21. The insulating layer 31 may not attach to the undoped epitaxial layer 806 and a void (not shown) may be created between the undoped epitaxial layer 806 and the second insulating layer 31.

Figure 11C:
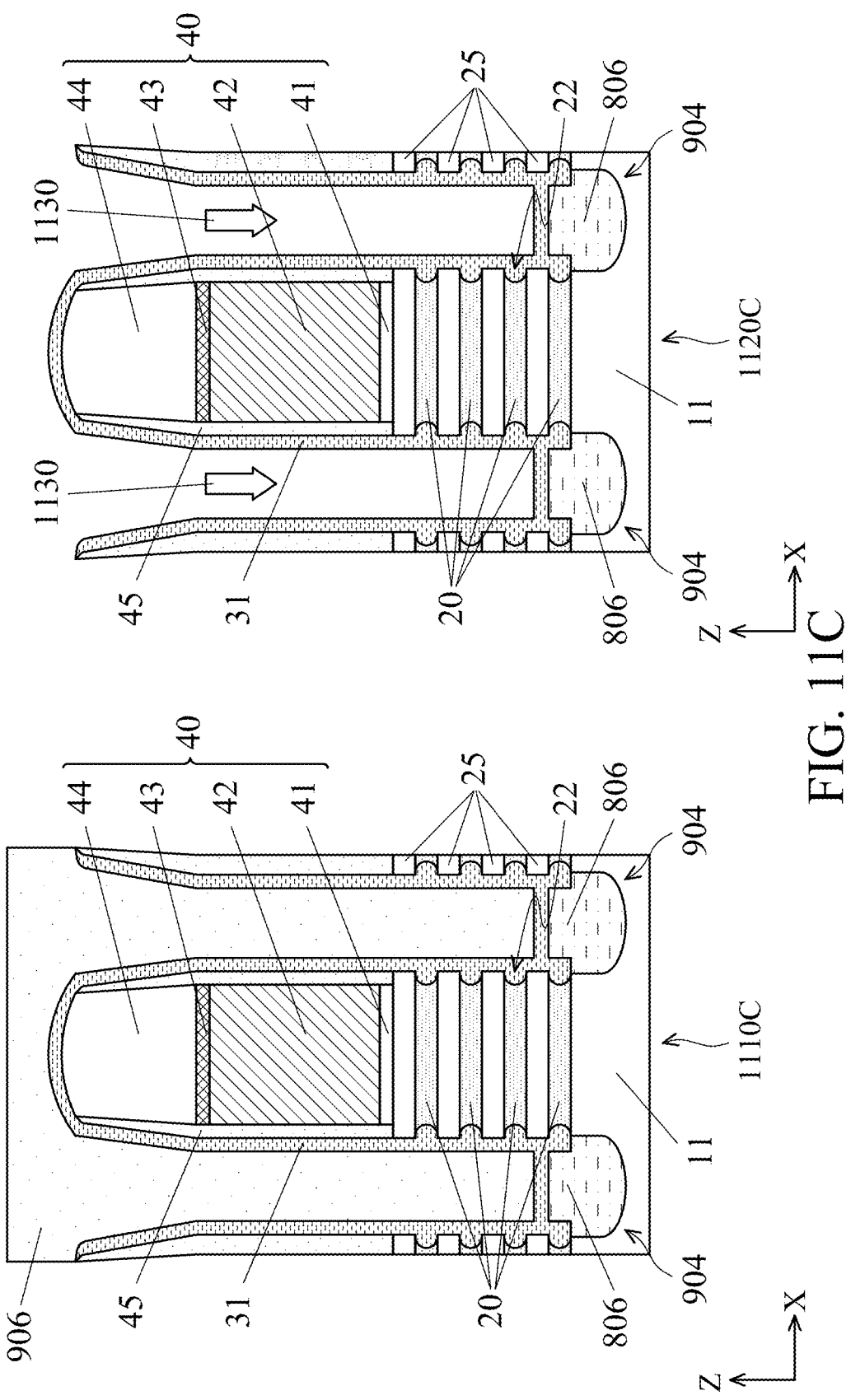

As shown in FIG. 11C, the photo resist layer 906 is disposed and developed over the semiconductor device structure 1110C and covers, e.g., masks, the semiconductor device structure 1110C. With the photo resist layer 906 masking the semiconductor device structure 1110C, the second insulating layer 31 over the undoped epitaxial layer 806 at the bottom 904 of the source/drain space 21 of the semiconductor device structure 1120C is ion implanted using an ion beam 1130. In some embodiments, the ion beam 1130 bombards the second insulating layer 31 over the undoped epitaxial layer 806 at the bottom 904 of the source/drain space 21 of the semiconductor device structure 1120C with nitrogen or an inert gas, e.g., argon. The ion implantation produces a gas implanted insulating layer 32 (see FIG. 11D).

Figure 11D:
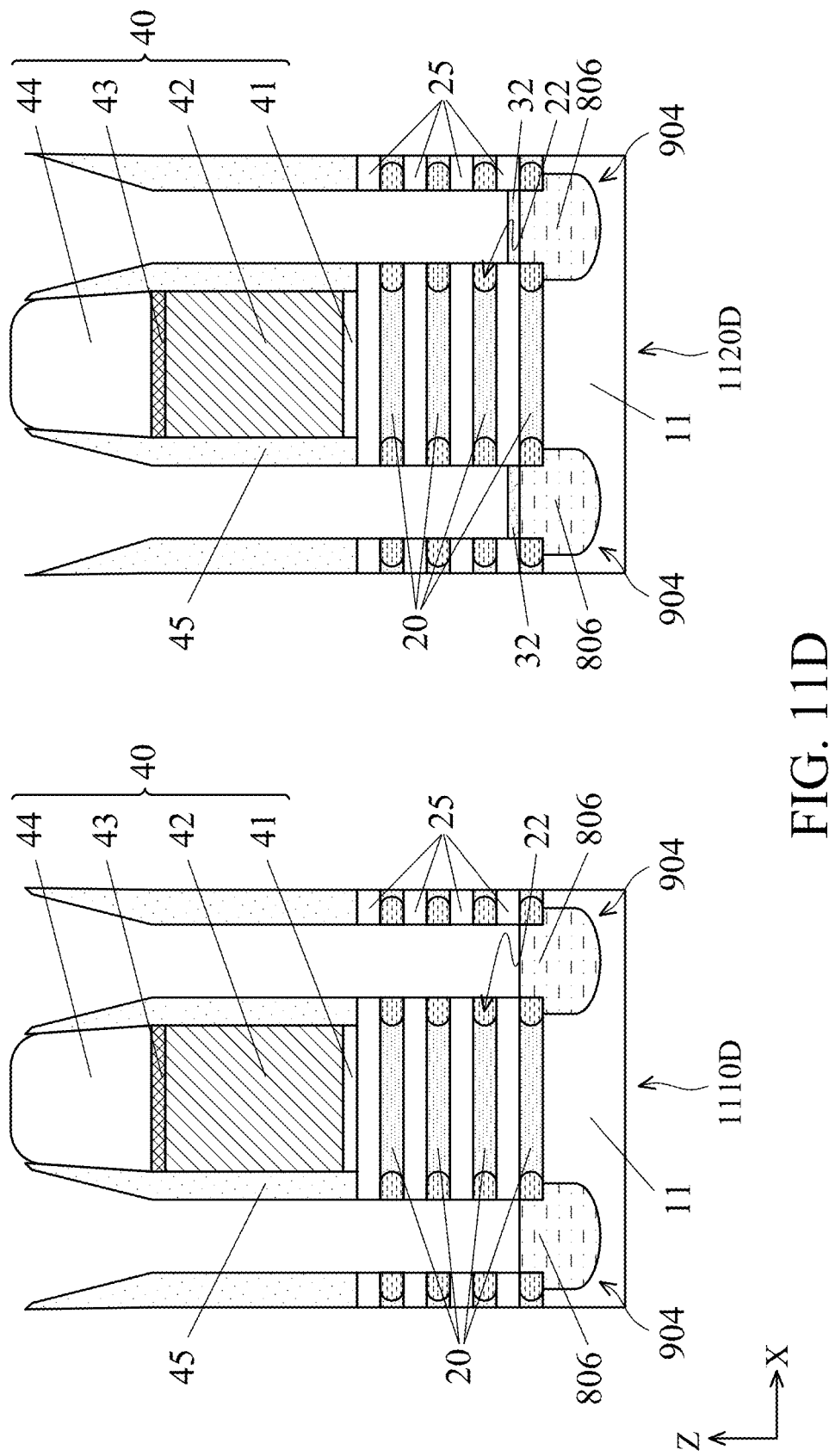

As shown in FIG. 11D, a semiconductor device structure 1120D is produced by etching, e.g., one or more directional etching, of the second insulating layer 31 from the walls of the source/drain space 21 above the bottom 904 of the source/drain space 21 of the semiconductor device structure 1120C, thereby forming/exposing the inner spacers 35 and producing the gas implanted insulating layer 32 over the undoped epitaxial layer 806. Also, a semiconductor device structure 1110D is produced by removing the photo resist layer 906 that is disposed over the semiconductor device structure 1110C and then etching the second insulating layer 31 over the undoped epitaxial layer 806 and etching the second insulating layer 31 from the walls of the source/drain space 21 above the bottom 904 of the source/drain space 21. Thereby, forming/exposing the inner spacers 35 and exposing the surface of the undoped epitaxial layer 806. The semiconductor device structure 1110E is consistent with the semiconductor device structure 1010E.

Figure 11E:
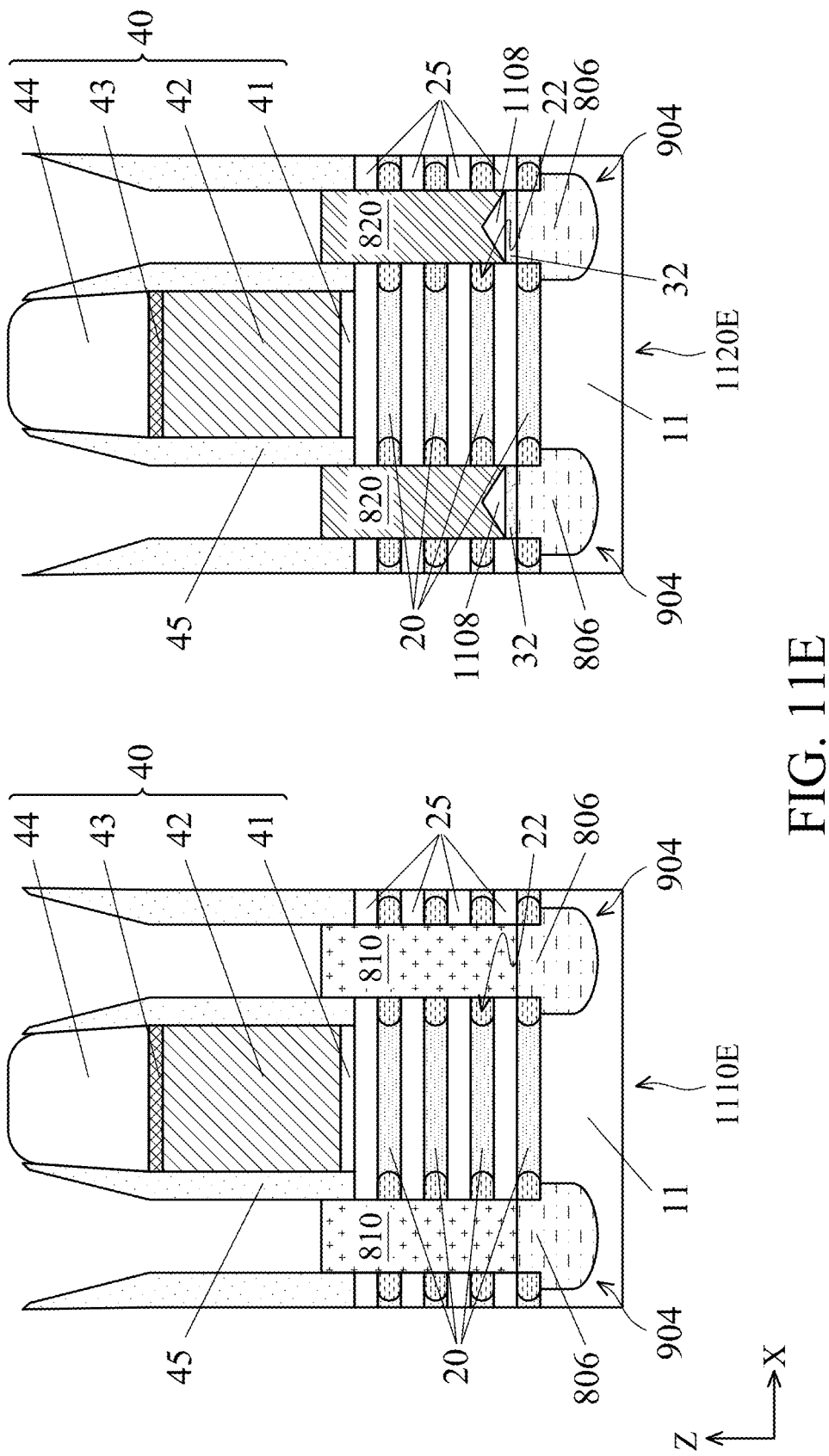

FIG. 11E also shows a semiconductor device structure 1120E after doped epitaxial layers 820 are grown above the gas implanted insulating layer 32 at the bottom 904 of the source/drain space 21 of the semiconductor device structure 1120D. Also, the ILD layer 70 is formed over the epitaxial layers 810, 820, the sacrificial gate structure 40, and the sidewall spacers 45. As shown, the doped epitaxial layers 820 of the semiconductor device structure 1020E does not attach to the gas implanted insulating layer 32 and, thus, a void 1108 is produced on top of the gas implanted insulating layer 32. The voids 1108 may act as a physical barrier, e.g., an electrical isolation/barrier, to prevent a current from source/drain region 28 to get to the base portion 11 of the fin structures or to the substrate 10. In some embodiments, the void 1108 is larger than the void 808. The void 1108 has a width as large as the width of the source/drain space 21, e.g., between 5 nm to 15 nm, a height between about 2 nm and 7 nm, and may have the cross sectional shape of a rectangle, a trapezoid, or a triangle, and may act as a physical barrier, e.g., an electrical isolation/barrier, to prevent a current from source/drain region 28 to get to the base portion 11 of the fin structures or to the substrate 10. As noted above, the type of the dopant of the doped epitaxial layers 810 and 820 are consistent with the type of the semiconductor device structures 1110I and 1120I.

FIG. 11E also shows a semiconductor device structure 1110E after doped epitaxial layers 810 are grown above the undoped epitaxial layer 806 at the bottom 904 of the source/drain space 21 of the semiconductor device structure 1110D. The semiconductor device structure 1110E is consistent with the semiconductor device structure 1010F.

Figure 11F:
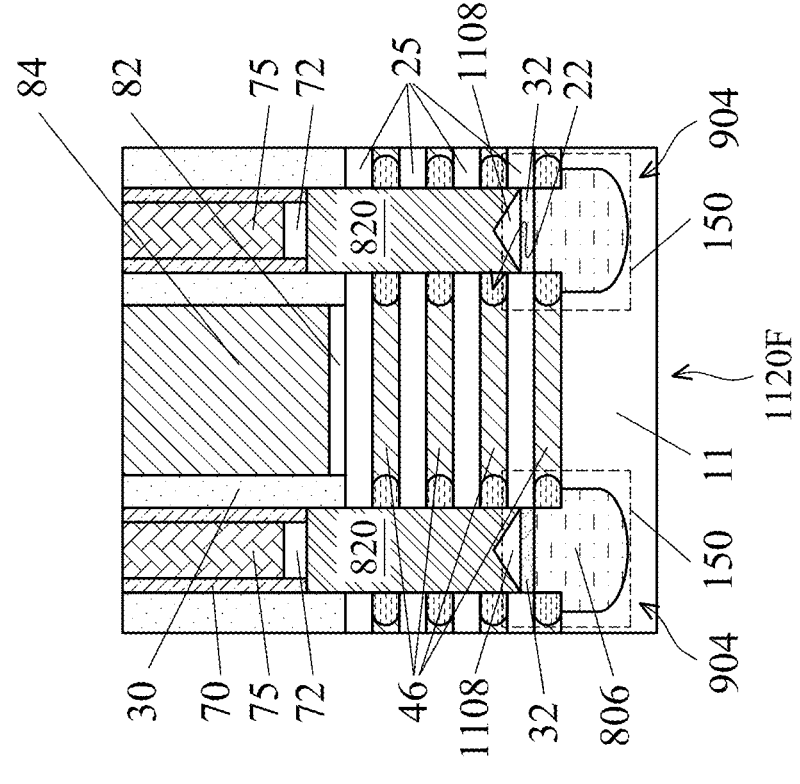
Figure 11F:
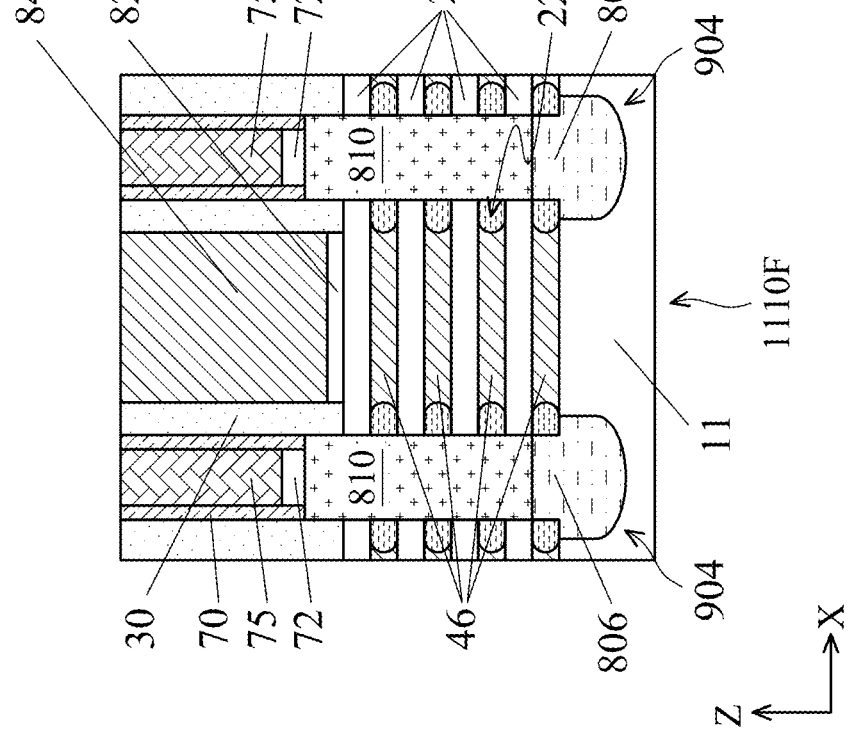

FIG. 11F shows the semiconductor device structures 1110F and 1120F. The semiconductor device structure 1110F is consistent with the semiconductor device structure 1010F. For the semiconductor device structure 1120F, after the ILD layer 70 is formed over the semiconductor device structure 1120E, a planarization operation is performed and the sacrificial gate structures 40 is removed as described above. As shown, the electrical isolation region 150 of the semiconductor device structure 1120E includes the undoped epitaxial layer 806, the gas implanted insulating layer 32, and the void 1108. The electrical isolation region 150 prevents current leakage between the source/drain epitaxial layer 820 and the base portion 11 of the fin structures and between the source/drain epitaxial layer 820 and the substrate 10 and acts as a current barrier, e.g., leakage current barrier. In some embodiments, the gas implanted insulating layer 32 covers a portion, e.g., between about 30 percent to 90 percent, of the top surface of the undoped epitaxial layer 806. In some embodiments, the gas implanted insulating layer 32 is located either next the left wall, next to the right wall, or is centered between the right and left walls when disposed over the undoped epitaxial layer 806. In some embodiments, the gas implanted insulating layer 32 is not attached to the undoped epitaxial layer 806 and another void (not shown) exist between the undoped epitaxial layer 806 and the gas implanted insulating layer 32.

Figure 11G:
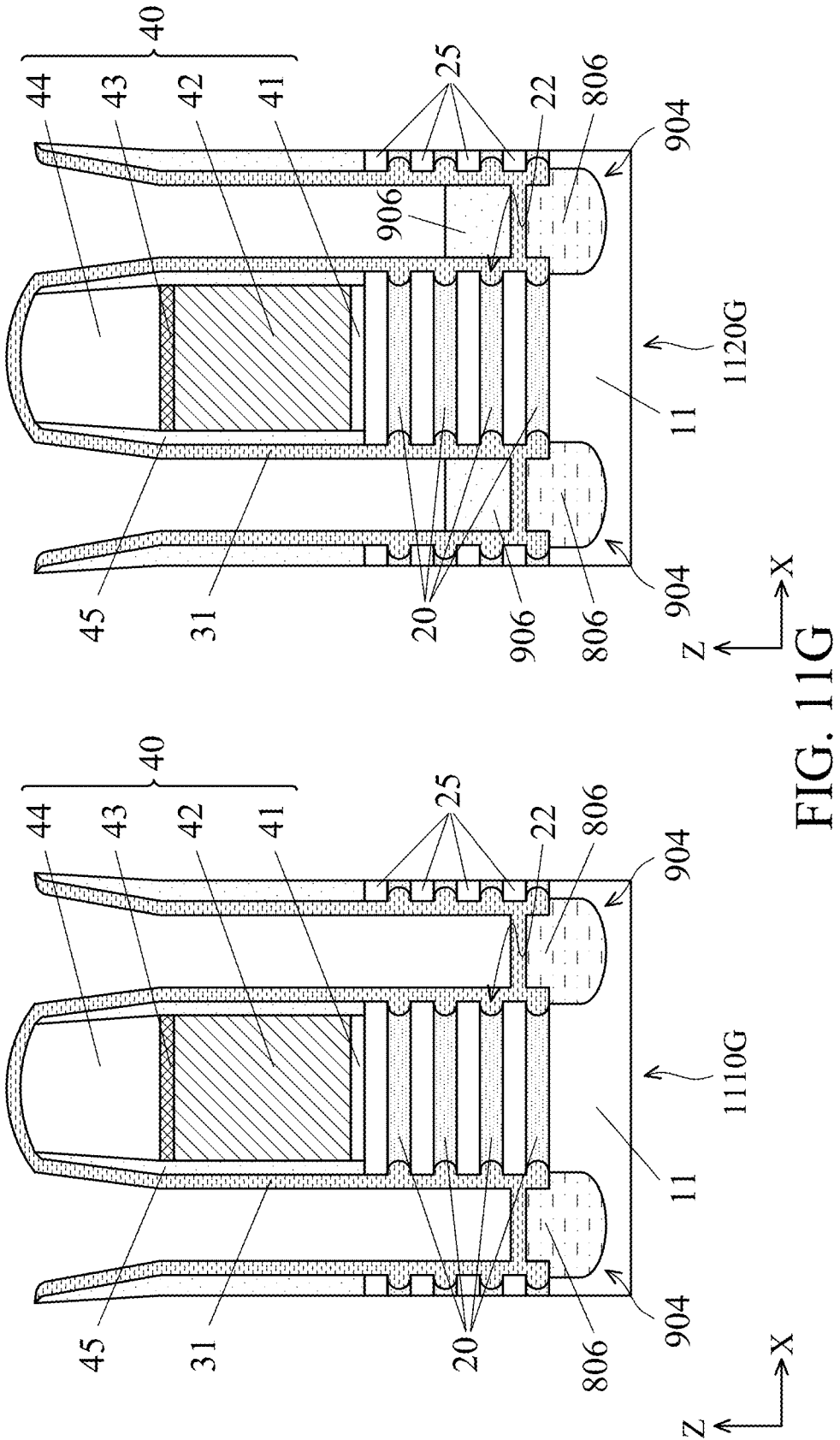

FIG. 11G shows the semiconductor device structures 1110G and 1120G. The semiconductor device structures 1110G and 1120G are consistent with the semiconductor device structures 1110B and 1120B of FIG. 11B with the difference that for the semiconductor device structure 1120G, the photo resist layer 906 is disposed over a lower portion of the second insulating layer 31 that is disposed over the undoped epitaxial layer 806. Thus, the lower portion of the second insulating layer 31 is not etched from the semiconductor device structure 1120G when dry etching is applied to remove the second insulating layer 31 from the inside of the source/drain space 21 of the semiconductor device structures 1110G and 1120G.

Figure 11H:
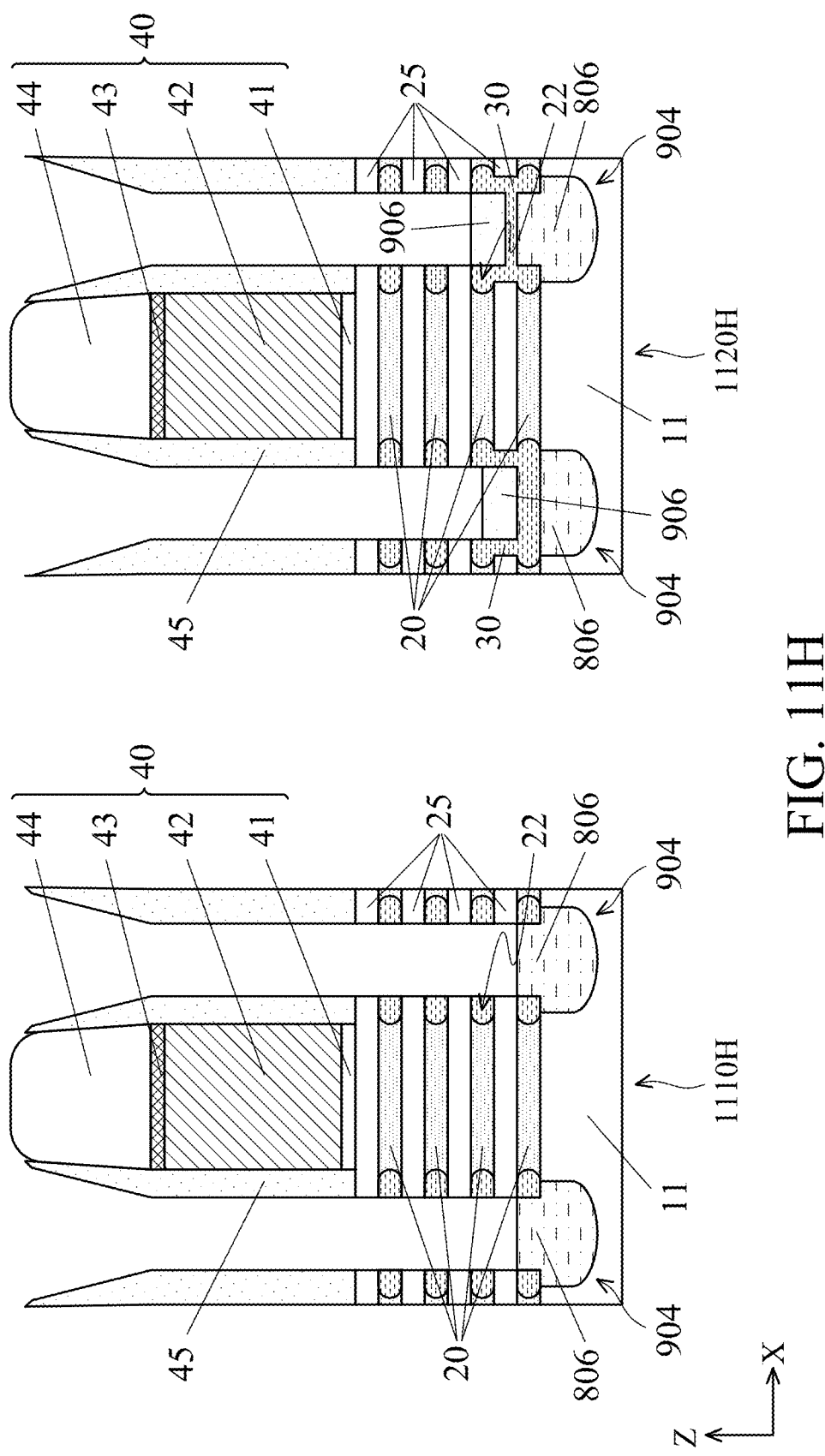

FIG. 11H shows semiconductor device structures 1110H and 1120H when dry etching is applied to the semiconductor device structures 1110G and 1120G. In the semiconductor device structure 1110H, the first insulating layer 30 is etched from the walls and the bottom of the source/drain space 21 and the undoped epitaxial layer 806 is exposed and, thus, the semiconductor device structure 1110H is consistent with the semiconductor device structure 1110D. In the semiconductor device structure 1120H, the first insulating layer 30 is etched from the walls, however, the first insulating layer 30 is not etched from the bottom of the source/drain space 21 and, thus, the undoped epitaxial layer 806 is not exposed. Also, the walls next to the bottom of the source/drain space 21 are not etched and the first insulating layer 30 remains over the undoped epitaxial layer 806. Next, the photo resist layer 906 is removed from the lower portion of the first insulating layer 30 that is disposed over the undoped epitaxial layer 806.

Figure 11I:
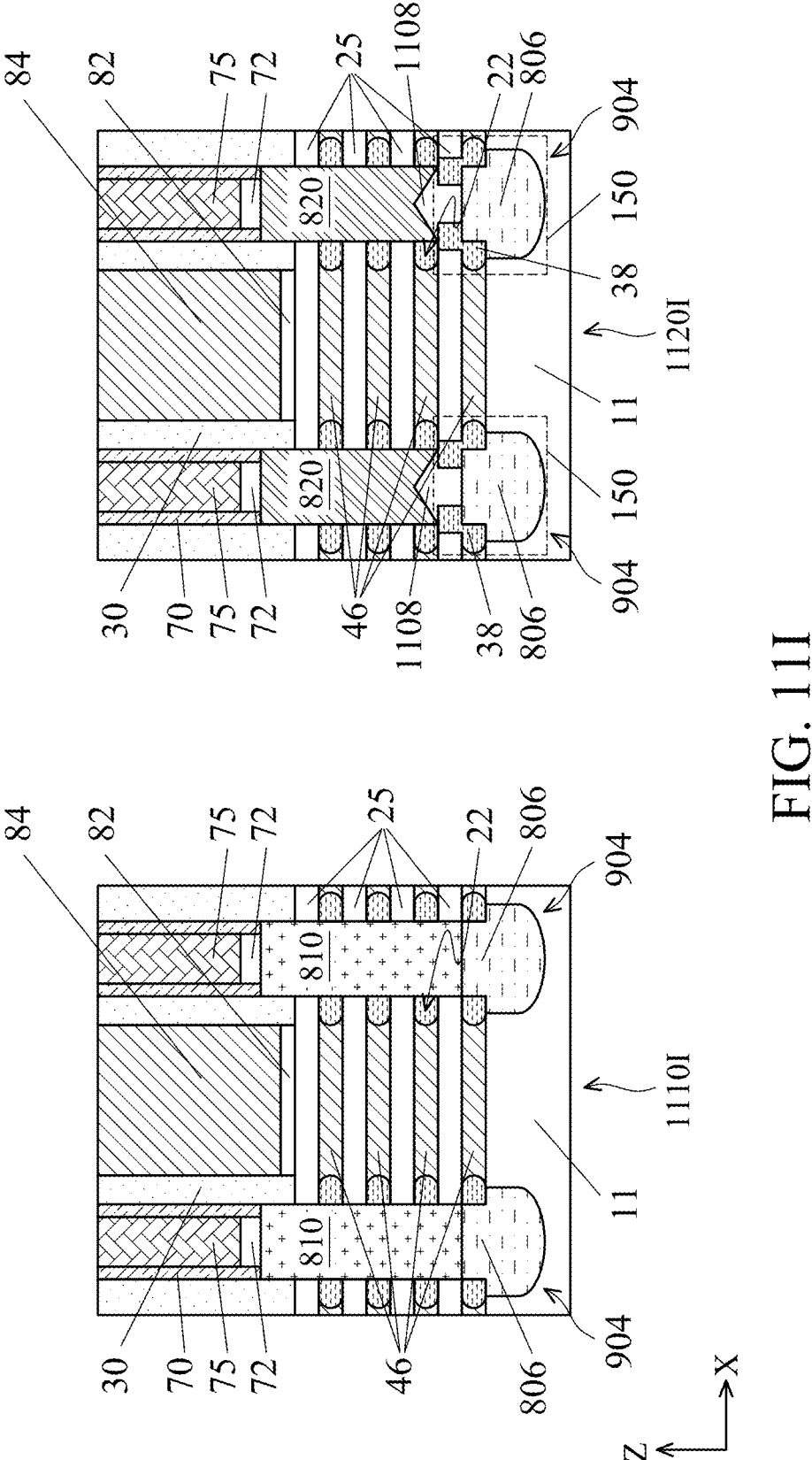

FIG. 11I shows semiconductor device structures 1110I and 1120I when the processes described with respect to FIGS. 11E and 11F are applied to semiconductor device structures 1110H and 1120H. As shown, the electrical isolation region 150 of the semiconductor device structure 1120I includes the undoped epitaxial layer 806, a portion 38 of the first insulating layer 30, and the void 1108.

Figure 12A:
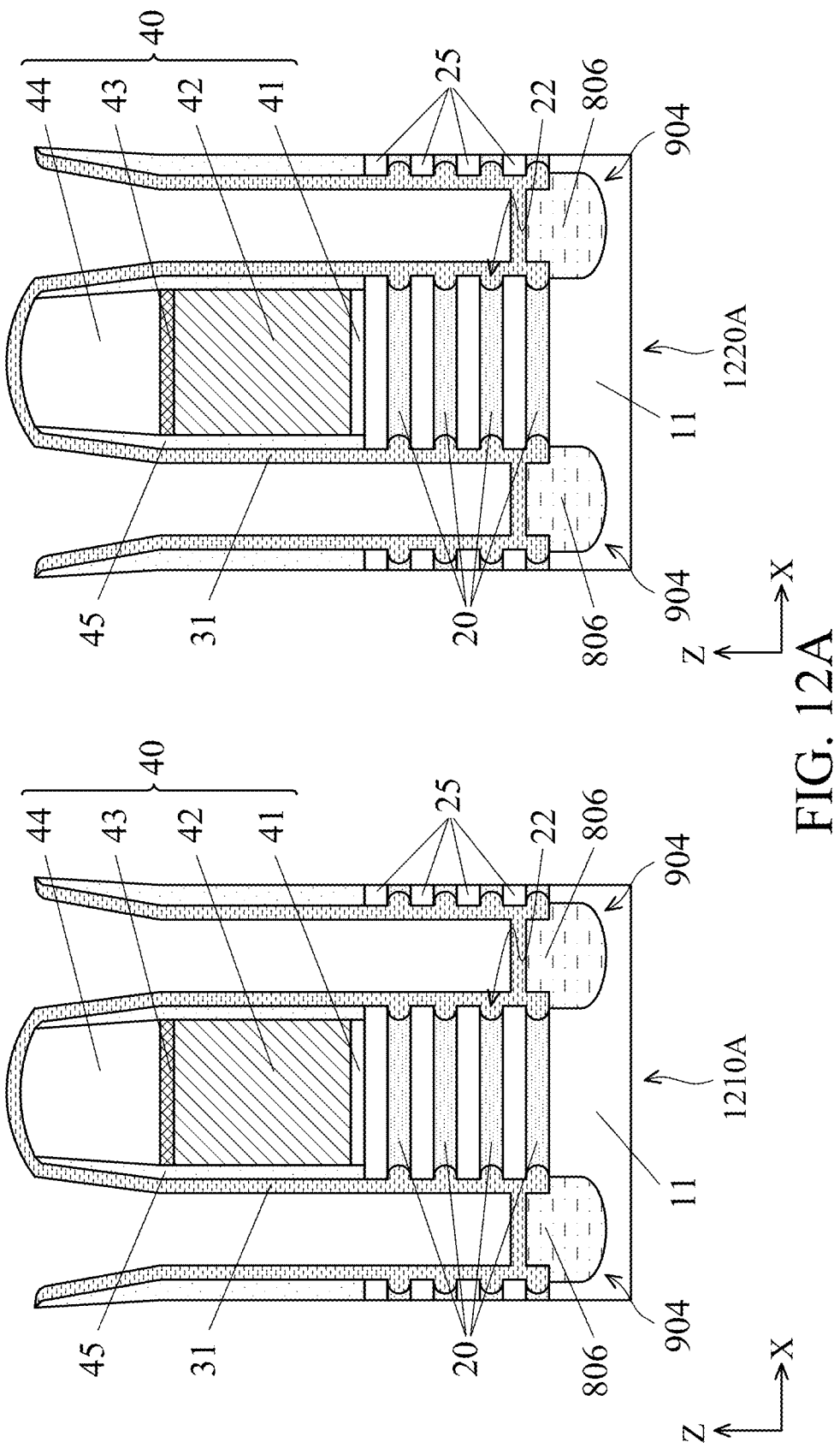
FIGS. 12A, 12B, 12C, 12D, 12E, 12F, 12G, 12H, and 12I show various stages of manufacturing semiconductor GAA FET devices according to an embodiment of the present disclosure.
Figure 12B:
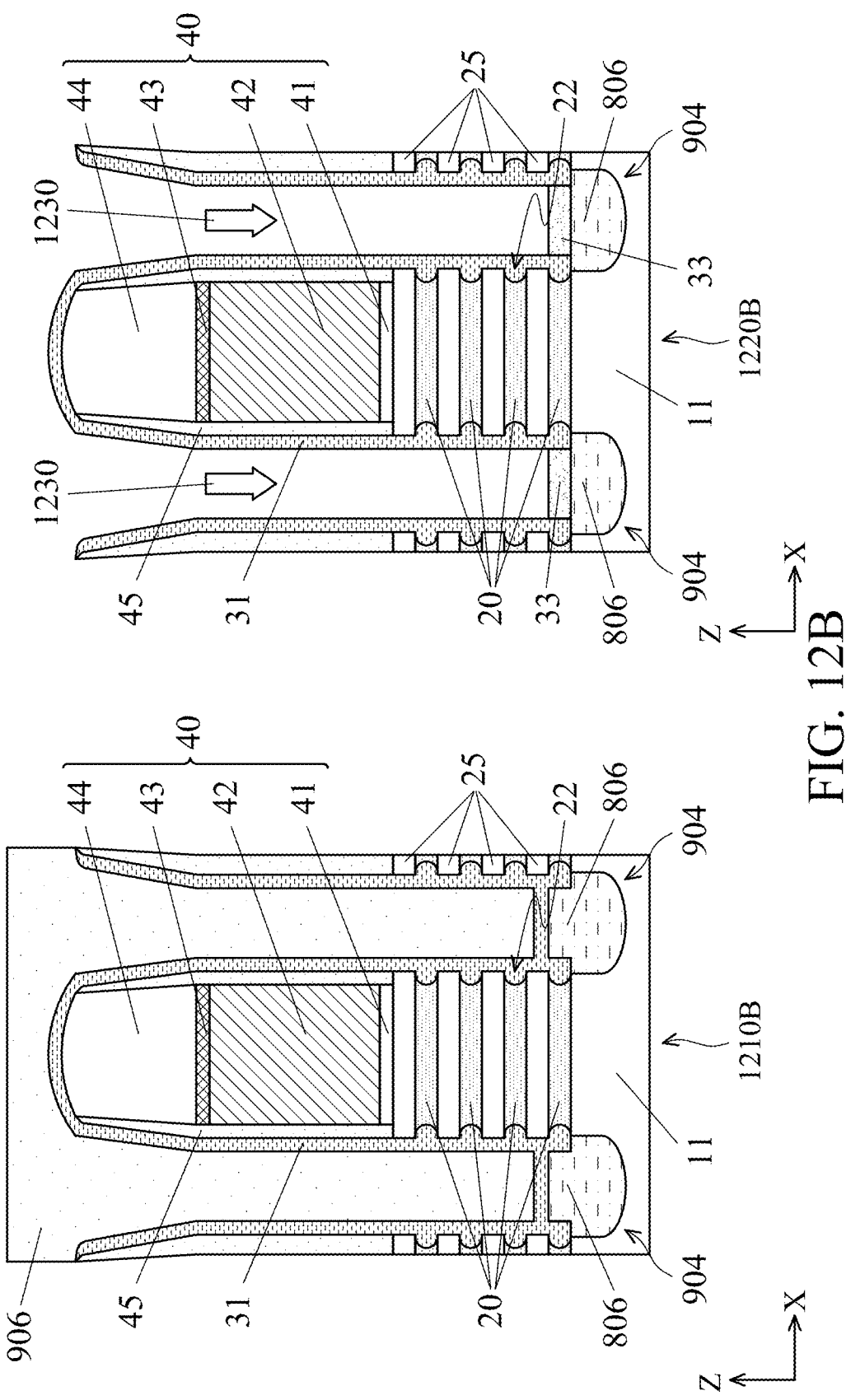
Figure 12C:
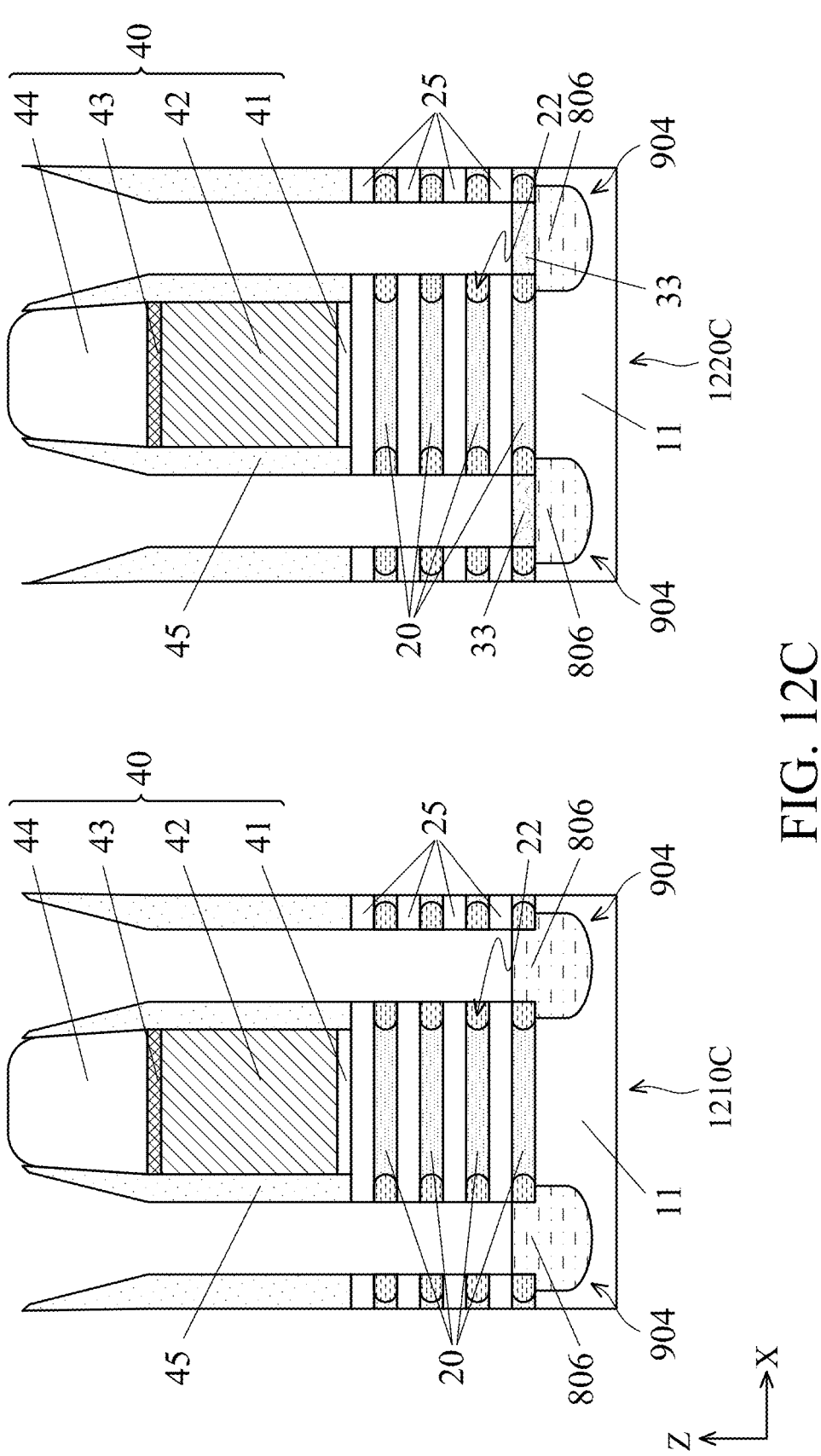

FIGS. 12A, 12B, 12C, 12D, 12E, 12F, 12G, 12H, and 12I show various stages of manufacturing semiconductor GAA FET devices according to an embodiment of the present disclosure. It is understood that additional operations. In FIG. 12A, semiconductor device structures 1210A and 1220A are consistent with the semiconductor device structures 1110B and 1120B of FIG. 11B. In FIG. 12B, the photo resist layer 906 is disposed over the semiconductor device structure 1110B. In addition, the bottom of the source/drain space 21 of the semiconductor device structure 1120B is etched and the second insulating layer 31 is removed and the top surface of the undoped epitaxial layer 806 is exposed. Then ion implantation is applied to exposed surface of the undoped epitaxial layer 806 in the source/drain space 21 of the semiconductor device structure 1120B with an ion beam 1230 that include dopant ions and a top layer 33 having dopant ions is produced at top surface of the undoped epitaxial layer 806 to dope the top layer 33 of the undoped epitaxial layer 806. In some embodiments, the type of the dopant in the top layer 33 is the opposite of the type of the dopant that exists in the epitaxial layer 820 that will grow over the undoped epitaxial layer 806. In FIG. 12C, the first insulating layer is etched from inside the source/drain space 21 of the semiconductor device structures 1210C and 1220C. In some embodiments, after or before the ion implantation with the dopant ions, ion implantation with nitrogen or an inert gas is performed to exposed surface of the undoped epitaxial layer 806.

Figure 12D:
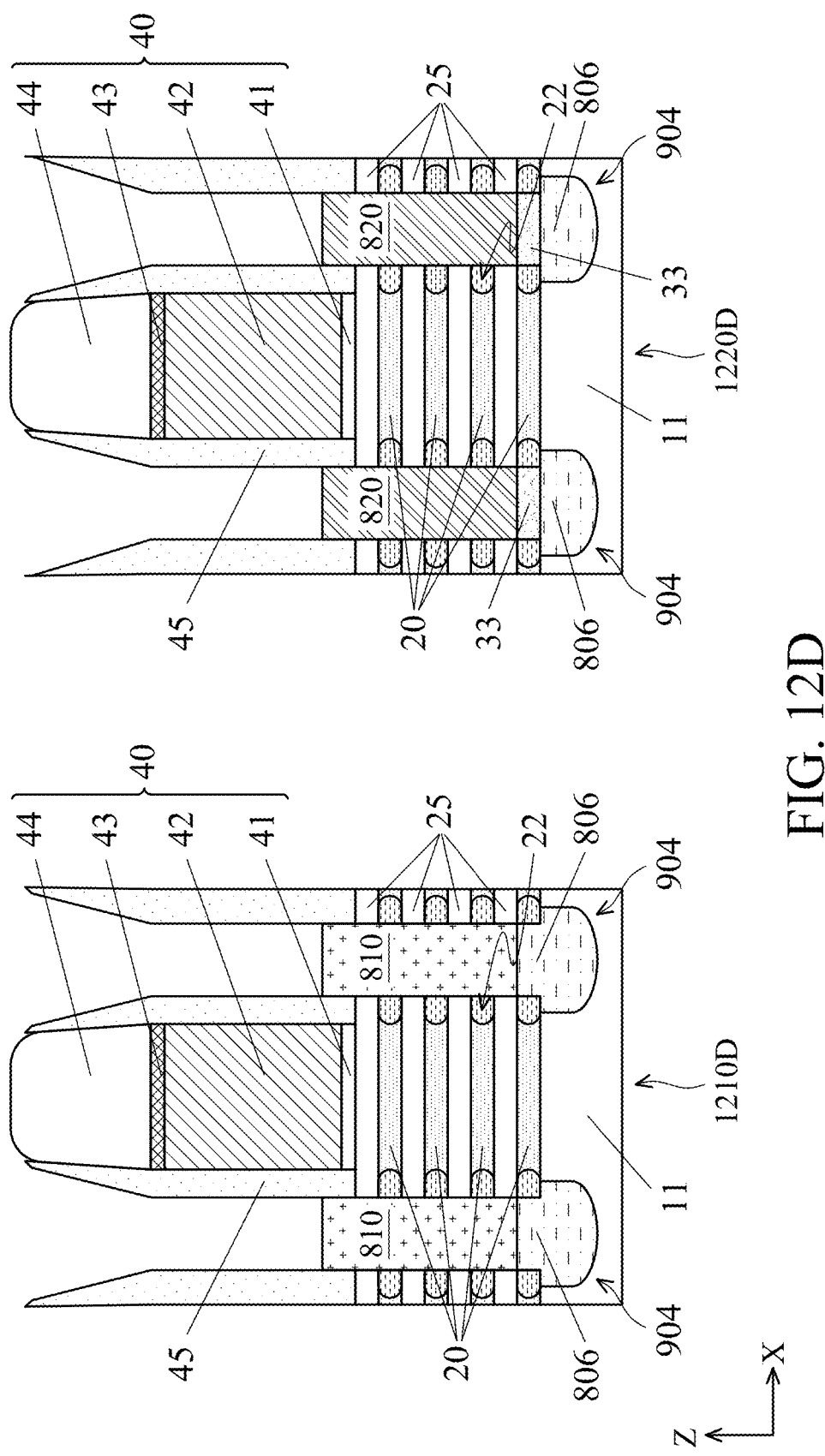
Figure 12E:
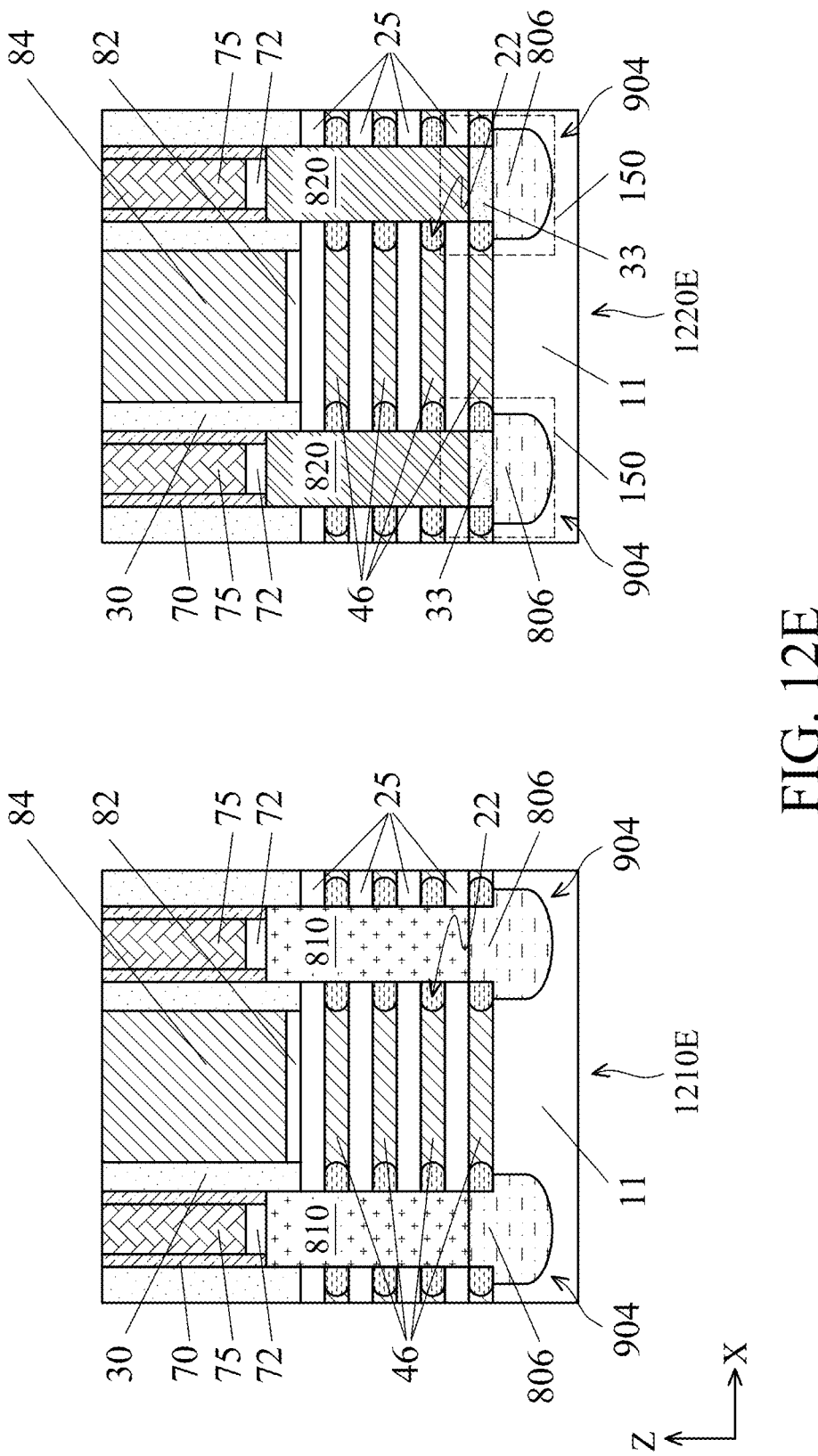

The processes performed with respect to the semiconductor device structures 1210D and 1220D in FIG. 12D and with respect to the semiconductor device structures 1210E and 1220E in FIG. 12E are respectively the same as the processes performed with respect to FIGS. 11E and 11F. In FIG. 12E, the electrical isolation region 150 includes the undoped epitaxial layer 806 and the top layer 33. In some embodiments, a junction is produced between a first region at the top layer 33 and a second region that is the rest of the undoped epitaxial layer 806 because of the opposite type of dopant between the first region and the second region that the junction may act as a current barrier.

Figure 12F:
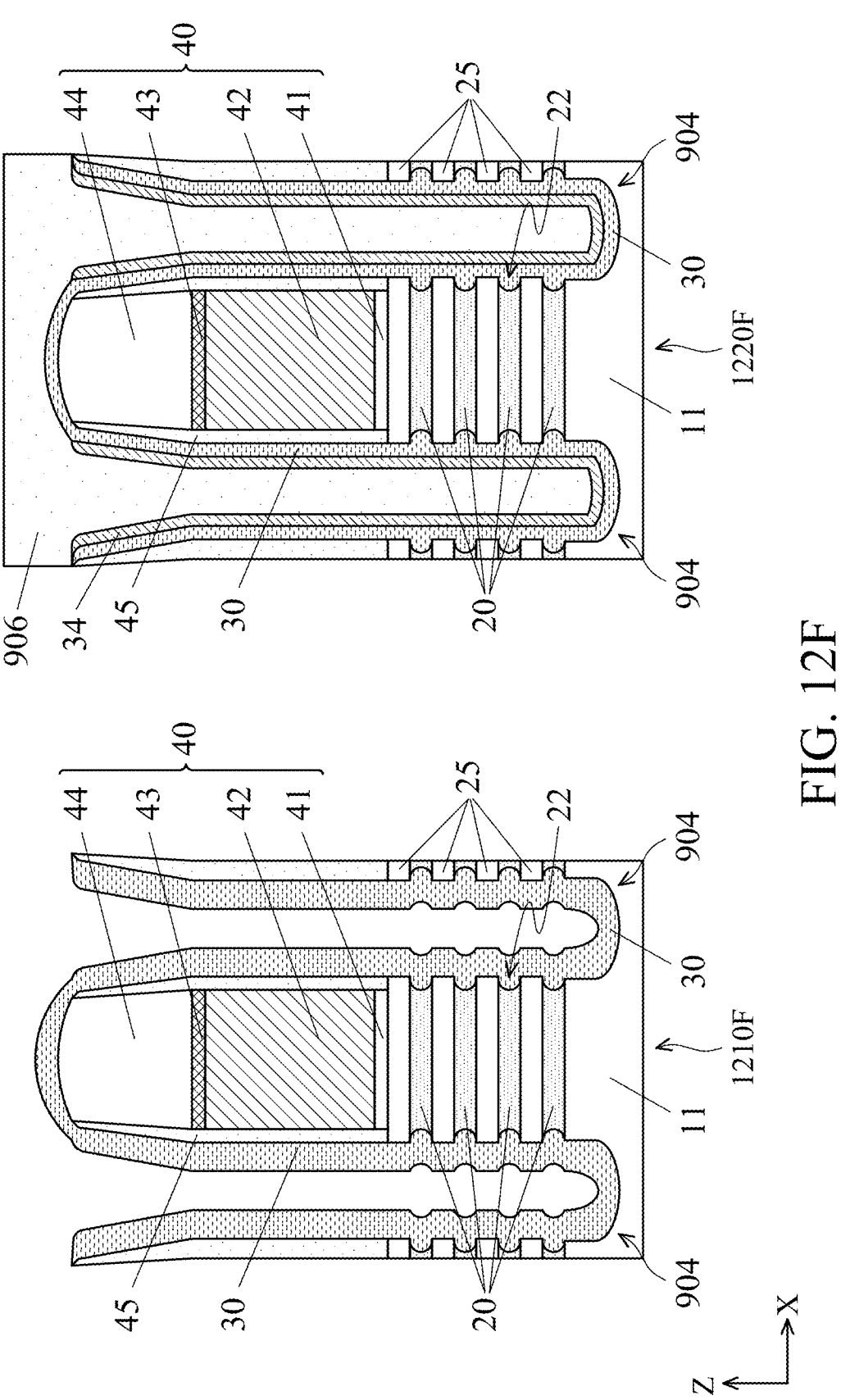
Figure 12G:
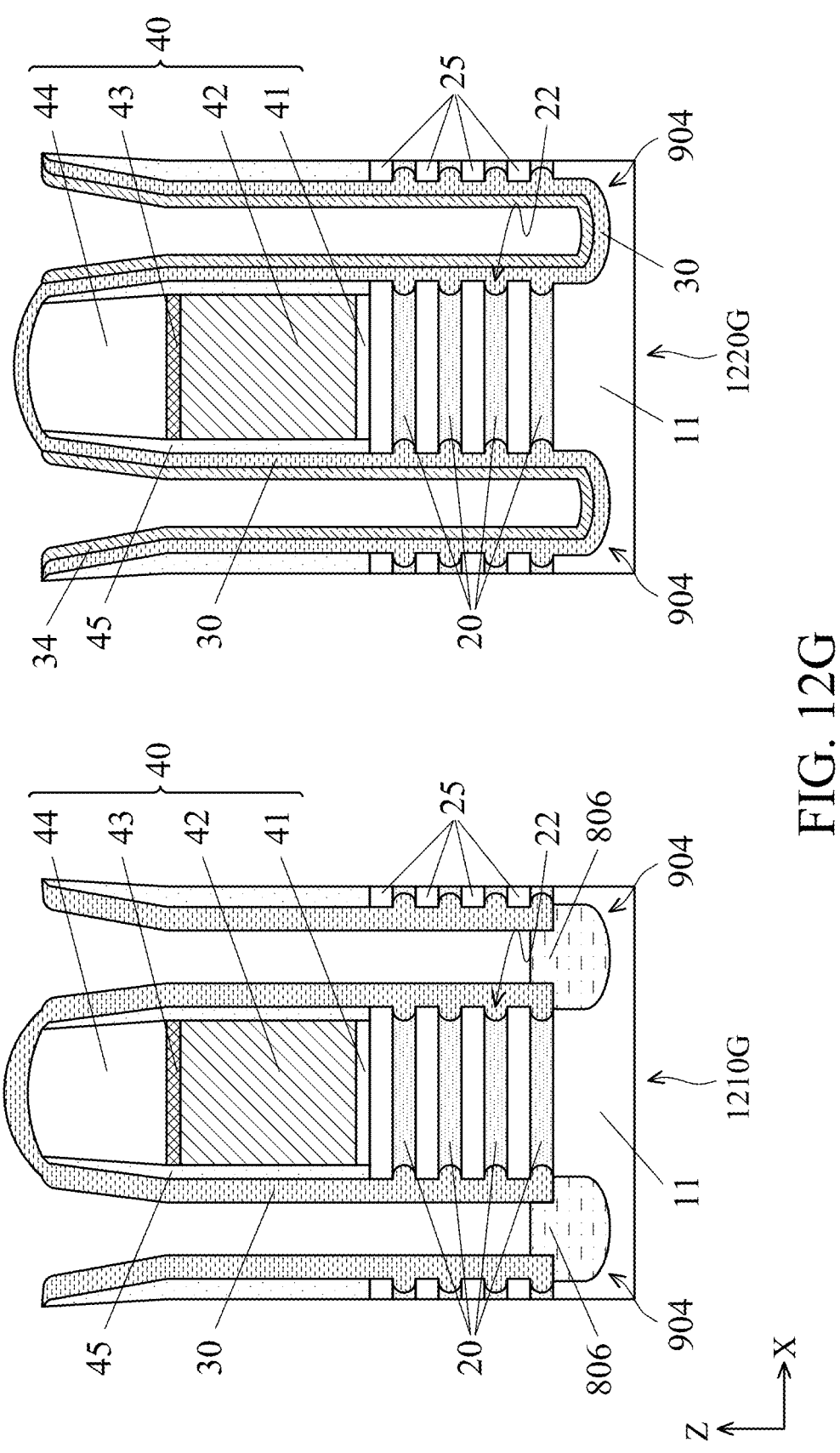

The semiconductor device structures 1210F and 1220F of FIG. 12F are consistent with the semiconductor device structures 910B and 920B of FIG. 9B with the difference that in addition to using the photo resist layer 906 for patterning, a third insulating layer 34 (a hard mask) is also used such that the combination of the photo resist and the hard mask prevents unwanted etching or deposition. As shown in FIG. 12G, the bottom 904 of the source/drain space 21 of the semiconductor device structure 1210G is etched and the undoped epitaxial layer 806 is epitaxially grown in the etched region. In some embodiments, during the deposition of the undoped epitaxial layer 806 for the semiconductor device structure 1210G, the photo resist layer 906 is removed from the semiconductor device structure 1220G while the third insulating layer 34 (the hard mask) stays. Then the third insulating layer 34 is removed from the semiconductor device structure 1220G of FIG. 12G.

Figure 12H:
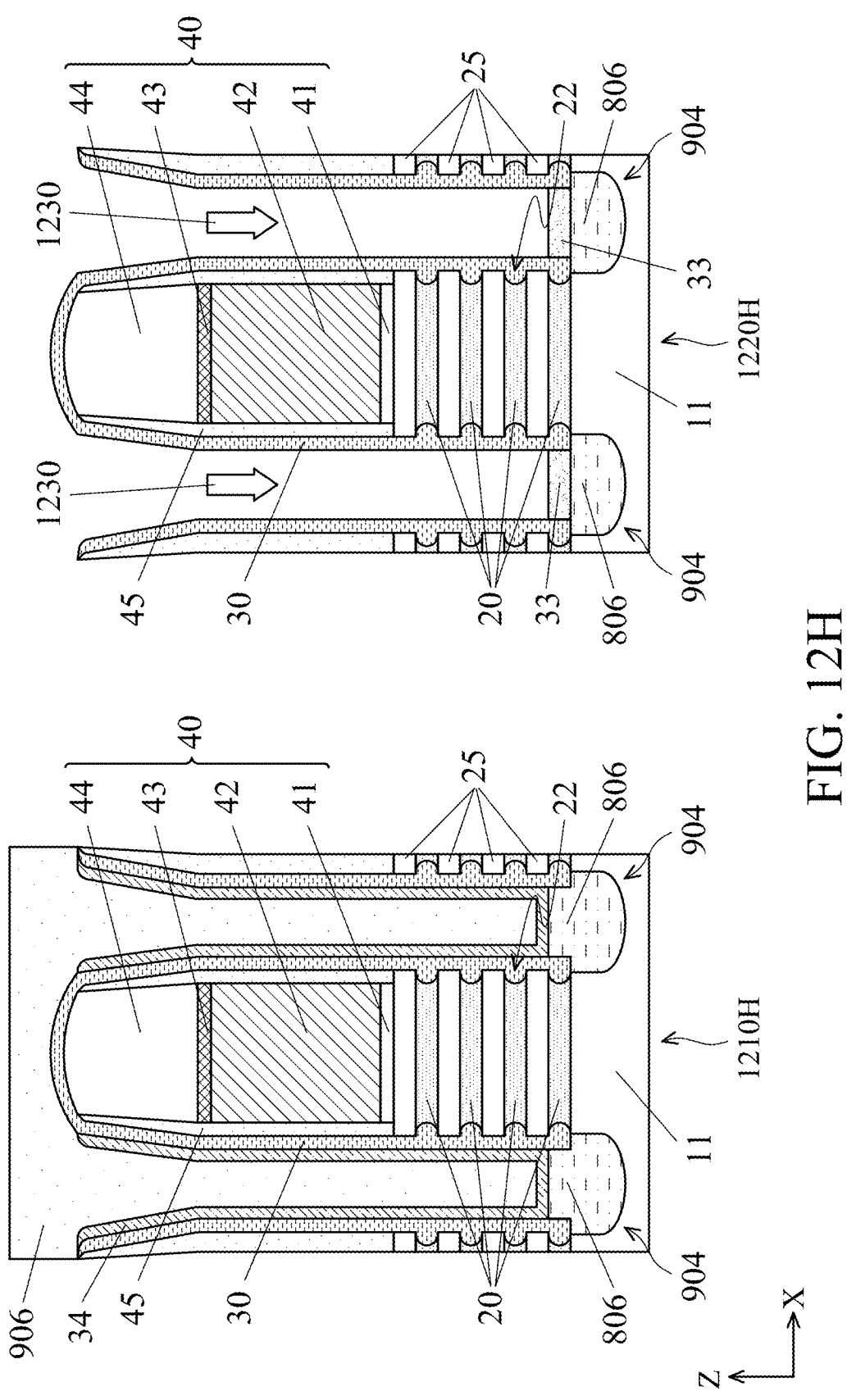
Figure 12I:
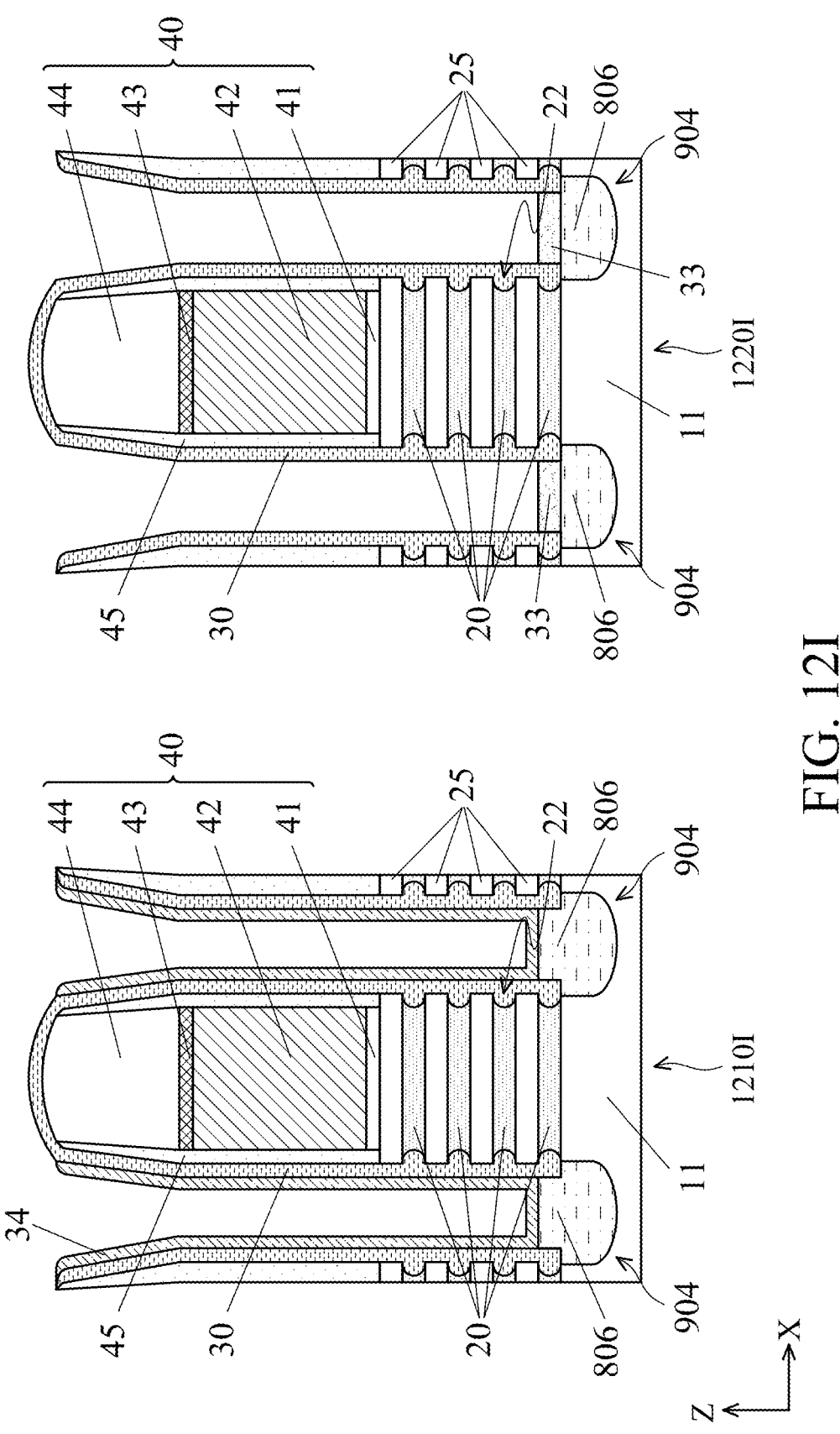
Figure 13A:
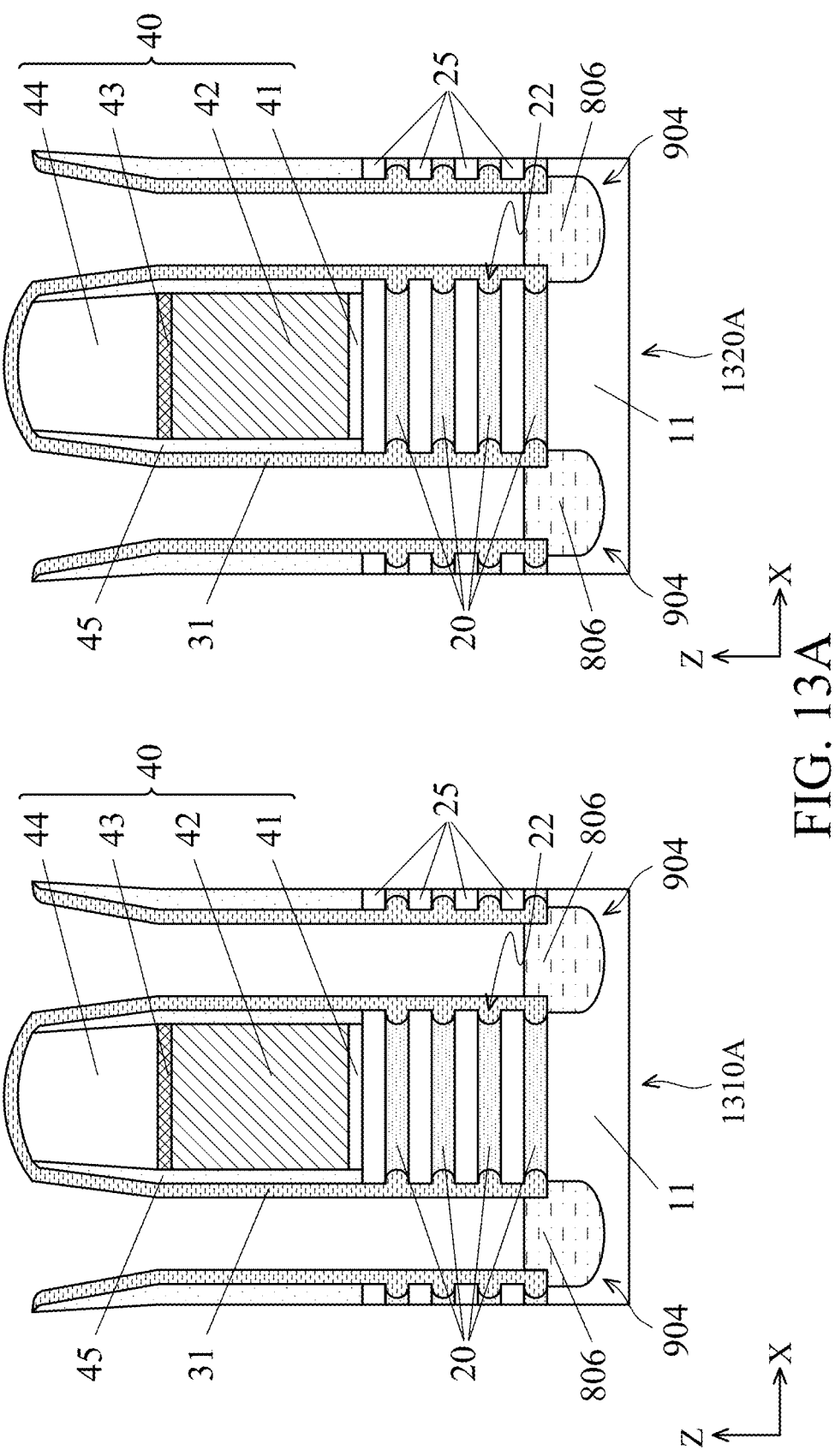
FIGS. 13A, 13B, 13C, and 13D show various stages of manufacturing semiconductor GAA FET devices according to an embodiment of the present disclosure.

The semiconductor device structures 1210H and 1220H of FIG. 12H are consistent with the semiconductor device structures 1210B and 1220B of FIG. 12B with the difference that in addition to using the photo resist layer 906 for patterning, the third insulating layer 34 (the hard mask) is also used and the combination of the photo resist layer and the hard mask are used for patterning. As shown in FIG. 12I, the bottom 904 of the source/drain space 21 of the semiconductor device structure 1210I is etched and the undoped epitaxial layer 806 is epitaxially grown in the etched region. In some embodiments, as shown in FIG. 12I, during the deposition of the undoped epitaxial layer 806 for the semiconductor device structure 1220I, the photo resist layer 906 is removed from the semiconductor device structure 1210I while the third insulating layer 34 (the hard mask) stays. Then the third insulating layer 34 is removed from the semiconductor device structure 1210I of FIG. 12I and the processes described with respect to FIGS. 12D and 12E are applied FIGS. 13A, 13B, 13C, and 13D show various stages of manufacturing semiconductor GAA FET devices according to an embodiment of the present disclosure. It is understood that additional operations can be provided before, during, and after processes shown by FIGS. 13A to 13D, and some of the operations described below can be replaced or eliminated, for additional embodiments of the method. The order of the operations/processes may be interchangeable. Material, configuration, dimensions and/or processes the same as or similar to the foregoing embodiments may be employed in the embodiment of FIGS. 13A-13D, and detailed explanation thereof may be omitted. Semiconductor device structures 1310A and 1320A of FIG. 13A are consistent with the semiconductor device structures 1110C and 1120C of FIG. 11C with the difference that the top surface of the undoped epitaxial layer 806 in the semiconductor device structures 1310A and 1320A are not covered with the second insulating layer 31.

Figure 13B:
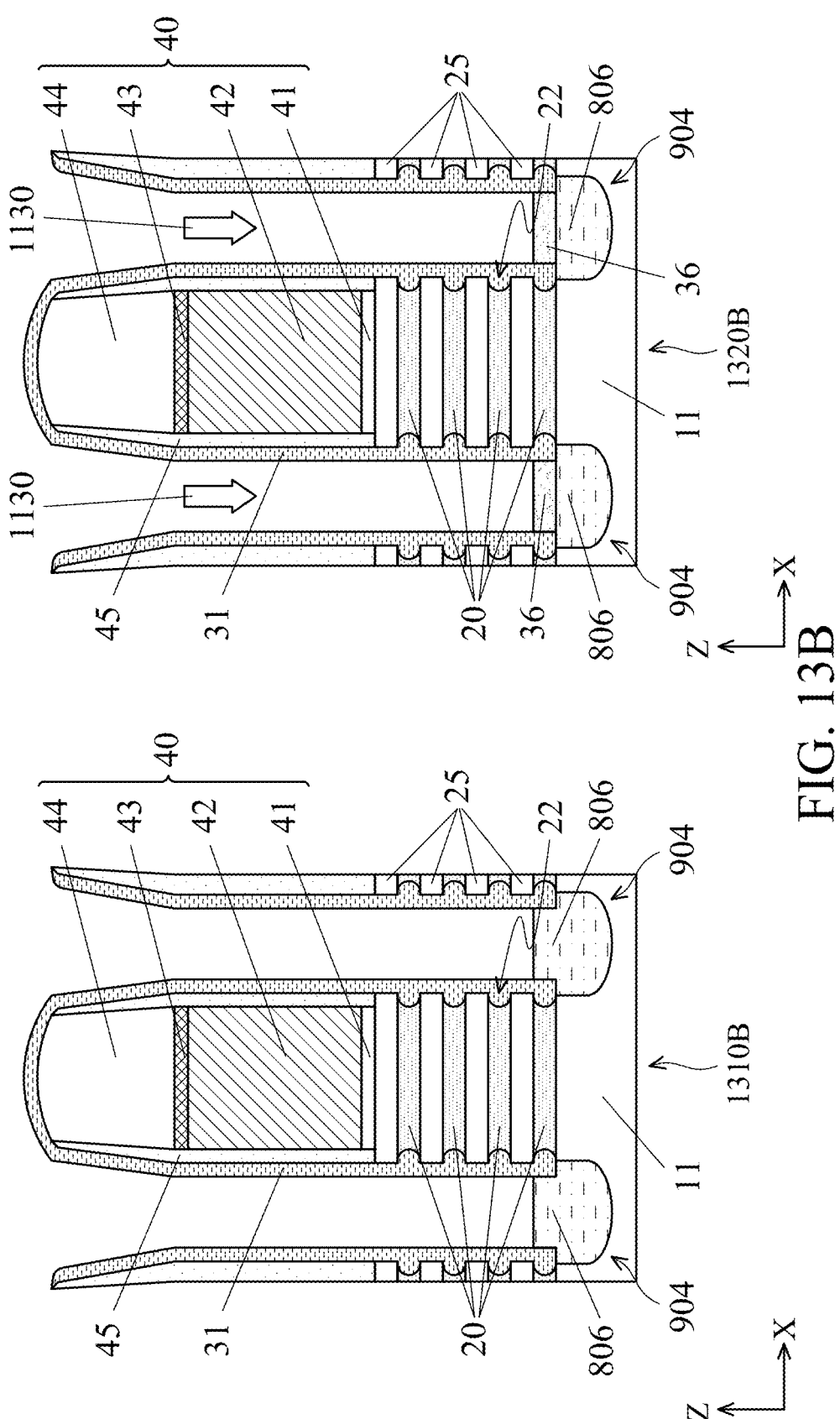

As shown in FIG. 13B, the top surface of the undoped epitaxial layer 806 of the semiconductor device structure 1320B is bombarded with the ion beam 1130. In some embodiments, the ion beam includes one or more of the nitrogen or an inert gas, e.g., argon. The ion implantation produces a gas implanted top layer 36. In some embodiments, the gas implanted acts as a current barrier layer.

Figure 13C:
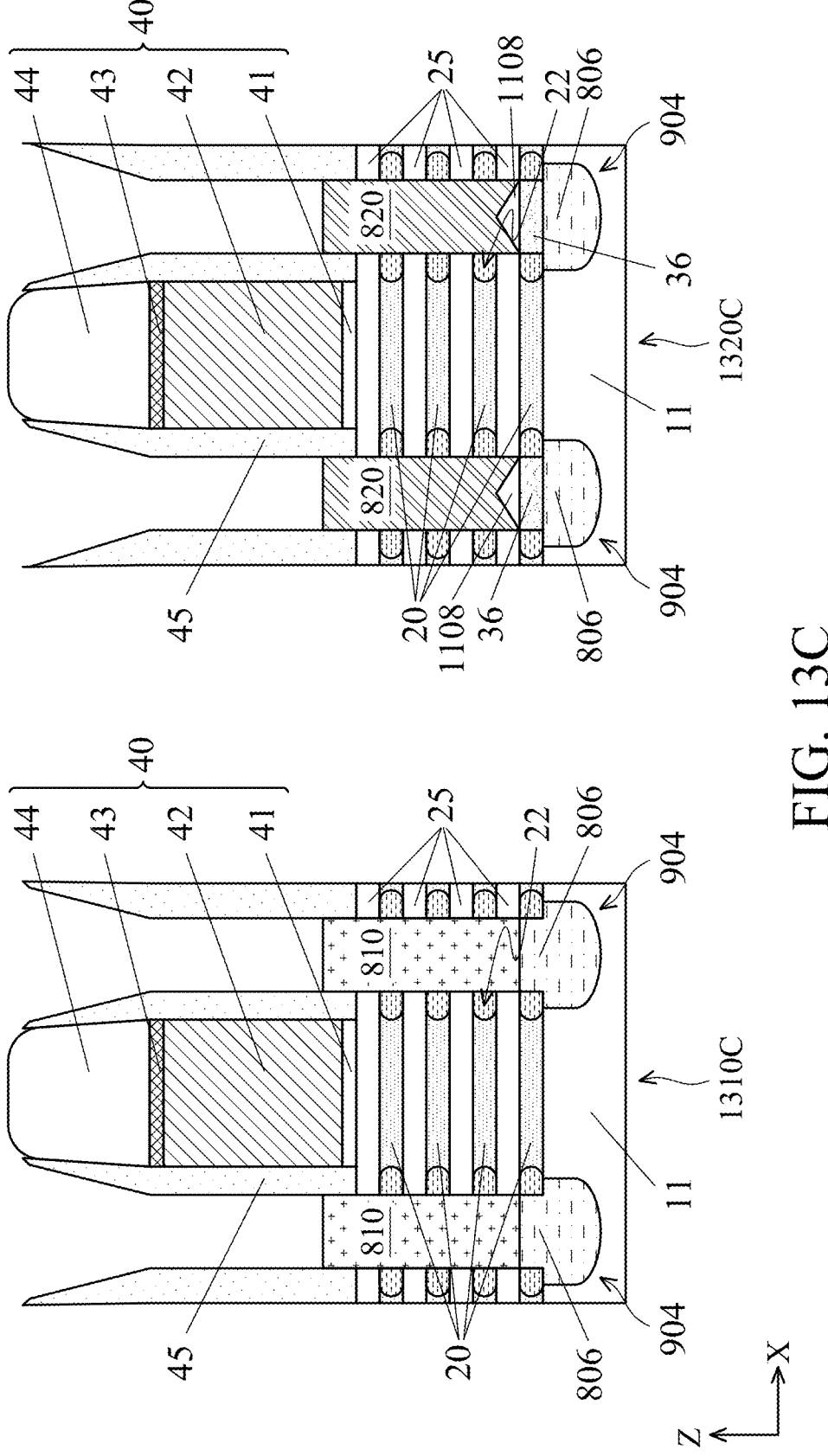
Figure 13D:
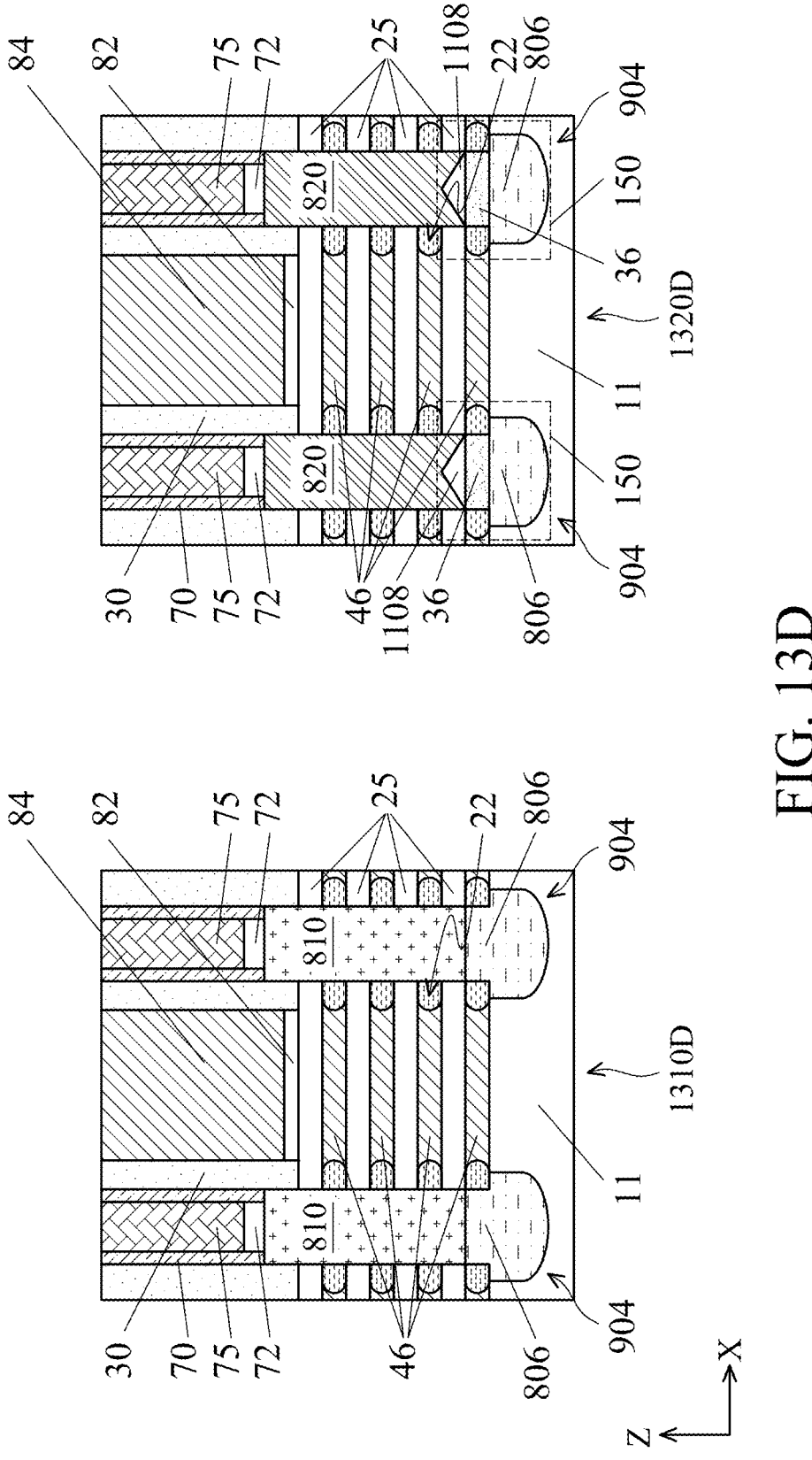

The processes performed with respect to the semiconductor device structures 1310C and 1320C in FIG. 13C and with respect to the semiconductor device structures 1310D and 1320D in FIG. 13D are respectively consistent with the processes performed with respect to FIGS. 11E and 11F. In FIG. 13D, the electrical isolation region 150 includes the undoped epitaxial layer 806, the top layer 36 that includes the implanted gas, and the void 1108 over the top layer 36. As discussed before, because of the implanted gas in the top layer 36 of the undoped epitaxial layer 806, the epitaxial layer 820 does not attached to the top layer 36 of the undoped epitaxial layer 806 and the void 1108 is created that acts as an electrical isolation/barrier, to prevent a current from source/drain region 28 to get to the base portion 11 of the fin structures or to the substrate 10.

In some embodiments, a junction is produced between a first region at the top layer 33 and a second region that is the rest of the undoped epitaxial layer 806 because of the opposite type of dopant between the first region and the second region that the junction may act as a current barrier that prevents the current leakage between the source/drain epitaxial layer 820 and the base portion 11 of the fin structures and between the source/drain epitaxial layer 820 and the substrate 10.

In the above embodiments, after the semiconductor wires or sheets (channel regions) of the second semiconductor layers 25 are formed, a gate dielectric layer 82 is formed around each of the channel regions as shown in FIG. 1A. Further, gate electrode layers 84 are formed on the gate dielectric layer 82, as shown in FIG. 1A. In some embodiments, the structure and/or material of the gate electrode for the n-type GAA FET are different from the structure and/or material of the gate electrode for the p-type GAA FET. As described, in some embodiments, the gate electrode layer 84 is disposed in the location of the first semiconductor layers 20 and is sandwiched between two layer of the gate dielectric layer 82.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer (not shown) formed between the channel regions and the dielectric material.

The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel region. The thickness of the gate dielectric layer 82 is in a range from about 1 nm to about 6 nm in one embodiment.

The gate electrode layer is formed on the gate dielectric layer 82 to surround each channel layer. The gate electrode includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer may be formed by CVD, ALD, electro-plating, or other suitable method. The gate electrode layer is also deposited over the upper surface of the ILD layer 70. The gate dielectric layer and the gate electrode layer formed over the ILD layer 70 are then planarized by using, for example, CMP, until the top surface of the ILD layer 70 is revealed. In some embodiments, after the planarization operation, the gate electrode layer 84 is recessed and a cap insulating layer (not shown) is formed over the recessed gate electrode layer 84. The cap insulating layer includes one or more layers of a silicon nitride-based material, such as silicon nitride. The cap insulating layer is formed by depositing an insulating material followed by a planarization operation.

In certain embodiments of the present disclosure, the gate electrode layer includes one or more work function adjustment layers (not shown) disposed over the gate dielectric layer 82. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. In some embodiments, one or more of TiAlC, Al, TiAl, TaN, TaAlC, TiN, TiC and Co are used as the work function adjustment layer for the p-channel FET. For an n-channel FET, one or more of TaN, TaAlC, TiN, TiC, Co, TiAl, HfTi, TiSi and TaSi is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

In some embodiments, before forming the first insulating layer 30, an additional insulating layer having a smaller thickness than the first insulating layer 30 is formed, and thus the inner spacers 35 have a two-layer structure. In some embodiments, widths (lateral length) of the inner spacers 35 are not constant. In some embodiments, the thickness of the undoped epitaxial layer 806 is in a range from about 5 nm to about 50 nm depending on the design and process requirements. In some embodiments, the undoped epitaxial layer 806 is formed by an epitaxial growth method using CVD, ALD or molecular beam epitaxy (MBE), using HCl, $SiH_2Cl_2$ and $SiH_4$ for a Si epitaxial layer or using HCl, $SiH_2Cl_2$ and $GeH_4$ for a SiGe epitaxial layer.

In certain embodiments of the present disclosure, the gate electrode layer includes one or more work function adjustment layers (not shown) disposed over the gate dielectric layer 82. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. In some embodiments, one or more of TiAlC, Al, TiAl, TaN, TaAlC, TiN, TiC and Co are used as the work function adjustment layer for the p-channel FET. For an n-channel FET, one or more of TaN, TaAlC, TiN, TiC, Co, TiAl, HfTi, TiSi and TaSi is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 14:
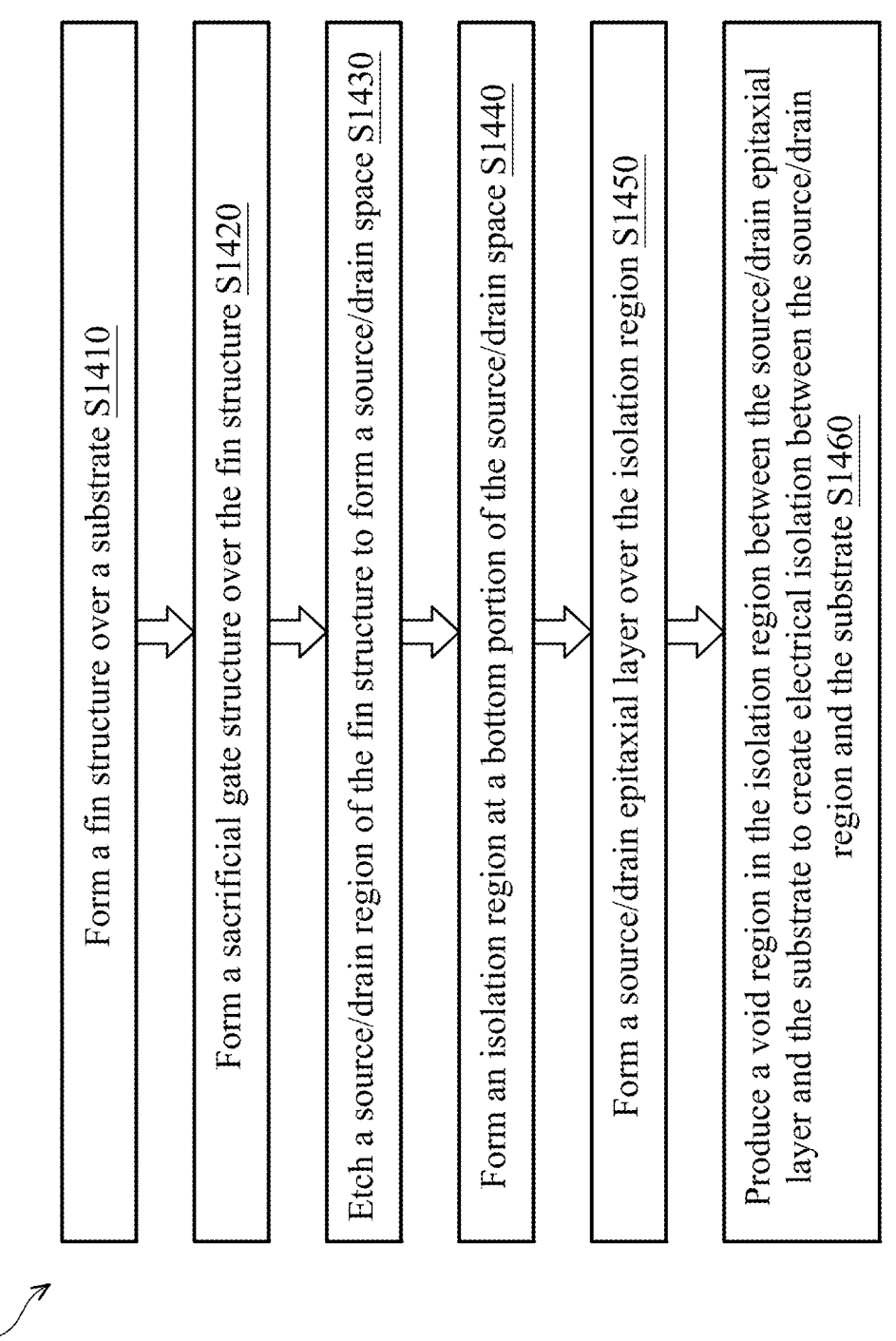
FIG. 14 shows a flow diagram of a process for generating a semiconductor device in accordance with some embodiments of the present disclosure.

FIG. 14 shows a flow diagram of a process 1400 for manufacturing a semiconductor device on a substrate in accordance with some embodiments of the present disclosure. In some embodiments, as shown in FIG. 3, a fin structure 29 is formed over a substrate 10 in operation S1410 and a sacrificial gate structure is formed over the fin structure, as shown in FIGS. 4A and 4B, in operation S1420. As shown in FIG. 5, A source/drain region (28) of the fin structure is etched to form a source/drain space 21 in operation S1430. As shown in FIG. 8H, an electrical isolation region 150 at a bottom 904 of the source/drain space 21 is formed in operation S1440 and a doped source/drain epitaxial layer 810 is formed over the electrical isolation region 150 in operation S1450. Also, in operation S1460, a void 808 is produced in the electrical isolation region 150 between the doped source/drain epitaxial layer 810 and the substrate to create electrical isolation between the source/drain region and the substrate. In some embodiments, the process 1400 is performed for a FinFET that is not a GAA FET to prevents the current leakage between the source/drain region and the base portion 11 of the fin structure and between the source/drain region and the substrate 10.

According to some embodiments of the present disclosure, a method of manufacturing a semiconductor device includes forming a fin structure in which first semiconductor layers and second semiconductor layers are alternately stacked over a substrate and forming a sacrificial gate structure over the fin structure. The method also includes etching a source/drain region of the fin structure, which is not covered by the sacrificial gate structure, thereby forming a source/drain space. The method further includes forming an isolation region at a bottom portion of the source/drain space. The method includes forming a source/drain epitaxial layer over the isolation region in the source/drain space and producing a void region in the isolation region between the source/drain epitaxial layer and the substrate. In an embodiment, forming the isolation region further includes forming a dielectric region in the isolation region such that the void region is produced between the source/drain epitaxial layer and the dielectric region. In an embodiment, forming the isolation region further includes forming an insulating layer in the isolation region such that the void region is produced between the source/drain epitaxial layer and the insulating layer. In an embodiment, the method further includes disposing a dielectric layer at a bottom of the source/drain space. The source/drain epitaxial layer is formed over the dielectric layer and the void region is produced between the dielectric layer and the source/drain epitaxial layer. In an embodiment, the isolation region comprises the dielectric layer and the void region. In an embodiment, forming the isolation region further includes forming an insulating layer over an undoped epitaxial layer in the isolation region. The void region is between the source/drain epitaxial layer and the insulating layer. In an embodiment, forming the isolation region further includes forming an undoped epitaxial layer in the isolation region and ion implanting the undoped epitaxial layer with a gas such that the void region is produced between the source/drain epitaxial layer and the undoped epitaxial layer. In an embodiment, the gas is either nitrogen or an insert gas.

According to some embodiments of the present disclosure, a method of manufacturing a semiconductor device includes forming a fin structure in which first semiconductor layers and second semiconductor layers are alternately stacked and forming a sacrificial gate structure over the fin structure. The method also includes etching a source/drain region of the fin structure that is not covered by the sacrificial gate structure, thereby forming a source/drain space and forming cavities on an end of each of the first semiconductor layers where the first semiconductor layers intersect with the source/drain space by using lateral etching of the first semiconductor layers through the source/drain space. The method further includes forming an inner spacer made of a dielectric material in the cavities of the first semiconductor layers. The method further includes forming an electrical isolation region at a bottom of the source/drain region such that the electrical isolation region produces an electrical barrier. The method also includes forming a doped source/drain epitaxial layer over the electrical isolation region in the source/drain space. In an embodiment, at least one process selected from the group consisting of a lithography process and an etching process is performed after the electrical isolation region is formed and before the doped source/drain epitaxial layer is formed. In an embodiment, the electrical isolation region is formed by epitaxially disposing an undoped layer and ion implanting the undoped layer with a dopant of opposite type of a dopant of the doped source/drain epitaxial layer. In an embodiment, forming the electrical isolation region further includes forming a dielectric region in the electrical isolation region such that a void region is produced between the doped source/drain epitaxial layer and the dielectric region. In an embodiment, forming the electrical isolation region further includes forming an insulating layer in the electrical isolation region such that a void region is produced between the doped source/drain epitaxial layer and the insulating layer. In an embodiment, the electrical barrier is either a voltage barrier or a current barrier.

According to some embodiments of the present disclosure, a semiconductor device includes semiconductor nanostructures disposed over a substrate. The semiconductor device also includes an electrical isolation region including a void disposed over the substrate in a drain/source region. The semiconductor device further includes a source/drain epitaxial layer in contact with the semiconductor nanostructures and disposed over the electrical isolation region in the drain/source region such that the source/drain epitaxial layer is disposed over the void. The semiconductor device includes a gate dielectric layer disposed on and wrapped around each channel region of the semiconductor nanostructures and a gate electrode layer disposed on the gate dielectric layer and wrapped around each channel region of the semiconductor nanostructures. In an embodiment, the void is in contact with the source/drain epitaxial layer. In an embodiment, the source/drain epitaxial layer includes multiple epitaxial semiconductor layers having different compositions from each other that are formed over the electrical isolation region. In an embodiment, the electrical isolation region further includes a dielectric region such that the void is between the source/drain epitaxial layer and the dielectric region. In an embodiment, the void is between the source/drain epitaxial layer and the substrate. In an embodiment, the electrical isolation region further includes an insulating layer such that the void is between the source/drain epitaxial layer and the insulating layer.

According to some embodiments of the present disclosure, a method of manufacturing a semiconductor device includes forming a fin structure over a substrate and forming a sacrificial gate structure over the fin structure. The method also includes etching a source/drain region of the fin structure, which is not covered by the sacrificial gate structure, thereby forming a source/drain space. The method further includes forming an isolation region at a bottom portion of the source/drain space that includes a void region and forming a source/drain epitaxial layer over the isolation region in the source/drain space such that the void region in the isolation region is between the source/drain epitaxial layer and the substrate.

It will be understood that not all advantages have been necessarily discussed herein, no particular advantage is required for all embodiments or examples, and other embodiments or examples may offer different advantages.

As explained, using the local barrier described above reduces the requirement that the source and drain epitaxial layer are heavily doped and, thus, reduces the number of defects in the source drain regions. Also, the local barrier may be used for passive input/output devices. Therefore, using the local barrier reduces the costs compared to using SOI substrates.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a fin structure in which first semiconductor layers and second semiconductor layers are alternately stacked over a substrate;
    forming a sacrificial gate structure over the fin structure;
    etching a source/drain region of the fin structure, which is not covered by the sacrificial gate structure, thereby forming a source/drain space;
    forming an isolation region at a bottom portion of the source/drain space;
    forming a source/drain epitaxial layer over the isolation region in the source/drain space; and
    producing a void region in the isolation region between the source/drain epitaxial layer and the substrate, wherein the void region has a bottom surface coplanar with a bottom surface of a lowest second semiconductor layer, and the bottom surface of the void region is aligned with a top surface of a lowest first semiconductor layer.

2. The method of claim 1, wherein forming the isolation region further comprises forming a dielectric region in the isolation region, wherein the void region is produced between the source/drain epitaxial layer and the dielectric region.

3. The method of claim 1, wherein forming the isolation region further comprises forming an insulating layer in the isolation region, wherein the void region is produced between the source/drain epitaxial layer and the insulating layer.

4. The method of claim 1, further comprising:
    disposing a dielectric layer at a bottom of the source/drain space, wherein the source/drain epitaxial layer is formed over the dielectric layer and the void region is produced between the dielectric layer and the source/drain epitaxial layer.

5. The method of claim 4, wherein the isolation region comprises the dielectric layer and the void region.

6. The method of claim 1, wherein forming the isolation region further comprises forming an insulating layer over an undoped epitaxial layer in the isolation region, wherein the void region is between the source/drain epitaxial layer and the insulating layer.

7. The method of claim 1, wherein forming the isolation region further comprises:
    forming an undoped epitaxial layer in the isolation region; and ion implanting the undoped epitaxial layer with a gas, wherein the void region is produced between the source/drain epitaxial layer and the undoped epitaxial layer.

8. The method of claim 7, wherein the gas is either nitrogen or an inert gas.

9. A method of manufacturing a semiconductor device, comprising:

forming a fin structure in which first semiconductor layers and second semiconductor layers are alternately stacked;

forming a sacrificial gate structure over the fin structure;

etching a source/drain region of the fin structure, which is not covered by the sacrificial gate structure, thereby forming a source/drain space;

forming cavities on an end of each of the first semiconductor layers where the first semiconductor layers intersect with the source/drain space by laterally etching the first semiconductor layers through the source/drain space;

forming an inner spacer made of a dielectric material in the cavities of the first semiconductor layers;

forming an electrical isolation region at a bottom of the source/drain region, wherein the electrical isolation region produces an electrical barrier, the electrical isolation region includes a void region, and an interface between a lowest first semiconductor layer and a lowest second semiconductor layer is aligned with a bottom surface of the void region; and forming a doped source/drain epitaxial layer over the electrical isolation region in the source/drain space.

10. The method of claim 9, wherein at least one process selected from the group consisting of a lithography process and an etching process is performed after the electrical isolation region is formed and before the doped source/drain epitaxial layer is formed.

11. The method of claim 9, wherein the electrical isolation region is formed by:

epitaxially disposing an undoped layer; and ion implanting the undoped layer with a dopant of opposite type of a dopant of the doped source/drain epitaxial layer.

12. The method of claim 9, wherein forming the electrical isolation region further comprises forming a dielectric region in the electrical isolation region, wherein the void region is produced between the doped source/drain epitaxial layer and the dielectric region.

13. The method of claim 9, wherein forming the electrical isolation region further comprises forming an insulating layer in the electrical isolation region, wherein the void region is produced between the doped source/drain epitaxial layer and the insulating layer.

14. The method of claim 9, wherein the electrical barrier is either a voltage barrier or a current barrier.

15. A method of manufacturing a semiconductor device, comprising:

forming a fin structure over a substrate, wherein the fin structure includes channel semiconductor layers and sacrificial semiconductor layers alternately stacked;

forming a sacrificial gate structure over the fin structure;

etching a source/drain region of the fin structure, which is not covered by the sacrificial gate structure, thereby forming a source/drain space;

forming an isolation region at a bottom portion of the source/drain space; and forming a source/drain epitaxial layer over the isolation region in the source/drain space, wherein the isolation region includes a dielectric region, an insulating layer in the isolation region, and a void region between the source/drain epitaxial layer and the insulating layer and between the source/drain epitaxial layer and the dielectric region.

16. The method of claim 15, wherein forming the isolation region further comprises forming an insulating layer over an undoped epitaxial layer in the isolation region, wherein the void region is between the source/drain epitaxial layer and the insulating layer.

17. The method of claim 15, wherein the dielectric region has a top surface coplanar with a top surface of the insulating layer.

18. The method of claim 15, wherein the insulating layer has a top surface coplanar with an interface between a lowest first semiconductor layer and a lowest second semiconductor layer.

19. The method of claim 15, wherein the insulating layer includes a recess and the dielectric region is formed in the recess.

20. The method of claim 15, wherein the insulating layer includes a protrusion portion extending into a lowest first semiconductor layer.

* * * * *